(12) United States Patent
Seppanen et al.

(10) Patent No.: US 11,704,066 B2
(45) Date of Patent: Jul. 18, 2023

(54) HETEROGENEOUS ERASE BLOCKS

(71) Applicant: Pure Storage, Inc., Mountain View, CA (US)

(72) Inventors: Eric D. Seppanen, Mountain View, CA (US); Andrew R. Bernat, Mountain View, CA (US); Timothy W. Brennan, San Francisco, CA (US); Mark L. McAuliffe, San Francisco, CA (US); Neil Buda Vachharajani, Menlo Park, CA (US)

(73) Assignee: PURE STORAGE, INC., Santa Clara, CA (US)

( * ) Notice: Subject to any disclaimer, the term of this patent is extended or adjusted under 35 U.S.C. 154(b) by 0 days.

(21) Appl. No.: 17/348,325

(22) Filed: Jun. 15, 2021

(65) Prior Publication Data
US 2021/0311667 A1 Oct. 7, 2021

Related U.S. Application Data

(63) Continuation of application No. 16/700,930, filed on Dec. 2, 2019, now Pat. No. 11,074,016, which is a
(Continued)

(51) Int. Cl.
*G06F 3/06* (2006.01)
*G06F 12/02* (2006.01)
*G11C 16/16* (2006.01)

(52) U.S. Cl.
CPC .......... *G06F 3/0659* (2013.01); *G06F 3/0604* (2013.01); *G06F 3/064* (2013.01);
(Continued)

(58) Field of Classification Search
CPC .... G06F 3/0659; G06F 3/0604; G06F 3/0631; G06F 3/064; G06F 3/0652; G06F 3/0688;
(Continued)

(56) References Cited

U.S. PATENT DOCUMENTS 5,390,327 A 2/1995 Lubbers et al.
5,450,581 A 9/1995 Bergen et al.
(Continued)

FOREIGN PATENT DOCUMENTS

EP 2164006 3/2010
EP 2256621 12/2010
(Continued)

OTHER PUBLICATIONS

Hwang, Kai, et al. "RAID-x: A New Distributed Disk Array for I/O-Centric Cluster Computing," HPDC '00 Proceedings of the 9th IEEE International Symposium on High Performance Distributed Computing, IEEE, 2000, pp. 279-286.
(Continued)

*Primary Examiner* — Masud K Khan

(57) ABSTRACT

A method of using flash storage devices with different sized erase blocks is provided. The method includes allocating a plurality of erase blocks of heterogeneous erase block sizes to a RAID stripe, to form a tile pattern having the heterogeneous erase block sizes in the RAID stripe. The method includes writing the RAID stripe across the flash storage devices in accordance with the allocating, and stopping the writing the RAID stripe, responsive to contents of the RAID stripe reaching a threshold.

17 Claims, 19 Drawing Sheets

Related U.S. Application Data continuation of application No. 15/799,950, filed on Oct. 31, 2017, now Pat. No. 10,496,330.

(52) U.S. Cl.
CPC .......... *G06F 3/0631* (2013.01); *G06F 3/0652* (2013.01); *G06F 3/0688* (2013.01); *G06F 12/0246* (2013.01); *G06F 12/0253* (2013.01); *G11C 16/16* (2013.01)

(58) Field of Classification Search
CPC ............. G06F 12/0246; G06F 12/0253; G06F 11/1004; G06F 11/108; G06F 2212/7202; G06F 2212/7205; G06F 2212/7206; G06F 2212/7208; G06F 3/0608; G11C 16/16
See application file for complete search history.

(56) References Cited

U.S. PATENT DOCUMENTS

| | | |
|---|---|---|
| 5,479,653 A | 12/1995 | Jones |
| 5,488,731 A | 1/1996 | Mendelsohn |
| 5,504,858 A | 4/1996 | Ellis et al. |
| 5,564,113 A | 10/1996 | Bergen et al. |
| 5,574,882 A | 11/1996 | Menon et al. |
| 5,649,093 A | 7/1997 | Hanko et al. |
| 5,883,909 A | 3/1999 | Dekoning et al. |
| 6,000,010 A | 12/1999 | Legg |
| 6,260,156 B1 | 7/2001 | Garvin et al. |
| 6,269,453 B1 | 7/2001 | Krantz |
| 6,275,898 B1 | 8/2001 | DeKoning |
| 6,453,428 B1 | 9/2002 | Stephenson |
| 6,523,087 B2 | 2/2003 | Busser |
| 6,535,417 B2 | 3/2003 | Tsuda |
| 6,643,748 B1 | 11/2003 | Wieland |
| 6,725,392 B1 | 4/2004 | Frey et al. |
| 6,763,455 B2 | 7/2004 | Hall |
| 6,836,816 B2 | 12/2004 | Kendall |
| 6,985,995 B2 | 1/2006 | Holland et al. |
| 7,032,125 B2 | 4/2006 | Holt et al. |
| 7,047,358 B2 | 5/2006 | Lee et al. |
| 7,051,155 B2 | 5/2006 | Talagala et al. |
| 7,055,058 B2 | 5/2006 | Lee et al. |
| 7,065,617 B2 | 6/2006 | Wang |
| 7,069,383 B2 | 6/2006 | Yamamoto et al. |
| 7,076,606 B2 | 7/2006 | Orsley |
| 7,107,480 B1 | 9/2006 | Moshayedi et al. |
| 7,159,150 B2 | 1/2007 | Kenchammana-Hosekote et al. |
| 7,162,575 B2 | 1/2007 | Dalal et al. |
| 7,164,608 B2 | 1/2007 | Lee |
| 7,188,270 B1 | 3/2007 | Nanda et al. |
| 7,334,156 B2 | 2/2008 | Land et al. |
| 7,370,220 B1 | 5/2008 | Nguyen et al. |
| 7,386,666 B1 | 6/2008 | Beauchamp et al. |
| 7,398,285 B2 | 7/2008 | Kisley |
| 7,424,498 B1 | 9/2008 | Patterson |
| 7,424,592 B1 | 9/2008 | Karr |
| 7,444,532 B2 | 10/2008 | Masuyama et al. |
| 7,480,658 B2 | 1/2009 | Heinla et al. |
| 7,484,056 B2 | 1/2009 | Madnani et al. |
| 7,484,057 B1 | 1/2009 | Madnani et al. |
| 7,484,059 B1 | 1/2009 | Ofer et al. |
| 7,536,506 B2 | 5/2009 | Ashmore et al. |
| 7,558,859 B2 | 7/2009 | Kasiolas |
| 7,565,446 B2 | 7/2009 | Talagala et al. |
| 7,613,947 B1 | 11/2009 | Coatney |
| 7,634,617 B2 | 12/2009 | Misra |
| 7,634,618 B2 | 12/2009 | Misra |
| 7,681,104 B1 | 3/2010 | Sim-Tang et al. |
| 7,681,105 B1 | 3/2010 | Sim-Tang et al. |
| 7,681,109 B2 | 3/2010 | Yang et al. |
| 7,730,257 B2 | 6/2010 | Franklin |
| 7,730,258 B1 | 6/2010 | Smith |
| 7,730,274 B1 | 6/2010 | Usgaonkar |
| 7,743,276 B2 | 6/2010 | Jacobsen et al. |
| 7,752,489 B2 | 7/2010 | Deenadhayalan et al. |
| 7,757,038 B2 | 7/2010 | Kitahara |
| 7,757,059 B1 | 7/2010 | Ofer et al. |
| 7,778,960 B1 | 8/2010 | Chatterjee et al. |
| 7,783,955 B2 | 8/2010 | Haratsch et al. |
| 7,814,272 B2 | 10/2010 | Barrall et al. |
| 7,814,273 B2 | 10/2010 | Barrall |
| 7,818,531 B2 | 10/2010 | Barrall |
| 7,827,351 B2 | 11/2010 | Suetsugu et al. |
| 7,827,439 B2 | 11/2010 | Matthew et al. |
| 7,831,768 B2 | 11/2010 | Ananthamurthy et al. |
| 7,856,583 B1 | 12/2010 | Smith |
| 7,870,105 B2 | 1/2011 | Arakawa et al. |
| 7,873,878 B2 | 1/2011 | Belluomini et al. |
| 7,885,938 B1 | 2/2011 | Greene et al. |
| 7,886,111 B2 | 2/2011 | Klemm et al. |
| 7,908,448 B1 | 3/2011 | Chatterjee et al. |
| 7,916,538 B2 | 3/2011 | Jeon et al. |
| 7,921,268 B2 | 4/2011 | Jakob |
| 7,930,499 B2 | 4/2011 | Duchesne |
| 7,941,697 B2 | 5/2011 | Mathew et al. |
| 7,958,303 B2 | 6/2011 | Shuster |
| 7,971,129 B2 | 6/2011 | Watson |
| 7,984,016 B2 | 7/2011 | Kisley |
| 7,991,822 B2 | 8/2011 | Bish et al. |
| 8,006,126 B2 | 8/2011 | Deenadhayalan et al. |
| 8,010,485 B1 | 8/2011 | Chatterjee et al. |
| 8,010,829 B1 | 8/2011 | Chatterjee et al. |
| 8,020,047 B2 | 9/2011 | Courtney |
| 8,046,548 B1 | 10/2011 | Chatterjee et al. |
| 8,051,361 B2 | 11/2011 | Sim-Tang et al. |
| 8,051,362 B2 | 11/2011 | Li et al. |
| 8,074,038 B2 | 12/2011 | Lionetti et al. |
| 8,082,393 B2 | 12/2011 | Galloway et al. |
| 8,086,603 B2 | 12/2011 | Nasre et al. |
| 8,086,634 B2 | 12/2011 | Mimatsu |
| 8,086,911 B1 | 12/2011 | Taylor |
| 8,090,837 B2 | 1/2012 | Shin et al. |
| 8,108,502 B2 | 1/2012 | Tabbara et al. |
| 8,117,388 B2 | 2/2012 | Jernigan, IV |
| 8,117,521 B2 | 2/2012 | Yang et al. |
| 8,140,821 B1 | 3/2012 | Raizen et al. |
| 8,145,838 B1 | 3/2012 | Miller et al. |
| 8,145,840 B2 | 3/2012 | Koul et al. |
| 8,175,012 B2 | 5/2012 | Haratsch et al. |
| 8,176,360 B2 | 5/2012 | Frost et al. |
| 8,176,405 B2 | 5/2012 | Hafner et al. |
| 8,180,855 B2 | 5/2012 | Aiello et al. |
| 8,200,922 B2 | 6/2012 | McKean et al. |
| 8,209,469 B2 | 6/2012 | Carpenter et al. |
| 8,225,006 B1 | 7/2012 | Karamcheti |
| 8,239,618 B2 | 8/2012 | Kotzur et al. |
| 8,244,999 B1 | 8/2012 | Chatterjee et al. |
| 8,261,016 B1 | 9/2012 | Goel |
| 8,271,455 B2 | 9/2012 | Kesselman |
| 8,285,686 B2 | 10/2012 | Kesselman |
| 8,305,811 B2 | 11/2012 | Jeon |
| 8,315,999 B2 | 11/2012 | Chatley et al. |
| 8,327,080 B1 | 12/2012 | Der |
| 8,335,769 B2 | 12/2012 | Kesselman |
| 8,341,118 B2 | 12/2012 | Drobychev et al. |
| 8,351,290 B1 | 1/2013 | Huang et al. |
| 8,364,920 B1 | 1/2013 | Parkison et al. |
| 8,365,041 B2 | 1/2013 | Chu et al. |
| 8,375,146 B2 | 2/2013 | Sinclair |
| 8,397,016 B2 | 3/2013 | Talagala et al. |
| 8,402,152 B2 | 3/2013 | Duran |
| 8,412,880 B2 | 4/2013 | Leibowitz et al. |
| 8,423,739 B2 | 4/2013 | Ash et al. |
| 8,429,436 B2 | 4/2013 | Filingim et al. |
| 8,452,928 B1 | 5/2013 | Ofer et al. |
| 8,473,698 B2 | 6/2013 | Lionetti et al. |
| 8,473,778 B2 | 6/2013 | Simitci |
| 8,473,815 B2 | 6/2013 | Yu et al. |
| 8,479,037 B1 | 7/2013 | Chatterjee et al. |
| 8,484,414 B2 | 7/2013 | Sugimoto et al. |
| 8,498,967 B1 | 7/2013 | Chatterjee et al. |
| 8,522,073 B2 | 8/2013 | Cohen |
| 8,533,408 B1 | 9/2013 | Madnani et al. |

(56) References Cited

U.S. PATENT DOCUMENTS

| | | |
|---|---|---|
| 8,533,527 B2 | 9/2013 | Daikokuya et al. |
| 8,539,177 B1 | 9/2013 | Ofer et al. |
| 8,544,029 B2 | 9/2013 | Bakke et al. |
| 8,549,224 B1 | 10/2013 | Zeryck et al. |
| 8,583,861 B1 | 11/2013 | Ofer et al. |
| 8,589,625 B2 | 11/2013 | Colgrove et al. |
| 8,595,455 B2 | 11/2013 | Chatterjee et al. |
| 8,615,599 B1 | 12/2013 | Takefman et al. |
| 8,627,136 B2 | 1/2014 | Shankar et al. |
| 8,627,138 B1 | 1/2014 | Clark |
| 8,639,669 B1 | 1/2014 | Douglis et al. |
| 8,639,863 B1 | 1/2014 | Kanapathippillai et al. |
| 8,640,000 B1 | 1/2014 | Cypher |
| 8,650,343 B1 | 2/2014 | Kanapathippillai et al. |
| 8,660,131 B2 | 2/2014 | Vermunt et al. |
| 8,661,218 B1 | 2/2014 | Piszczek et al. |
| 8,671,072 B1 | 3/2014 | Shah et al. |
| 8,689,042 B1 | 4/2014 | Kanapathippillai et al. |
| 8,700,875 B1 | 4/2014 | Barron et al. |
| 8,706,694 B2 | 4/2014 | Chatterjee et al. |
| 8,706,914 B2 | 4/2014 | Duchesneau |
| 8,706,932 B1 | 4/2014 | Kanapathippillai et al. |
| 8,712,963 B1 | 4/2014 | Douglis et al. |
| 8,713,405 B2 | 4/2014 | Healey et al. |
| 8,719,621 B1 | 5/2014 | Karmarkar |
| 8,725,730 B2 | 5/2014 | Keeton et al. |
| 8,751,859 B2 | 6/2014 | Becker-Szendy et al. |
| 8,756,387 B2 | 6/2014 | Frost et al. |
| 8,762,793 B2 | 6/2014 | Grube et al. |
| 8,838,541 B2 | 6/2014 | Camble et al. |
| 8,769,232 B2 | 7/2014 | Suryabudi et al. |
| 8,775,858 B2 | 7/2014 | Gower et al. |
| 8,775,868 B2 | 7/2014 | Colgrove et al. |
| 8,788,913 B1 | 7/2014 | Xin et al. |
| 8,793,447 B2 | 7/2014 | Usgaonkar et al. |
| 8,799,746 B2 | 8/2014 | Baker et al. |
| 8,819,311 B2 | 8/2014 | Liao |
| 8,819,383 B1 | 8/2014 | Jobanputra et al. |
| 8,824,261 B1 | 9/2014 | Miller et al. |
| 8,832,528 B2 | 9/2014 | Thatcher et al. |
| 8,838,892 B2 | 9/2014 | Li |
| 8,843,700 B1 | 9/2014 | Salessi et al. |
| 8,850,108 B1 | 9/2014 | Hayes et al. |
| 8,850,288 B1 | 9/2014 | Lazier et al. |
| 8,856,593 B2 | 10/2014 | Eckhardt et al. |
| 8,856,619 B1 | 10/2014 | Cypher |
| 8,862,617 B2 | 10/2014 | Kesselman |
| 8,862,847 B2 | 10/2014 | Feng et al. |
| 8,862,928 B2 | 10/2014 | Xavier et al. |
| 8,868,825 B1 | 10/2014 | Hayes |
| 8,874,836 B1 | 10/2014 | Hayes |
| 8,880,793 B2 | 11/2014 | Nagineni |
| 8,880,825 B2 | 11/2014 | Lionetti et al. |
| 8,886,778 B2 | 11/2014 | Nedved et al. |
| 8,898,383 B2 | 11/2014 | Yamamoto et al. |
| 8,898,388 B1 | 11/2014 | Kimmel |
| 8,904,231 B2 | 12/2014 | Coatney et al. |
| 8,918,478 B2 | 12/2014 | Ozzie et al. |
| 8,930,307 B2 | 1/2015 | Colgrove et al. |
| 8,930,633 B2 | 1/2015 | Amit et al. |
| 8,943,357 B2 | 1/2015 | Atzmony |
| 8,949,502 B2 | 2/2015 | McKnight et al. |
| 8,959,110 B2 | 2/2015 | Smith et al. |
| 8,959,388 B1 | 2/2015 | Kuang et al. |
| 8,972,478 B1 | 3/2015 | Storer et al. |
| 8,972,779 B2 | 3/2015 | Lee et al. |
| 8,977,597 B2 | 3/2015 | Ganesh et al. |
| 8,996,828 B2 | 3/2015 | Kalos et al. |
| 9,003,144 B1 | 4/2015 | Hayes et al. |
| 9,009,724 B2 | 4/2015 | Gold et al. |
| 9,021,053 B2 | 4/2015 | Bernbo et al. |
| 9,021,215 B2 | 4/2015 | Meir et al. |
| 9,025,393 B2 | 5/2015 | Wu |
| 9,043,372 B2 | 5/2015 | Makkar et al. |
| 9,047,214 B1 | 6/2015 | Sharon et al. |
| 9,053,808 B2 | 6/2015 | Sprouse |
| 9,058,155 B2 | 6/2015 | Cepulis et al. |
| 9,063,895 B1 | 6/2015 | Madnani et al. |
| 9,063,896 B1 | 6/2015 | Madnani et al. |
| 9,098,211 B1 | 8/2015 | Madnani et al. |
| 9,110,898 B1 | 8/2015 | Chamness et al. |
| 9,110,964 B1 | 8/2015 | Shilane et al. |
| 9,116,819 B2 | 8/2015 | Cope et al. |
| 9,117,536 B2 | 8/2015 | Yoon |
| 9,122,401 B2 | 9/2015 | Zaltsman et al. |
| 9,123,422 B2 | 9/2015 | Sharon et al. |
| 9,124,300 B2 | 9/2015 | Olbrich et al. |
| 9,134,908 B2 | 9/2015 | Horn et al. |
| 9,153,337 B2 | 10/2015 | Sutardja |
| 9,158,472 B2 | 10/2015 | Kesselman et al. |
| 9,159,422 B1 | 10/2015 | Lee et al. |
| 9,164,891 B2 | 10/2015 | Karamcheti et al. |
| 9,183,136 B2 | 11/2015 | Kawamura et al. |
| 9,189,650 B2 | 11/2015 | Jaye et al. |
| 9,201,733 B2 | 12/2015 | Verma |
| 9,207,876 B2 | 12/2015 | Shu et al. |
| 9,229,656 B1 | 1/2016 | Contreras et al. |
| 9,229,810 B2 | 1/2016 | He et al. |
| 9,235,475 B1 | 1/2016 | Shilane et al. |
| 9,244,626 B2 | 1/2016 | Shah et al. |
| 9,250,999 B1 | 2/2016 | Barroso |
| 9,251,066 B2 | 2/2016 | Colgrove et al. |
| 9,268,648 B1 | 2/2016 | Barash et al. |
| 9,268,806 B1 | 2/2016 | Kesselman et al. |
| 9,286,002 B1 | 3/2016 | Karamcheti et al. |
| 9,292,214 B2 | 3/2016 | Kalos et al. |
| 9,298,760 B1 | 3/2016 | Li et al. |
| 9,304,908 B1 | 4/2016 | Karamcheti et al. |
| 9,311,969 B2 | 4/2016 | Murin |
| 9,311,970 B2 | 4/2016 | Sharon et al. |
| 9,323,663 B2 | 4/2016 | Karamcheti et al. |
| 9,323,667 B2 | 4/2016 | Bennett |
| 9,323,681 B2 | 4/2016 | Apostolides et al. |
| 9,335,942 B2 | 5/2016 | Kumar et al. |
| 9,348,538 B2 | 5/2016 | Mallaiah et al. |
| 9,355,022 B2 | 5/2016 | Ravimohan et al. |
| 9,384,082 B1 | 7/2016 | Lee et al. |
| 9,384,252 B2 | 7/2016 | Akirav et al. |
| 9,389,958 B2 | 7/2016 | Sundaram et al. |
| 9,390,019 B2 | 7/2016 | Patterson et al. |
| 9,396,202 B1 | 7/2016 | Drobychev et al. |
| 9,400,828 B2 | 7/2016 | Kesselman et al. |
| 9,405,478 B2 | 8/2016 | Koseki et al. |
| 9,411,685 B2 | 8/2016 | Lee |
| 9,417,960 B2 | 8/2016 | Klein |
| 9,417,963 B2 | 8/2016 | He et al. |
| 9,430,250 B2 | 8/2016 | Hamid et al. |
| 9,430,542 B2 | 8/2016 | Akirav et al. |
| 9,432,541 B2 | 8/2016 | Ishida |
| 9,454,434 B2 | 9/2016 | Sundaram et al. |
| 9,471,579 B1 | 10/2016 | Natanzon |
| 9,477,554 B2 | 10/2016 | Chamness et al. |
| 9,477,632 B2 | 10/2016 | Du |
| 9,501,398 B2 | 11/2016 | George et al. |
| 9,525,737 B2 | 12/2016 | Friedman |
| 9,529,542 B2 | 12/2016 | Friedman et al. |
| 9,535,631 B2 | 1/2017 | Fu et al. |
| 9,552,248 B2 | 1/2017 | Miller et al. |
| 9,552,291 B2 | 1/2017 | Munetoh et al. |
| 9,552,299 B2 | 1/2017 | Stalzer |
| 9,563,517 B1 | 2/2017 | Natanzon et al. |
| 9,588,698 B1 | 3/2017 | Karamcheti et al. |
| 9,588,712 B2 | 3/2017 | Kalos et al. |
| 9,594,652 B1 | 3/2017 | Sathiamoorthy et al. |
| 9,600,193 B2 | 3/2017 | Ahrens et al. |
| 9,619,321 B1 | 4/2017 | Sharon et al. |
| 9,619,430 B2 | 4/2017 | Kannan et al. |
| 9,645,754 B2 | 5/2017 | Li et al. |
| 9,667,720 B1 | 5/2017 | Bent et al. |
| 9,710,535 B2 | 7/2017 | Aizman et al. |
| 9,733,840 B2 | 8/2017 | Karamcheti et al. |
| 9,734,225 B2 | 8/2017 | Akirav et al. |
| 9,740,403 B2 | 8/2017 | Storer et al. |
| 9,740,700 B1 | 8/2017 | Chopra et al. |

(56) References Cited

U.S. PATENT DOCUMENTS

| | | |
|---|---|---|
| 9,740,762 B2 | 8/2017 | Horowitz et al. |
| 9,747,319 B2 | 8/2017 | Bestler et al. |
| 9,747,320 B2 | 8/2017 | Kesselman |
| 9,767,130 B2 | 9/2017 | Bestler et al. |
| 9,781,227 B2 | 10/2017 | Friedman et al. |
| 9,785,498 B2 | 10/2017 | Misra et al. |
| 9,798,486 B1 | 10/2017 | Singh |
| 9,804,925 B1 | 10/2017 | Carmi et al. |
| 9,811,285 B1 | 11/2017 | Karamcheti et al. |
| 9,811,546 B1 | 11/2017 | Bent et al. |
| 9,818,478 B2 | 11/2017 | Chung |
| 9,829,066 B2 | 11/2017 | Thomas |
| 9,836,245 B2 | 12/2017 | Hayes et al. |
| 9,891,854 B2 | 2/2018 | Munetoh et al. |
| 9,891,860 B1 | 2/2018 | Delgado et al. |
| 9,892,005 B2 | 2/2018 | Kedem et al. |
| 9,892,186 B2 | 2/2018 | Akirav et al. |
| 9,904,589 B1 | 2/2018 | Donlan et al. |
| 9,904,717 B2 | 2/2018 | Anglin et al. |
| 9,952,809 B2 | 2/2018 | Shah |
| 9,910,748 B2 | 3/2018 | Pan |
| 9,910,904 B2 | 3/2018 | Anglin et al. |
| 9,934,237 B1 | 4/2018 | Shilane et al. |
| 9,940,065 B2 | 4/2018 | Kalos et al. |
| 9,946,604 B1 | 4/2018 | Glass |
| 9,959,167 B1 | 5/2018 | Donlan et al. |
| 9,965,539 B2 | 5/2018 | D'halluin et al. |
| 9,998,539 B1 | 6/2018 | Brock et al. |
| 10,007,457 B2 | 6/2018 | Hayes et al. |
| 10,013,177 B2 | 7/2018 | Liu et al. |
| 10,013,311 B2 | 7/2018 | Sundaram et al. |
| 10,019,314 B2 | 7/2018 | Litsyn et al. |
| 10,019,317 B2 | 7/2018 | Usvyatsky et al. |
| 10,031,703 B1 | 7/2018 | Natanzon et al. |
| 10,061,512 B2 | 8/2018 | Chu et al. |
| 10,073,626 B2 | 9/2018 | Karamcheti et al. |
| 10,082,985 B2 | 9/2018 | Hayes et al. |
| 10,089,012 B1 | 10/2018 | Chen et al. |
| 10,089,174 B2 | 10/2018 | Lin |
| 10,089,176 B1 | 10/2018 | Donlan et al. |
| 10,108,819 B1 | 10/2018 | Donlan et al. |
| 10,146,787 B2 | 12/2018 | Bashyam et al. |
| 10,152,268 B1 | 12/2018 | Chakraborty et al. |
| 10,157,098 B2 | 12/2018 | Chung et al. |
| 10,162,704 B1 | 12/2018 | Kirschner et al. |
| 10,180,875 B2 | 1/2019 | Northcott |
| 10,185,730 B2 | 1/2019 | Bestler et al. |
| 10,235,065 B1 | 3/2019 | Miller et al. |
| 2002/0144059 A1 | 10/2002 | Kendall |
| 2003/0105984 A1 | 6/2003 | Masuyama et al. |
| 2003/0110205 A1 | 6/2003 | Johnson |
| 2004/0161086 A1 | 8/2004 | Buntin et al. |
| 2005/0001652 A1 | 1/2005 | Malik et al. |
| 2005/0076228 A1 | 4/2005 | Davis et al. |
| 2005/0235132 A1 | 10/2005 | Karr et al. |
| 2005/0278460 A1 | 12/2005 | Shin et al. |
| 2005/0283649 A1 | 12/2005 | Turner et al. |
| 2006/0015683 A1 | 1/2006 | Ashmore et al. |
| 2006/0114930 A1 | 6/2006 | Lucas et al. |
| 2006/0174157 A1 | 8/2006 | Barrall et al. |
| 2006/0248294 A1 | 11/2006 | Nedved et al. |
| 2007/0079068 A1 | 4/2007 | Draggon |
| 2007/0214194 A1 | 9/2007 | Reuter |
| 2007/0214314 A1 | 9/2007 | Reuter |
| 2007/0234016 A1 | 10/2007 | Davis et al. |
| 2007/0268905 A1 | 11/2007 | Baker et al. |
| 2008/0080709 A1 | 4/2008 | Michtchenko et al. |
| 2008/0107274 A1 | 5/2008 | Worthy |
| 2008/0155191 A1 | 6/2008 | Anderson et al. |
| 2008/0195810 A1 | 8/2008 | Wu |
| 2008/0295118 A1 | 11/2008 | Liao |
| 2009/0077208 A1 | 3/2009 | Nguyen et al. |
| 2009/0138654 A1 | 5/2009 | Sutardja |
| 2009/0216910 A1 | 8/2009 | Duchesneau |
| 2009/0216920 A1 | 8/2009 | Lauterbach et al. |
| 2010/0017444 A1 | 1/2010 | Chatterjee et al. |
| 2010/0042636 A1 | 2/2010 | Lu |
| 2010/0094806 A1 | 4/2010 | Apostolides et al. |
| 2010/0115070 A1 | 5/2010 | Missimilly |
| 2010/0125695 A1 | 5/2010 | Wu et al. |
| 2010/0162076 A1 | 6/2010 | Sim-Tang et al. |
| 2010/0169707 A1 | 7/2010 | Mathew et al. |
| 2010/0174576 A1 | 7/2010 | Naylor |
| 2010/0268908 A1 | 10/2010 | Ouyang et al. |
| 2011/0040925 A1 | 2/2011 | Frost et al. |
| 2011/0060927 A1 | 3/2011 | Fillingim et al. |
| 2011/0119462 A1 | 5/2011 | Leach et al. |
| 2011/0219170 A1 | 9/2011 | Frost et al. |
| 2011/0238625 A1 | 9/2011 | Hamaguchi et al. |
| 2011/0264843 A1 | 10/2011 | Haines et al. |
| 2011/0302369 A1 | 12/2011 | Goto et al. |
| 2012/0011398 A1 | 1/2012 | Eckhardt |
| 2012/0079318 A1 | 3/2012 | Colgrove et al. |
| 2012/0089567 A1 | 4/2012 | Takahashi et al. |
| 2012/0110249 A1 | 5/2012 | Jeong et al. |
| 2012/0131253 A1 | 5/2012 | McKnight |
| 2012/0158923 A1 | 6/2012 | Mohamed et al. |
| 2012/0191900 A1 | 7/2012 | Kunimatsu et al. |
| 2012/0198152 A1 | 8/2012 | Terry et al. |
| 2012/0198261 A1 | 8/2012 | Brown et al. |
| 2012/0209943 A1 | 8/2012 | Jung |
| 2012/0226934 A1 | 9/2012 | Rao |
| 2012/0246435 A1 | 9/2012 | Meir et al. |
| 2012/0260055 A1 | 10/2012 | Murase |
| 2012/0311557 A1 | 12/2012 | Resch |
| 2013/0022201 A1 | 1/2013 | Glew et al. |
| 2013/0036314 A1 | 2/2013 | Glew et al. |
| 2013/0042056 A1 | 2/2013 | Shats |
| 2013/0060884 A1 | 3/2013 | Bernbo et al. |
| 2013/0067188 A1 | 3/2013 | Mehra et al. |
| 2013/0073894 A1 | 3/2013 | Xavier et al. |
| 2013/0124776 A1 | 5/2013 | Hallak et al. |
| 2013/0132800 A1 | 5/2013 | Healy et al. |
| 2013/0151653 A1 | 6/2013 | Sawiki |
| 2013/0151771 A1 | 6/2013 | Tsukahara et al. |
| 2013/0173853 A1 | 7/2013 | Ungureanu et al. |
| 2013/0238554 A1 | 9/2013 | Yucel et al. |
| 2013/0339314 A1 | 12/2013 | Carpenter et al. |
| 2013/0339635 A1 | 12/2013 | Amit et al. |
| 2013/0339818 A1 | 12/2013 | Baker et al. |
| 2014/0040535 A1 | 2/2014 | Lee |
| 2014/0040702 A1 | 2/2014 | He et al. |
| 2014/0047263 A1 | 2/2014 | Coatney et al. |
| 2014/0047269 A1 | 2/2014 | Kim |
| 2014/0063721 A1 | 3/2014 | Herman et al. |
| 2014/0064048 A1 | 3/2014 | Cohen et al. |
| 2014/0068224 A1 | 3/2014 | Fan et al. |
| 2014/0075252 A1 | 3/2014 | Luo et al. |
| 2014/0122510 A1 | 5/2014 | Namkoong et al. |
| 2014/0136880 A1 | 5/2014 | Shankar et al. |
| 2014/0181402 A1 | 6/2014 | White |
| 2014/0237164 A1 | 8/2014 | Le et al. |
| 2014/0279936 A1 | 9/2014 | Bernbo et al. |
| 2014/0280025 A1 | 9/2014 | Eidson et al. |
| 2014/0289588 A1 | 9/2014 | Nagadomi et al. |
| 2014/0330785 A1 | 11/2014 | Isherwood et al. |
| 2014/0372838 A1 | 12/2014 | Lou et al. |
| 2014/0380125 A1 | 12/2014 | Calder et al. |
| 2014/0380126 A1 | 12/2014 | Yekhanin et al. |
| 2015/0032720 A1 | 1/2015 | James |
| 2015/0039645 A1 | 2/2015 | Lewis |
| 2015/0039849 A1 | 2/2015 | Lewis |
| 2015/0043277 A1* | 2/2015 | Fitzpatrick ............ G06F 3/0616 365/185.11 |
| 2015/0089283 A1 | 3/2015 | Kermarrec et al. |
| 2015/0100746 A1 | 4/2015 | Rychlik |
| 2015/0134824 A1 | 5/2015 | Mickens |
| 2015/0153800 A1 | 6/2015 | Lucas et al. |
| 2015/0180714 A1 | 6/2015 | Chunn |
| 2015/0280959 A1 | 10/2015 | Vincent |
| 2016/0246537 A1 | 2/2016 | Kim |
| 2016/0191508 A1 | 6/2016 | Bestler et al. |
| 2016/0378612 A1 | 12/2016 | Hipsh et al. |
| 2017/0010944 A1* | 1/2017 | Saito ................. G06F 3/0659 |

(56) References Cited

U.S. PATENT DOCUMENTS

| | | |
|---|---|---|
| 2017/0091236 A1 | 3/2017 | Hayes et al. |
| 2017/0103092 A1 | 4/2017 | Hu et al. |
| 2017/0103094 A1 | 4/2017 | Hu et al. |
| 2017/0103098 A1 | 4/2017 | Hu et al. |
| 2017/0103116 A1 | 4/2017 | Hu et al. |
| 2017/0177236 A1 | 6/2017 | Haratsch et al. |
| 2017/0242788 A1* | 8/2017 | Ahmed .................. G06F 3/064 |
| 2018/0039442 A1 | 2/2018 | Shadrin et al. |
| 2018/0081958 A1 | 3/2018 | Akirav et al. |
| 2018/0101441 A1 | 4/2018 | Hyun et al. |
| 2018/0101587 A1 | 4/2018 | Anglin et al. |
| 2018/0101588 A1 | 4/2018 | Anglin et al. |
| 2018/0217756 A1 | 8/2018 | Liu et al. |
| 2018/0307560 A1 | 10/2018 | Vishnumolakala et al. |
| 2018/0321874 A1 | 11/2018 | Li et al. |
| 2019/0036703 A1 | 1/2019 | Bestler |

FOREIGN PATENT DOCUMENTS

| | | |
|---|---|---|
| WO | WO 02-13033 | 2/2002 |
| WO | WO 2008103569 | 8/2008 |
| WO | WO 2008157081 | 12/2008 |
| WO | WO 2013032825 | 7/2013 |

OTHER PUBLICATIONS

Schmid, Patrick: "RAID Scaling Charts, Part 3:4-128 kB Stripes Compared", Tom's Hardware, Nov. 27, 2007 (http://www.tomshardware.com/reviews/RAID-SCALING-CHARTS.1735-4.html), See pp. 1-2.

Storer, Mark W. et al., "Pergamum: Replacing Tape with Energy Efficient, Reliable, Disk-Based Archival Storage," Fast '08: 6th USENIX Conference on File and Storage Technologies, San Jose, CA, Feb. 26-29, 2008 pp. 1-16.

Ju-Kyeong Kim et al., "Data Access Frequency based Data Replication Method using Erasure Codes in Cloud Storage System", Journal of the Institute of Electronics and Information Engineers, Feb. 2014, vol. 51, No. 2, pp. 85-91.

International Search Report and the Written Opinion of the International Searching Authority, PCT/US2015/018169, dated May 15, 2015.

International Search Report and the Written Opinion of the International Searching Authority, PCT/US2015/034302, dated Sep. 11, 2015.

International Search Report and the Written Opinion of the International Searching Authority, PCT/US2015/039135, dated Sep. 18, 2015.

International Search Report and the Written Opinion of the International Searching Authority, PCT/US2015/039136, dated Sep. 23, 2015.

International Search Report, PCT/US2015/039142, dated Sep. 24, 2015.

International Search Report, PCT/US2015/034291, dated Sep. 30, 2015.

International Search Report and the Written Opinion of the International Searching Authority, PCT/US2015/039137, dated Oct. 1, 2015.

International Search Report, PCT/US2015/044370, dated Dec. 15, 2015.

International Search Report amd the Written Opinion of the International Searching Authority, PCT/US2016/031039, dated May 5, 2016.

International Search Report, PCT/US2016/014604, dated May 19, 2016.

International Search Report, PCT/US2016/014361, dated May 30, 2016.

International Search Report, PCT/US2016/014356, dated Jun. 28, 2016.

International Search Report, PCT/US2016/014357, dated Jun. 29, 2016.

International Seach Report and the Written Opinion of the International Searching Authority, PCT/US2016/016504, dated Jul. 6, 2016.

International Seach Report and the Written Opinion of the International Searching Authority, PCT/US2016/024391, dated Jul. 12, 2016.

International Seach Report and the Written Opinion of the International Searching Authority, PCT/US2016/026529, dated Jul. 19, 2016.

International Seach Report and the Written Opinion of the International Searching Authority, PCT/US2016/023485, dated Jul. 21, 2016.

International Seach Report and the Written Opinion of the International Searching Authority, PCT/US2016/033306, dated Aug. 19, 2016.

International Seach Report and the Written Opinion of the International Searching Authority, PCT/US2016/047808, dated Nov. 25, 2016.

Stalzer, Mark A., "FlashBlades: System Architecture and Applications," Proceedings of the 2nd Workshop on Architectures and Systems for Big Data, Association for Computing Machinery, New York, NY, 2012, pp. 10-14.

International Seach Report and the Written Opinion of the International Searching Authority, PCT/US2016/042147, dated Nov. 30, 2016.

* cited by examiner

HETEROGENEOUS ERASE BLOCKS

BACKGROUND

Flash memory has erase blocks that can be erased and/or written to. Erase blocks from different manufacturers, technologies, generations of technology, versions, and numbers of bits per cell (e.g., single level cell, multilevel cell, quad level cell, etc.) have various erase block sizes. In a storage device or storage system with homogeneous erase block sizes, layout of a RAID stripe or other memory organization, and efficient use of erase blocks is straightforward and a given. However, use of heterogeneous erase block sizes in a storage device or storage system poses problems. It is likely that sizes of heterogeneous blocks are not common divisors of each other in many cases. If such devices with different block sizes are mixed in a single RAID stripe, smaller blocks are filled while there is still space available in larger blocks, and this causes a storage array or storage cluster to waste available memory space. Therefore, there is a need in the art for a solution which overcomes the drawbacks described above.

SUMMARY

In some embodiments, a method of using flash storage devices with different sized erase blocks is provided. The method includes allocating a plurality of erase blocks of heterogeneous erase block sizes to a RAID stripe, to form a tile pattern having the heterogeneous erase block sizes in the RAID stripe. The method includes writing the RAID stripe across the flash storage devices in accordance with the allocating, and stopping the writing the RAID stripe, responsive to contents of the RAID stripe reaching a threshold.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

The present disclosure is illustrated by way of example, and not by way of limitation, and can be more fully understood with reference to the following detailed description when considered in connection with the figures as described below.

DETAILED DESCRIPTION

Various storage systems that have the capability of using flash storage devices with different sized erase blocks are described herein. When initially manufactured and configured, a storage system could have homogeneous flash memory erase block sizes, or could have heterogeneous erase block sizes from the start. In both cases, over time, as memory is upgraded, added to the system, or replaced as a result of failure, memory with various erase block sizes becomes present in the storage system. Through flexibility of allocation of erase blocks to RAID stripes, and solutions for efficient use of portions of erase blocks and placement of metadata, these storage systems avoid wasting memory space.

Figure 1A:
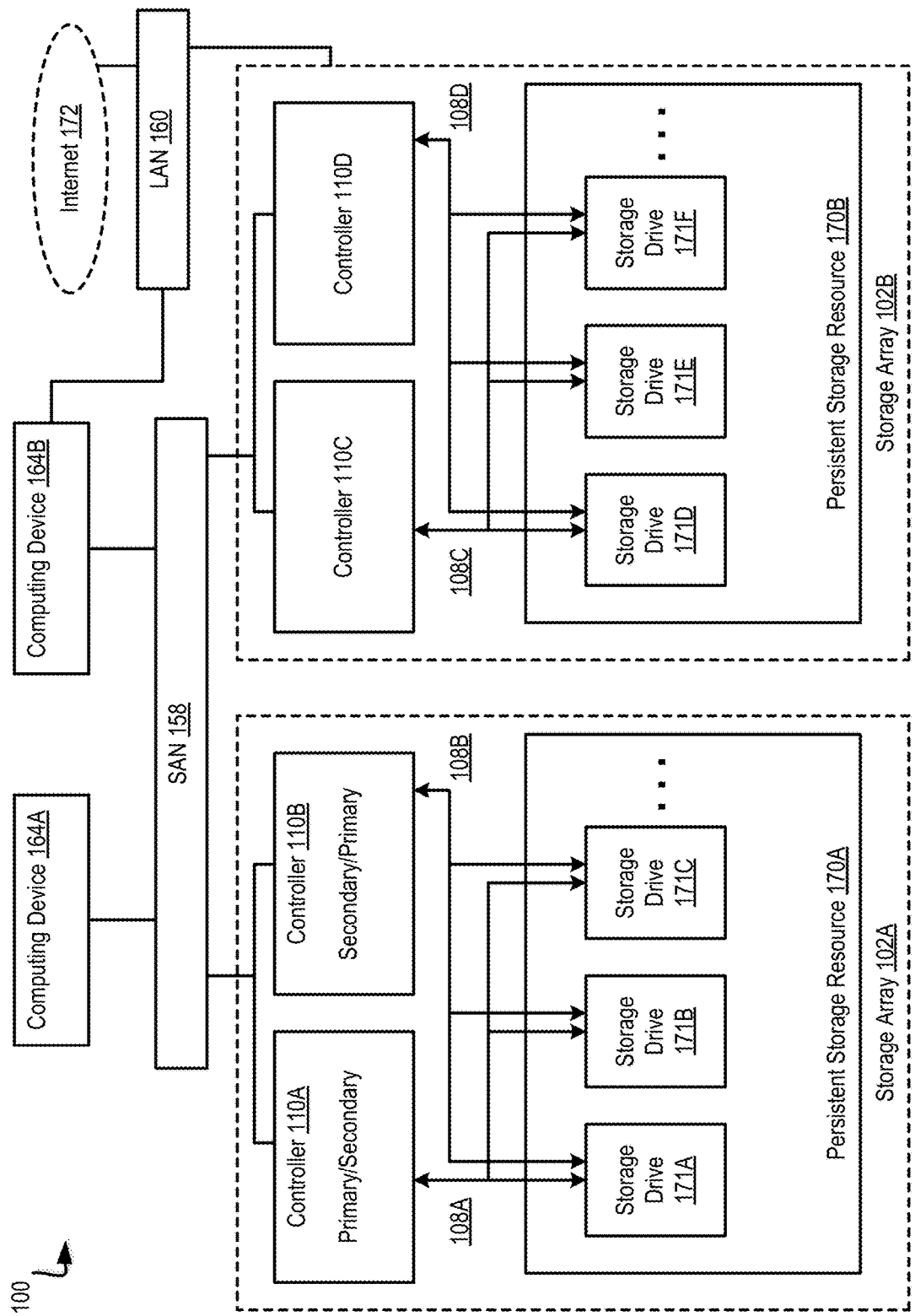
FIG. 1A illustrates a first example system for data storage in accordance with some implementations.

FIG. 1A illustrates an example system for data storage, in accordance with some implementations. System 100 (also referred to as "storage system" herein) includes numerous elements for purposes of illustration rather than limitation. It may be noted that system 100 may include the same, more, or fewer elements configured in the same or different manner in other implementations.

System 100 includes a number of computing devices 164. Computing devices (also referred to as "client devices" herein) may be for example, a server in a data center, a workstation, a personal computer, a notebook, or the like. Computing devices 164 are coupled for data communications to one or more storage arrays 102 through a storage area network (SAN) 158 or a local area network (LAN) 160.

The SAN 158 may be implemented with a variety of data communications fabrics, devices, and protocols. For example, the fabrics for SAN 158 may include Fibre Channel, Ethernet, Infiniband, Serial Attached Small Computer System Interface (SAS), or the like. Data communications protocols for use with SAN 158 may include Advanced Technology Attachment (ATA), Fibre Channel Protocol, Small Computer System Interface (SCSI), Internet Small Computer System Interface (iSCSI), HyperSCSI, Non-Volatile Memory Express (NVMe) over Fabrics, or the like. It may be noted that SAN 158 is provided for illustration, rather than limitation. Other data communication couplings may be implemented between computing devices 164 and storage arrays 102.

The LAN 160 may also be implemented with a variety of fabrics, devices, and protocols. For example, the fabrics for LAN 160 may include Ethernet (802.3), wireless (802.11), or the like. Data communication protocols for use in LAN 160 may include Transmission Control Protocol (TCP), User Datagram Protocol (UDP), Internet Protocol (IP), HyperText Transfer Protocol (HTTP), Wireless Access Protocol (WAP), Handheld Device Transport Protocol (HDTP), Session Initiation Protocol (SIP), Real Time Protocol (RTP), or the like.

Storage arrays 102 may provide persistent data storage for the computing devices 164. Storage array 102A may be contained in a chassis (not shown), and storage array 102B may be contained in another chassis (not shown), in implementations. Storage array 102A and 102B may include one or more storage array controllers 110 (also referred to as "controller" herein). A storage array controller 110 may be embodied as a module of automated computing machinery comprising computer hardware, computer software, or a combination of computer hardware and software. In some implementations, the storage array controllers 110 may be configured to carry out various storage tasks. Storage tasks may include writing data received from the computing devices 164 to storage array 102, erasing data from storage array 102, retrieving data from storage array 102 and providing data to computing devices 164, monitoring and reporting of disk utilization and performance, performing redundancy operations, such as Redundant Array of Independent Drives (RAID) or RAID-like data redundancy operations, compressing data, encrypting data, and so forth.

Storage array controller 110 may be implemented in a variety of ways, including as a Field Programmable Gate Array (FPGA), a Programmable Logic Chip (PLC), an Application Specific Integrated Circuit (ASIC), System-on-Chip (SOC), or any computing device that includes discrete components such as a processing device, central processing unit, computer memory, or various adapters. Storage array controller 110 may include, for example, a data communications adapter configured to support communications via the SAN 158 or LAN 160. In some implementations, storage array controller 110 may be independently coupled to the LAN 160. In implementations, storage array controller 110 may include an I/O controller or the like that couples the storage array controller 110 for data communications, through a midplane (not shown), to a persistent storage resource 170 (also referred to as a "storage resource" herein). The persistent storage resource 170 main include any number of storage drives 171 (also referred to as "storage devices" herein) and any number of non-volatile Random Access Memory (NVRAM) devices (not shown).

In some implementations, the NVRAM devices of a persistent storage resource 170 may be configured to receive, from the storage array controller 110, data to be stored in the storage drives 171. In some examples, the data may originate from computing devices 164. In some examples, writing data to the NVRAM device may be carried out more quickly than directly writing data to the storage drive 171. In implementations, the storage array controller 110 may be configured to utilize the NVRAM devices as a quickly accessible buffer for data destined to be written to the storage drives 171. Latency for write requests using NVRAM devices as a buffer may be improved relative to a system in which a storage array controller 110 writes data directly to the storage drives 171. In some implementations, the NVRAM devices may be implemented with computer memory in the form of high bandwidth, low latency RAM. The NVRAM device is referred to as "non-volatile" because the NVRAM device may receive or include a unique power source that maintains the state of the RAM after main power loss to the NVRAM device. Such a power source may be a battery, one or more capacitors, or the like. In response to a power loss, the NVRAM device may be configured to write the contents of the RAM to a persistent storage, such as the storage drives 171.

In implementations, storage drive 171 may refer to any device configured to record data persistently, where "persistently" or "persistent" refers as to a device's ability to maintain recorded data after loss of power. In some implementations, storage drive 171 may correspond to non-disk storage media. For example, the storage drive 171 may be one or more solid-state drives (SSDs), flash memory based storage, any type of solid-state non-volatile memory, or any other type of non-mechanical storage device. In other implementations, storage drive 171 may include may include mechanical or spinning hard disk, such as hard-disk drives (HDD).

In some implementations, the storage array controllers 110 may be configured for offloading device management responsibilities from storage drive 171 in storage array 102. For example, storage array controllers 110 may manage control information that may describe the state of one or more memory blocks in the storage drives 171. The control information may indicate, for example, that a particular memory block has failed and should no longer be written to, that a particular memory block contains boot code for a storage array controller 110, the number of program-erase (P/E) cycles that have been performed on a particular memory block, the age of data stored in a particular memory block, the type of data that is stored in a particular memory block, and so forth. In some implementations, the control information may be stored with an associated memory block as metadata. In other implementations, the control information for the storage drives 171 may be stored in one or more particular memory blocks of the storage drives 171 that are selected by the storage array controller 110. The selected memory blocks may be tagged with an identifier indicating that the selected memory block contains control information. The identifier may be utilized by the storage array controllers 110 in conjunction with storage drives 171 to quickly identify the memory blocks that contain control information. For example, the storage controllers 110 may issue a command to locate memory blocks that contain control information. It may be noted that control information may be so large that parts of the control information may be stored in multiple locations, that the control information may be stored in multiple locations for purposes of redundancy, for example, or that the control information may otherwise be distributed across multiple memory blocks in the storage drive 171.

In implementations, storage array controllers 110 may offload device management responsibilities from storage drives 171 of storage array 102 by retrieving, from the storage drives 171, control information describing the state of one or more memory blocks in the storage drives 171. Retrieving the control information from the storage drives 171 may be carried out, for example, by the storage array controller 110 querying the storage drives 171 for the location of control information for a particular storage drive 171. The storage drives 171 may be configured to execute instructions that enable the storage drive 171 to identify the location of the control information. The instructions may be executed by a controller (not shown) associated with or otherwise located on the storage drive 171 and may cause the storage drive 171 to scan a portion of each memory block to identify the memory blocks that store control information for the storage drives 171. The storage drives 171 may respond by sending a response message to the storage array controller 110 that includes the location of control information for the storage drive 171. Responsive to receiving the response message, storage array controllers 110 may issue a request to read data stored at the address associated with the location of control information for the storage drives 171.

In other implementations, the storage array controllers 110 may further offload device management responsibilities from storage drives 171 by performing, in response to receiving the control information, a storage drive management operation. A storage drive management operation may include, for example, an operation that is typically performed by the storage drive 171 (e.g., the controller (not shown) associated with a particular storage drive 171). A storage drive management operation may include, for example, ensuring that data is not written to failed memory blocks within the storage drive 171, ensuring that data is written to memory blocks within the storage drive 171 in such a way that adequate wear leveling is achieved, and so forth.

In implementations, storage array 102 may implement two or more storage array controllers 110. For example, storage array 102A may include storage array controllers 110A and storage array controllers 110B. At a given instance, a single storage array controller 110 (e.g., storage array controller 110A) of a storage system 100 may be designated with primary status (also referred to as "primary controller" herein), and other storage array controllers 110 (e.g., storage array controller 110A) may be designated with secondary status (also referred to as "secondary controller" herein). The primary controller may have particular rights, such as permission to alter data in persistent storage resource 170 (e.g., writing data to persistent storage resource 170). At least some of the rights of the primary controller may supersede the rights of the secondary controller. For instance, the secondary controller may not have permission to alter data in persistent storage resource 170 when the primary controller has the right. The status of storage array controllers 110 may change. For example, storage array controller 110A may be designated with secondary status, and storage array controller 110B may be designated with primary status.

In some implementations, a primary controller, such as storage array controller 110A, may serve as the primary controller for one or more storage arrays 102, and a second controller, such as storage array controller 110B, may serve as the secondary controller for the one or more storage arrays 102. For example, storage array controller 110A may be the primary controller for storage array 102A and storage array 102B, and storage array controller 110B may be the secondary controller for storage array 102A and 102B. In some implementations, storage array controllers 110C and 110D (also referred to as "storage processing modules") may neither have primary or secondary status. Storage array controllers 110C and 110D, implemented as storage processing modules, may act as a communication interface between the primary and secondary controllers (e.g., storage array controllers 110A and 110B, respectively) and storage array 102B. For example, storage array controller 110A of storage array 102A may send a write request, via SAN 158, to storage array 102B. The write request may be received by both storage array controllers 110C and 110D of storage array 102B. Storage array controllers 110C and 110D facilitate the communication, e.g., send the write request to the appropriate storage drive 171. It may be noted that in some implementations storage processing modules may be used to increase the number of storage drives controlled by the primary and secondary controllers.

In implementations, storage array controllers 110 are communicatively coupled, via a midplane (not shown), to one or more storage drives 171 and to one or more NVRAM devices (not shown) that are included as part of a storage array 102. The storage array controllers 110 may be coupled to the midplane via one or more data communication links and the midplane may be coupled to the storage drives 171 and the NVRAM devices via one or more data communications links. The data communications links described herein are collectively illustrated by data communications links 108 and may include a Peripheral Component Interconnect Express (PCIe) bus, for example.

Figure 1B:
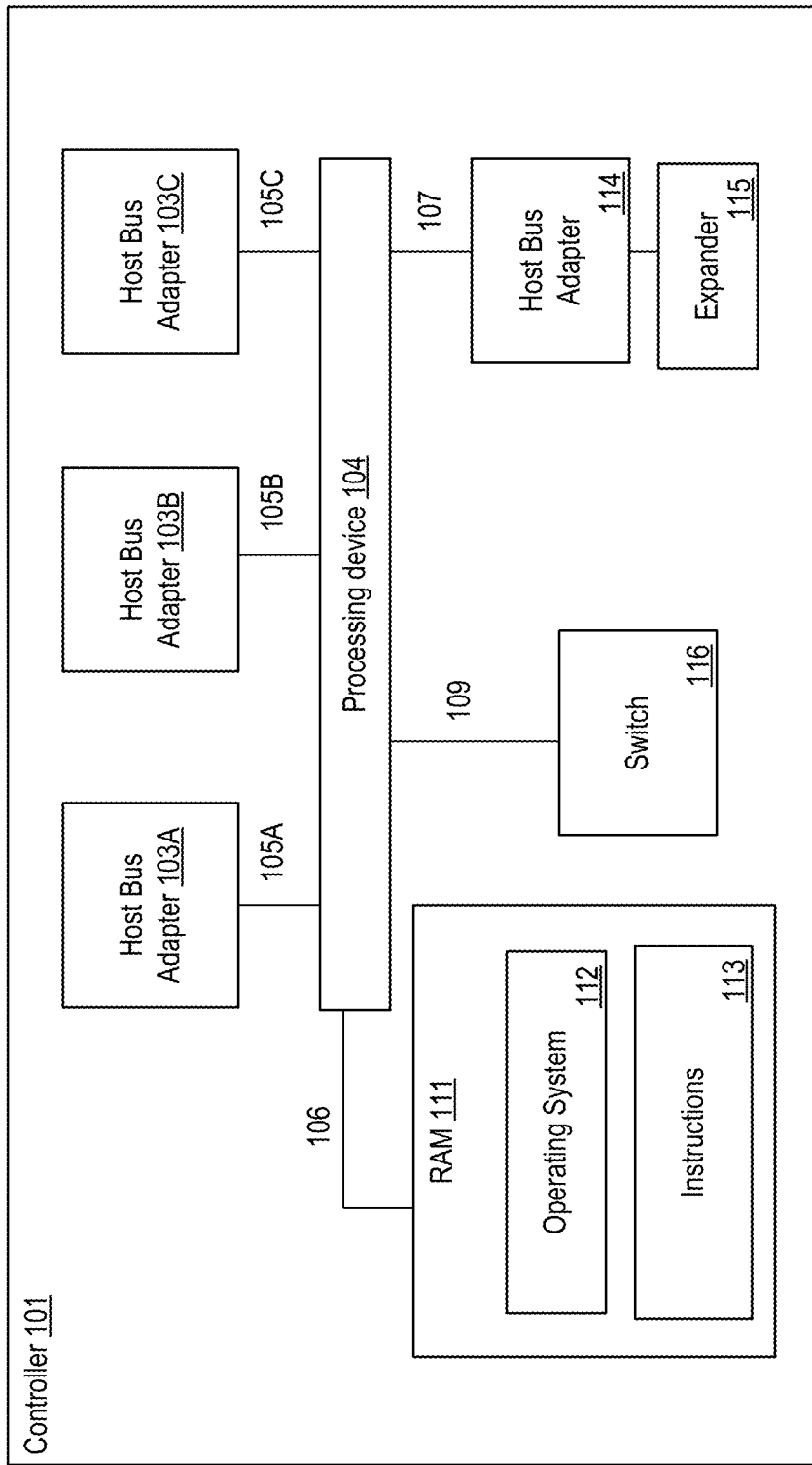
FIG. 1B illustrates a second example system for data storage in accordance with some implementations.

FIG. 1B illustrates an example system for data storage, in accordance with some implementations. Storage array controller 101 illustrated in FIG. 1B may similar to the storage array controllers 110 described with respect to FIG. 1A. In one example, storage array controller 101 may be similar to storage array controller 110A or storage array controller 110B. Storage array controller 101 includes numerous elements for purposes of illustration rather than limitation. It may be noted that storage array controller 101 may include the same, more, or fewer elements configured in the same or different manner in other implementations. It may be noted that elements of FIG. 1A may be included below to help illustrate features of storage array controller 101.

Storage array controller 101 may include one or more processing devices 104 and random access memory (RAM) 111. Processing device 104 (or controller 101) represents one or more general-purpose processing devices such as a microprocessor, central processing unit, or the like. More particularly, the processing device 104 (or controller 101) may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 104 (or controller 101) may also be one or more special-purpose processing devices such as an application specific integrated circuit (ASIC), a field programmable gate array (FPGA), a digital signal processor (DSP), network processor, or the like.

The processing device 104 may be connected to the RAM 111 via a data communications link 106, which may be embodied as a high speed memory bus such as a Double-Data Rate 4 (DDR4) bus. Stored in RAM 111 is an operating system 112. In some implementations, instructions 113 are stored in RAM 111. Instructions 113 may include computer program instructions for performing operations in in a direct-mapped flash storage system. In one embodiment, a direct-mapped flash storage system is one that that addresses data blocks within flash drives directly and without an address translation performed by the storage controllers of the flash drives.

In implementations, storage array controller 101 includes one or more host bus adapters 103 that are coupled to the processing device 104 via a data communications link 105. In implementations, host bus adapters 103 may be computer hardware that connects a host system (e.g., the storage array controller) to other network and storage arrays. In some examples, host bus adapters 103 may be a Fibre Channel adapter that enables the storage array controller 101 to connect to a SAN, an Ethernet adapter that enables the storage array controller 101 to connect to a LAN, or the like. Host bus adapters 103 may be coupled to the processing device 104 via a data communications link 105 such as, for example, a PCIe bus.

In implementations, storage array controller 101 may include a host bus adapter 114 that is coupled to an expander 115. The expander 115 may be used to attach a host system to a larger number of storage drives. The expander 115 may, for example, be a SAS expander utilized to enable the host bus adapter 114 to attach to storage drives in an implementation where the host bus adapter 114 is embodied as a SAS controller.

In implementations, storage array controller 101 may include a switch 116 coupled to the processing device 104 via a data communications link 109. The switch 116 may be a computer hardware device that can create multiple endpoints out of a single endpoint, thereby enabling multiple devices to share a single endpoint. The switch 116 may, for example, be a PCIe switch that is coupled to a PCIe bus (e.g., data communications link 109) and presents multiple PCIe connection points to the midplane.

In implementations, storage array controller 101 includes a data communications link 107 for coupling the storage array controller 101 to other storage array controllers. In some examples, data communications link 107 may be a QuickPath Interconnect (QPI) interconnect.

A traditional storage system that uses traditional flash drives may implement a process across the flash drives that are part of the traditional storage system. For example, a higher level process of the storage system may initiate and control a process across the flash drives. However, a flash drive of the traditional storage system may include its own storage controller that also performs the process. Thus, for the traditional storage system, a higher level process (e.g., initiated by the storage system) and a lower level process (e.g., initiated by a storage controller of the storage system) may both be performed.

To resolve various deficiencies of a traditional storage system, operations may be performed by higher level processes and not by the lower level processes. For example, the flash storage system may include flash drives that do not include storage controllers that provide the process. Thus, the operating system of the flash storage system itself may initiate and control the process. This may be accomplished by a direct-mapped flash storage system that addresses data blocks within the flash drives directly and without an address translation performed by the storage controllers of the flash drives.

The operating system of the flash storage system may identify and maintain a list of allocation units across multiple flash drives of the flash storage system. The allocation units may be entire erase blocks or multiple erase blocks. The operating system may maintain a map or address range that directly maps addresses to erase blocks of the flash drives of the flash storage system.

Direct mapping to the erase blocks of the flash drives may be used to rewrite data and erase data. For example, the operations may be performed on one or more allocation units that include a first data and a second data where the first data is to be retained and the second data is no longer being used by the flash storage system. The operating system may initiate the process to write the first data to new locations within other allocation units and erasing the second data and marking the allocation units as being available for use for subsequent data. Thus, the process may only be performed by the higher level operating system of the flash storage system without an additional lower level process being performed by controllers of the flash drives.

Advantages of the process being performed only by the operating system of the flash storage system include increased reliability of the flash drives of the flash storage system as unnecessary or redundant write operations are not being performed during the process. One possible point of novelty here is the concept of initiating and controlling the process at the operating system of the flash storage system. In addition, the process can be controlled by the operating system across multiple flash drives. This is contrast to the process being performed by a storage controller of a flash drive.

A storage system can consist of two storage array controllers that share a set of drives for failover purposes, or it could consist of a single storage array controller that provides a storage service that utilizes multiple drives, or it could consist of a distributed network of storage array controllers each with some number of drives or some amount of Flash storage where the storage array controllers in the network collaborate to provide a complete storage service and collaborate on various aspects of a storage service including storage allocation and garbage collection.

Figure 1C:
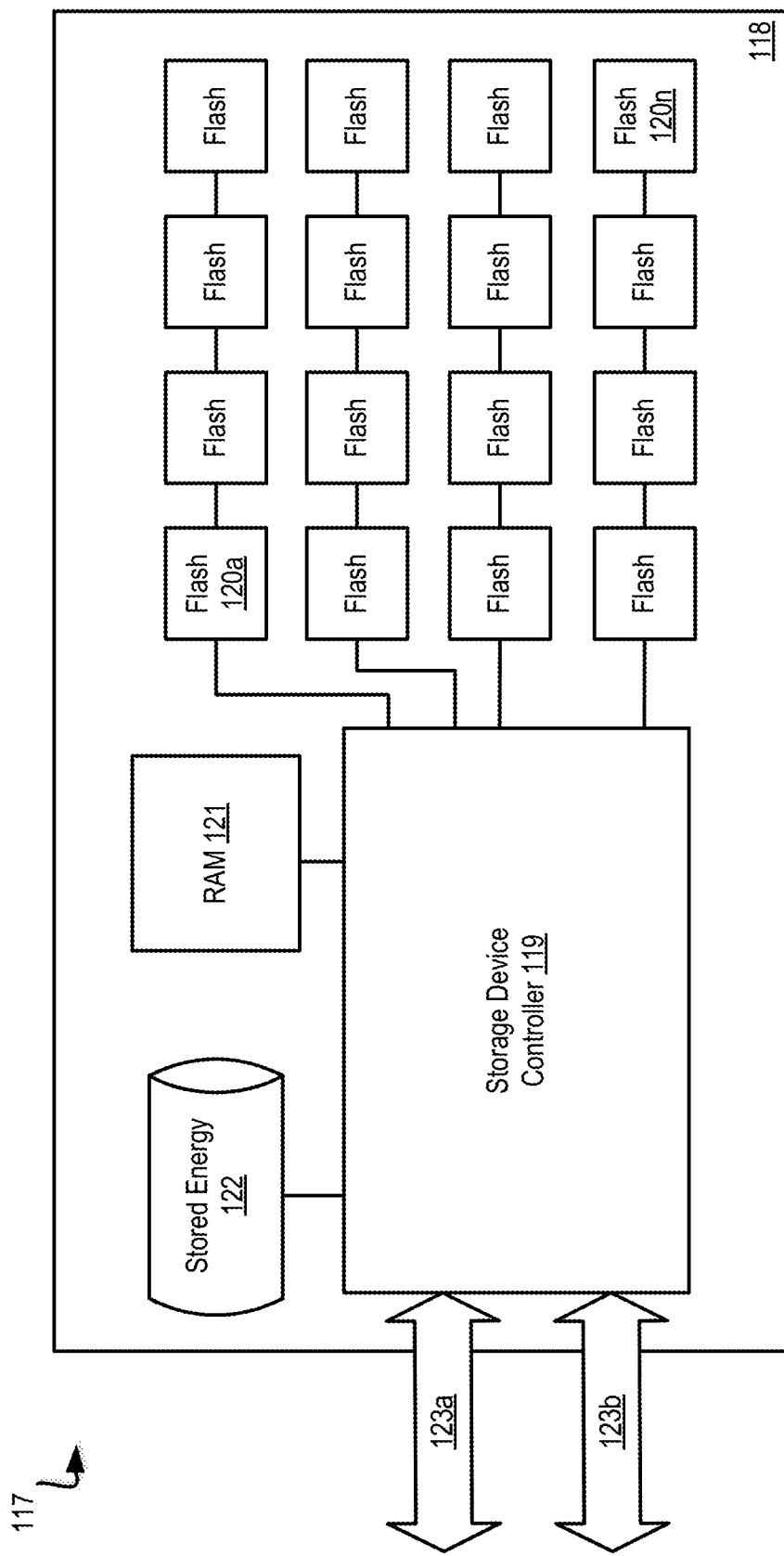
FIG. 1C illustrates a third example system for data storage in accordance with some implementations.

FIG. 1C illustrates a third example system 117 for data storage in accordance with some implementations. System 117 (also referred to as "storage system" herein) includes numerous elements for purposes of illustration rather than limitation. It may be noted that system 117 may include the same, more, or fewer elements configured in the same or different manner in other implementations.

In one embodiment, system 117 includes a dual Peripheral Component Interconnect (PCI) flash storage device 118 with separately addressable fast write storage. System 117 may include a storage controller 119. In one embodiment, storage controller 119 may be a CPU, ASIC, FPGA, or any other circuitry that may implement control structures necessary according to the present disclosure. In one embodiment, system 117 includes flash memory devices (e.g., including flash memory devices 120a-n), operatively coupled to various channels of the storage device controller 119. Flash memory devices 120a-n, may be presented to the controller 119 as an addressable collection of Flash pages, erase blocks, and/or control elements sufficient to allow the storage device controller 119 to program and retrieve various aspects of the Flash. In one embodiment, storage device controller 119 may perform operations on flash memory devices 120A-N including storing and retrieving data content of pages, arranging and erasing any blocks, tracking statistics related to the use and reuse of Flash memory pages, erase blocks, and cells, tracking and predicting error codes and faults within the Flash memory, controlling voltage levels associated with programming and retrieving contents of Flash cells, etc.

In one embodiment, system 117 may include random access memory (RAM) 121 to store separately addressable fast-write data. In one embodiment, RAM 121 may be one or more separate discrete devices. In another embodiment, RAM 121 may be integrated into storage device controller 119 or multiple storage device controllers. The RAM 121 may be utilized for other purposes as well, such as temporary program memory for a processing device (E.g., a central processing unit (CPU)) in the storage device controller 119.

In one embodiment, system 119 may include a stored energy device 122, such as a rechargeable battery or a capacitor. Stored energy device 122 may store energy sufficient to power the storage device controller 119, some amount of the RAM (e.g., RAM 121), and some amount of Flash memory (e.g., Flash memory 120a-120n) for sufficient time to write the contents of RAM to Flash memory. In one embodiment, storage device controller 119 may write the contents of RAM to Flash Memory if the storage device controller detects loss of external power.

In one embodiment, system 117 includes two data communications links 123a, 123b. In one embodiment, data communications links 123a, 123b may be PCI interfaces. In another embodiment, data communications links 123a, 123b may be based on other communications standards (e.g., HyperTransport, InfiBand, etc.). Data communications links 123a, 123b may be based on non-volatile memory express (NVMe) or NCMe over fabrics (NVMf) specifications that allow external connection to the storage device controller 119 from other components in the storage system 117. It should be noted that data communications links may be interchangeably referred to herein as PCI buses for convenience.

System 117 may also include an external power source (not shown), which may be provided over one or both data communications links 123a, 123b, or which may be provided separately. An alternative embodiment includes a separate Flash memory (not shown) dedicated for use in storing the content of RAM 121. The storage device controller 119 may present a logical device over a PCI bus which may include an addressable fast-write logical device, or a distinct part of the logical address space of the storage device 118, which may be presented as PCI memory or as persistent storage. In one embodiment, operations to store into the device are directed into the RAM 121. On power failure, the storage device controller 119 may write stored content associated with the addressable fast-write logical storage to Flash memory (e.g., Flash memory 120a-n) for long-term persistent storage.

In one embodiment, the logical device may include some presentation of some or all of the content of the Flash memory devices 120a-n, where that presentation allows a storage system including a storage device 118 (e.g., storage system 117) to directly address Flash memory pages and directly reprogram erase blocks from storage system components that are external to the storage device through the PCI bus. The presentation may also allow one or more of the external components to control and retrieve other aspects of the Flash memory including some or all of: tracking statistics related to use and reuse of Flash memory pages, erase blocks, and cells across all the Flash memory devices; tracking and predicting error codes and faults within and across the Flash memory devices; controlling voltage levels associated with programming and retrieving contents of Flash cells; etc.

In one embodiment, the stored energy device 122 may be sufficient to ensure completion of in-progress operations to the Flash memory devices 107a-120n stored energy device 122 may power storage device controller 119 and associated Flash memory devices (e.g., 120a-n) for those operations, as well as for the storing of fast-write RAM to Flash memory. Stored energy device 122 may be used to store accumulated statistics and other parameters kept and tracked by the Flash memory devices 120a-n and/or the storage device controller 119. Separate capacitors or stored energy devices (such as smaller capacitors near or embedded within the Flash memory devices themselves) may be used for some or all of the operations described herein.

Various schemes may be used to track and optimize the life span of the stored energy component, such as adjusting voltage levels over time, partially discharging the storage energy device 122 to measure corresponding discharge characteristics, etc. If the available energy decreases over time, the effective available capacity of the addressable fast-write storage may be decreased to ensure that it can be written safely based on the currently available stored energy.

Figure 1D:
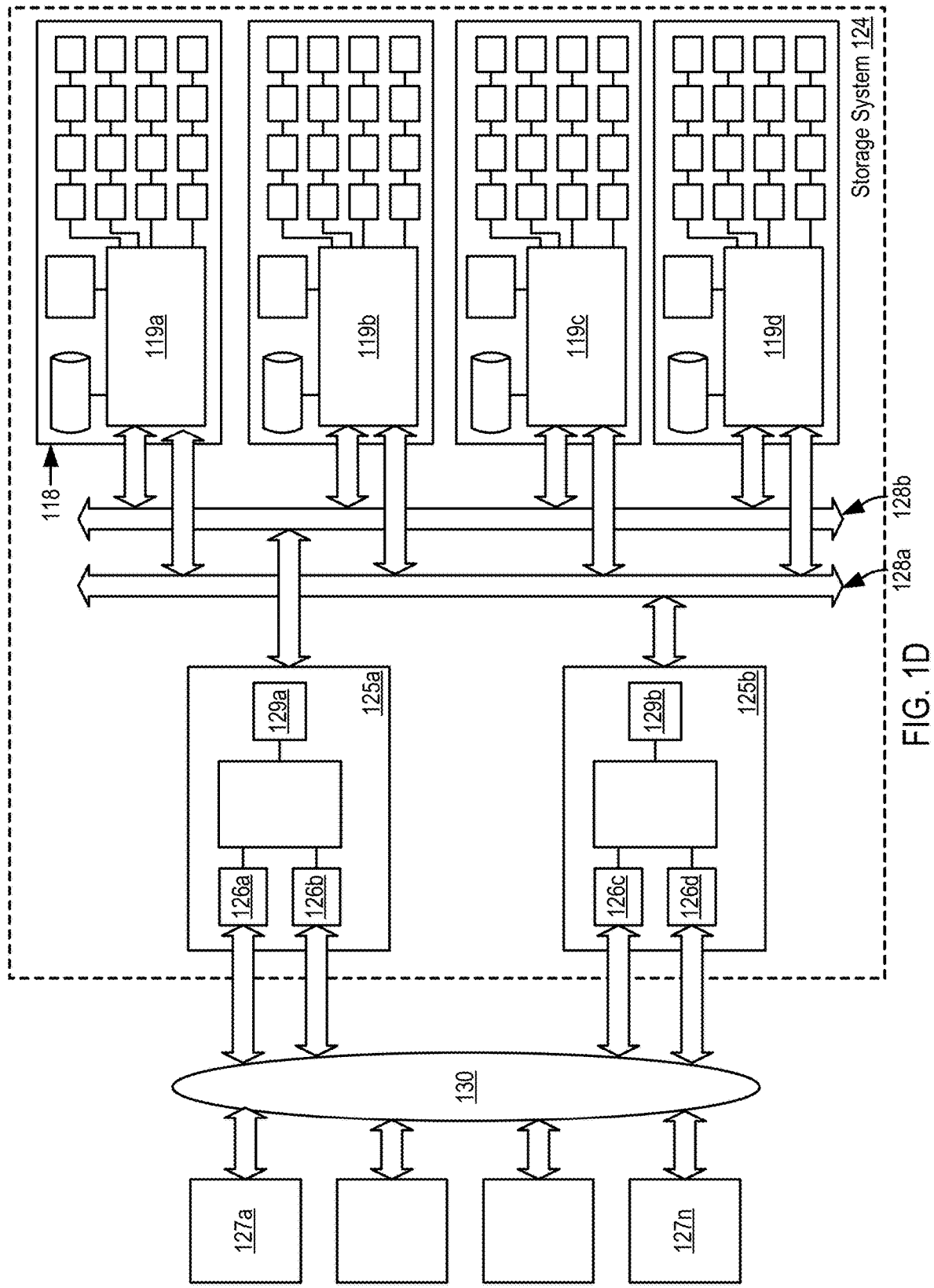
FIG. 1D illustrates a fourth example system for data storage in accordance with some implementations.

FIG. 1D illustrates a third example system 124 for data storage in accordance with some implementations. In one embodiment, system 124 includes storage controllers 125a, 125b. In one embodiment, storage controllers 125a, 125b are operatively coupled to Dual PCI storage devices 119a, 119b and 119c, 119d, respectively. Storage controllers 125a, 125b may be operatively coupled (e.g., via a storage network 130) to some number of host computers 127a-n.

In one embodiment, two storage controllers (e.g., 125a and 125b) provide storage services, such as a small computer system interface (SCSI) block storage array, a file server, an object server, a database or data analytics service, etc. The storage controllers 125a, 125b may provide services through some number of network interfaces (e.g., 126a-d) to host computers 127a-n outside of the storage system 124. Storage controllers 125a, 125b may provide integrated services or an application entirely within the storage system 124, forming a converged storage and compute system. The storage controllers 125a, 125b may utilize the fast write memory within or across storage devices 119a-d to journal in progress operations to ensure the operations are not lost on a power failure, storage controller removal, storage controller or storage system shutdown, or some fault of one or more software or hardware components within the storage system 124.

In one embodiment, controllers 125*a*, 125*b* operate as PCI masters to one or the other PCI buses 128*a*, 128*b*. In another embodiment, 128*a* and 128*b* may be based on other communications standards (e.g., HyperTransport, InfiBand, etc.). Other storage system embodiments may operate storage controllers 125*a*, 125*b* as multi-masters for both PCI buses 128*a*, 128*b*. Alternately, a PCI/NVMe/NVMf switching infrastructure or fabric may connect multiple storage controllers. Some storage system embodiments may allow storage devices to communicate with each other directly rather than communicating only with storage controllers. In one embodiment, a storage device controller 119*a* may be operable under direction from a storage controller 125*a* to synthesize and transfer data to be stored into Flash memory devices from data that has been stored in RAM (e.g., RAM 121 of FIG. 1C). For example, a recalculated version of RAM content may be transferred after a storage controller has determined that an operation has fully committed across the storage system, or when fast-write memory on the device has reached a certain used capacity, or after a certain amount of time, to ensure improve safety of the data or to release addressable fast-write capacity for reuse. This mechanism may be used, for example, to avoid a second transfer over a bus (e.g., 128*a*, 128*b*) from the storage controllers 125*a*, 125*b*. In one embodiment, a recalculation may include compressing data, attaching indexing or other metadata, combining multiple data segments together, performing erasure code calculations, etc.

In one embodiment, under direction from a storage controller 125*a*, 125*b*, a storage device controller 119*a*, 119*b* may be operable to calculate and transfer data to other storage devices from data stored in RAM (e.g., RAM 121 of FIG. 1C) without involvement of the storage controllers 125*a*, 125*b*. This operation may be used to mirror data stored in one controller 125*a* to another controller 125*b*, or it could be used to offload compression, data aggregation, and/or erasure coding calculations and transfers to storage devices to reduce load on storage controllers or the storage controller interface 129*a*, 129*b* to the PCI bus 128*a*, 128*b*.

A storage device controller 119 may include mechanisms for implementing high availability primitives for use by other parts of a storage system external to the Dual PCI storage device 118. For example, reservation or exclusion primitives may be provided so that, in a storage system with two storage controllers providing a highly available storage service, one storage controller may prevent the other storage controller from accessing or continuing to access the storage device. This could be used, for example, in cases where one controller detects that the other controller is not functioning properly or where the interconnect between the two storage controllers may itself not be functioning properly.

In one embodiment, a storage system for use with Dual PCI direct mapped storage devices with separately addressable fast write storage includes systems that manage erase blocks or groups of erase blocks as allocation units for storing data on behalf of the storage service, or for storing metadata (e.g., indexes, logs, etc.) associated with the storage service, or for proper management of the storage system itself. Flash pages, which may be a few kilobytes in size, may be written as data arrives or as the storage system is to persist data for long intervals of time (e.g., above a defined threshold of time). To commit data more quickly, or to reduce the number of writes to the Flash memory devices, the storage controllers may first write data into the separately addressable fast write storage on one more storage devices.

In one embodiment, the storage controllers 125*a*, 125*b* may initiate the use of erase blocks within and across storage devices (e.g., 118) in accordance with an age and expected remaining lifespan of the storage devices, or based on other statistics. The storage controllers 125*a*, 125*b* may initiate garbage collection and data migration data between storage devices in accordance with pages that are no longer needed as well as to manage Flash page and erase block lifespans and to manage overall system performance.

In one embodiment, the storage system 124 may utilize mirroring and/or erasure coding schemes as part of storing data into addressable fast write storage and/or as part of writing data into allocation units associated with erase blocks. Erasure codes may be used across storage devices, as well as within erase blocks or allocation units, or within and across Flash memory devices on a single storage device, to provide redundancy against single or multiple storage device failures or to protect against internal corruptions of Flash memory pages resulting from Flash memory operations or from degradation of Flash memory cells. Mirroring and erasure coding at various levels may be used to recover from multiple types of failures that occur separately or in combination.

The embodiments depicted with reference to FIGS. 2A-G illustrate a storage cluster that stores user data, such as user data originating from one or more user or client systems or other sources external to the storage cluster. The storage cluster distributes user data across storage nodes housed within a chassis, or across multiple chassis, using erasure coding and redundant copies of metadata. Erasure coding refers to a method of data protection or reconstruction in which data is stored across a set of different locations, such as disks, storage nodes or geographic locations. Flash memory is one type of solid-state memory that may be integrated with the embodiments, although the embodiments may be extended to other types of solid-state memory or other storage medium, including non-solid state memory. Control of storage locations and workloads are distributed across the storage locations in a clustered peer-to-peer system. Tasks such as mediating communications between the various storage nodes, detecting when a storage node has become unavailable, and balancing I/Os (inputs and outputs) across the various storage nodes, are all handled on a distributed basis. Data is laid out or distributed across multiple storage nodes in data fragments or stripes that support data recovery in some embodiments. Ownership of data can be reassigned within a cluster, independent of input and output patterns. This architecture described in more detail below allows a storage node in the cluster to fail, with the system remaining operational, since the data can be reconstructed from other storage nodes and thus remain available for input and output operations. In various embodiments, a storage node may be referred to as a cluster node, a blade, or a server.

The storage cluster may be contained within a chassis, i.e., an enclosure housing one or more storage nodes. A mechanism to provide power to each storage node, such as a power distribution bus, and a communication mechanism, such as a communication bus that enables communication between the storage nodes are included within the chassis. The storage cluster can run as an independent system in one location according to some embodiments. In one embodiment, a chassis contains at least two instances of both the power distribution and the communication bus which may be enabled or disabled independently. The internal communication bus may be an Ethernet bus, however, other technologies such as Peripheral Component Interconnect (PCI)

Express, InfiniBand, and others, are equally suitable. The chassis provides a port for an external communication bus for enabling communication between multiple chassis, directly or through a switch, and with client systems. The external communication may use a technology such as Ethernet, InfiniBand, Fibre Channel, etc. In some embodiments, the external communication bus uses different communication bus technologies for inter-chassis and client communication. If a switch is deployed within or between chassis, the switch may act as a translation between multiple protocols or technologies. When multiple chassis are connected to define a storage cluster, the storage cluster may be accessed by a client using either proprietary interfaces or standard interfaces such as network file system (NFS), common internet file system (CIFS), small computer system interface (SCSI) or hypertext transfer protocol (HTTP). Translation from the client protocol may occur at the switch, chassis external communication bus or within each storage node. In some embodiments, multiple chassis may be coupled or connected to each other through an aggregator switch. A portion and/or all of the coupled or connected chassis may be designated as a storage cluster. As discussed above, each chassis can have multiple blades, each blade has a MAC (media access control) address, but the storage cluster is presented to an external network as having a single cluster IP (Internet Protocol) address and a single MAC address in some embodiments.

Each storage node may be one or more storage servers and each storage server is connected to one or more non-volatile solid state memory units, which may be referred to as storage units or storage devices. One embodiment includes a single storage server in each storage node and between one to eight non-volatile solid state memory units, however this one example is not meant to be limiting. The storage server may include a processor, dynamic random access memory (DRAM) and interfaces for the internal communication bus and power distribution for each of the power buses. Inside the storage node, the interfaces and storage unit share a communication bus, e.g., PCI Express, in some embodiments. The non-volatile solid state memory units may directly access the internal communication bus interface through a storage node communication bus, or request the storage node to access the bus interface. The non-volatile solid state memory unit contains an embedded central processing unit (CPU), solid state storage controller, and a quantity of solid state mass storage, e.g., between 2-32 terabytes (TB) in some embodiments. An embedded volatile storage medium, such as DRAM, and an energy reserve apparatus are included in the non-volatile solid state memory unit. In some embodiments, the energy reserve apparatus is a capacitor, super-capacitor, or battery that enables transferring a subset of DRAM contents to a stable storage medium in the case of power loss. In some embodiments, the non-volatile solid state memory unit is constructed with a storage class memory, such as phase change or magnetoresistive random access memory (MRAM) that substitutes for DRAM and enables a reduced power hold-up apparatus.

One of many features of the storage nodes and non-volatile solid state storage is the ability to proactively rebuild data in a storage cluster. The storage nodes and non-volatile solid state storage can determine when a storage node or non-volatile solid state storage in the storage cluster is unreachable, independent of whether there is an attempt to read data involving that storage node or non-volatile solid state storage. The storage nodes and non-volatile solid state storage then cooperate to recover and rebuild the data in at least partially new locations. This constitutes a proactive rebuild, in that the system rebuilds data without waiting until the data is needed for a read access initiated from a client system employing the storage cluster. These and further details of the storage memory and operation thereof are discussed below.

Figure 2A:
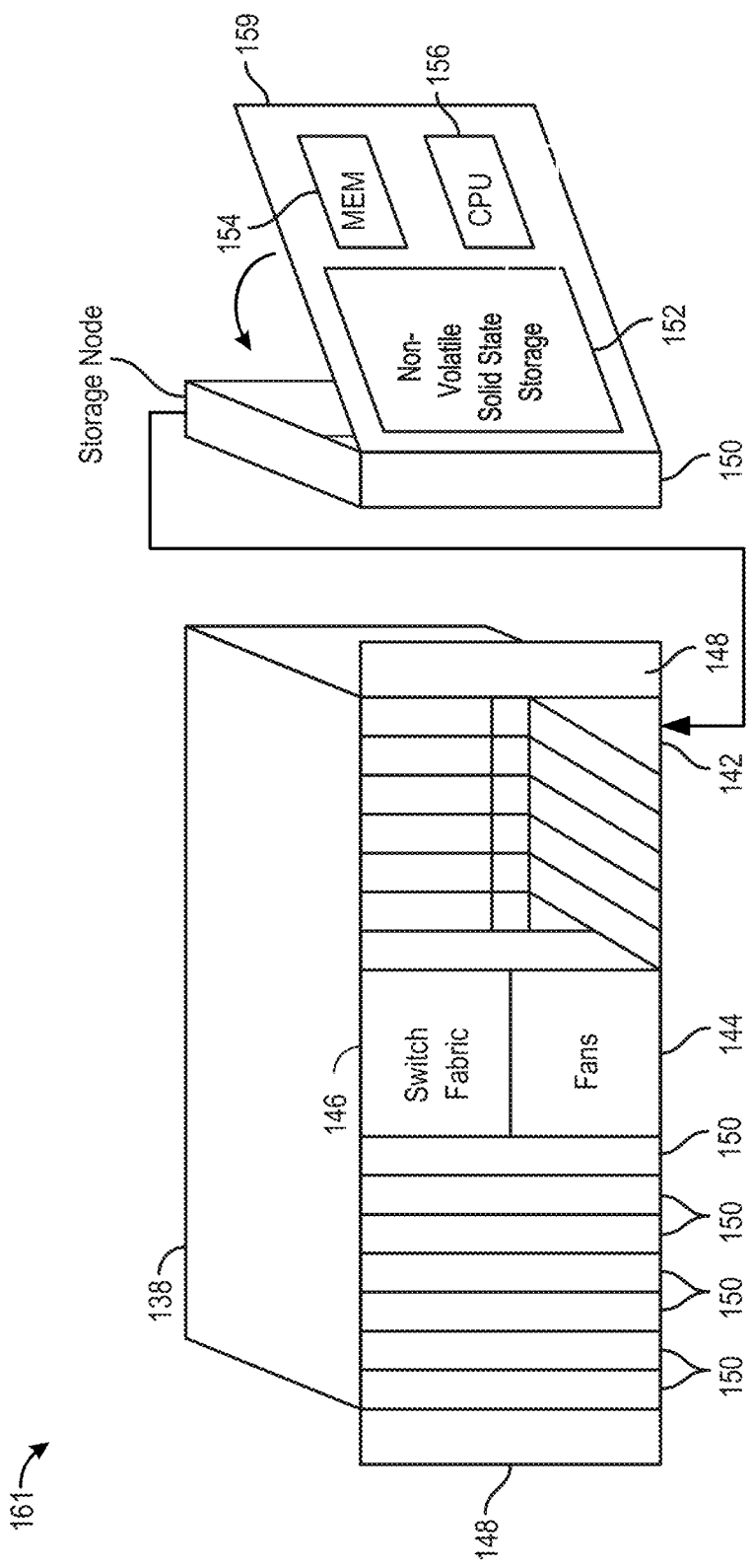
FIG. 2A is a perspective view of a storage cluster with multiple storage nodes and internal storage coupled to each storage node to provide network attached storage, in accordance with some embodiments.

FIG. 2A is a perspective view of a storage cluster 161, with multiple storage nodes 150 and internal solid-state memory coupled to each storage node to provide network attached storage or storage area network, in accordance with some embodiments. A network attached storage, storage area network, or a storage cluster, or other storage memory, could include one or more storage clusters 161, each having one or more storage nodes 150, in a flexible and reconfigurable arrangement of both the physical components and the amount of storage memory provided thereby. The storage cluster 161 is designed to fit in a rack, and one or more racks can be set up and populated as desired for the storage memory. The storage cluster 161 has a chassis 138 having multiple slots 142. It should be appreciated that chassis 138 may be referred to as a housing, enclosure, or rack unit. In one embodiment, the chassis 138 has fourteen slots 142, although other numbers of slots are readily devised. For example, some embodiments have four slots, eight slots, sixteen slots, thirty-two slots, or other suitable number of slots. Each slot 142 can accommodate one storage node 150 in some embodiments. Chassis 138 includes flaps 148 that can be utilized to mount the chassis 138 on a rack. Fans 144 provide air circulation for cooling of the storage nodes 150 and components thereof, although other cooling components could be used, or an embodiment could be devised without cooling components. A switch fabric 146 couples storage nodes 150 within chassis 138 together and to a network for communication to the memory. In an embodiment depicted in FIG. 1, the slots 142 to the left of the switch fabric 146 and fans 144 are shown occupied by storage nodes 150, while the slots 142 to the right of the switch fabric 146 and fans 144 are empty and available for insertion of storage node 150 for illustrative purposes. This configuration is one example, and one or more storage nodes 150 could occupy the slots 142 in various further arrangements. The storage node arrangements need not be sequential or adjacent in some embodiments. Storage nodes 150 are hot pluggable, meaning that a storage node 150 can be inserted into a slot 142 in the chassis 138, or removed from a slot 142, without stopping or powering down the system. Upon insertion or removal of storage node 150 from slot 142, the system automatically reconfigures in order to recognize and adapt to the change. Reconfiguration, in some embodiments, includes restoring redundancy and/or rebalancing data or load.

Each storage node 150 can have multiple components. In the embodiment shown here, the storage node 150 includes a printed circuit board 159 populated by a CPU 156, i.e., processor, a memory 154 coupled to the CPU 156, and a non-volatile solid state storage 152 coupled to the CPU 156, although other mountings and/or components could be used in further embodiments. The memory 154 has instructions which are executed by the CPU 156 and/or data operated on by the CPU 156. As further explained below, the non-volatile solid state storage 152 includes flash or, in further embodiments, other types of solid-state memory.

Referring to FIG. 2A, storage cluster 161 is scalable, meaning that storage capacity with non-uniform storage sizes is readily added, as described above. One or more storage nodes 150 can be plugged into or removed from each chassis and the storage cluster self-configures in some embodiments. Plug-in storage nodes 150, whether installed in a chassis as delivered or later added, can have different sizes. For example, in one embodiment a storage node 150 can have any multiple of 4 TB, e.g., 8 TB, 12 TB, 16 TB, 32 TB, etc. In further embodiments, a storage node 150 could have any multiple of other storage amounts or capacities. Storage capacity of each storage node 150 is broadcast, and influences decisions of how to stripe the data. For maximum storage efficiency, an embodiment can self-configure as wide as possible in the stripe, subject to a predetermined requirement of continued operation with loss of up to one, or up to two, non-volatile solid state storage units 152 or storage nodes 150 within the chassis.

Figure 2B:
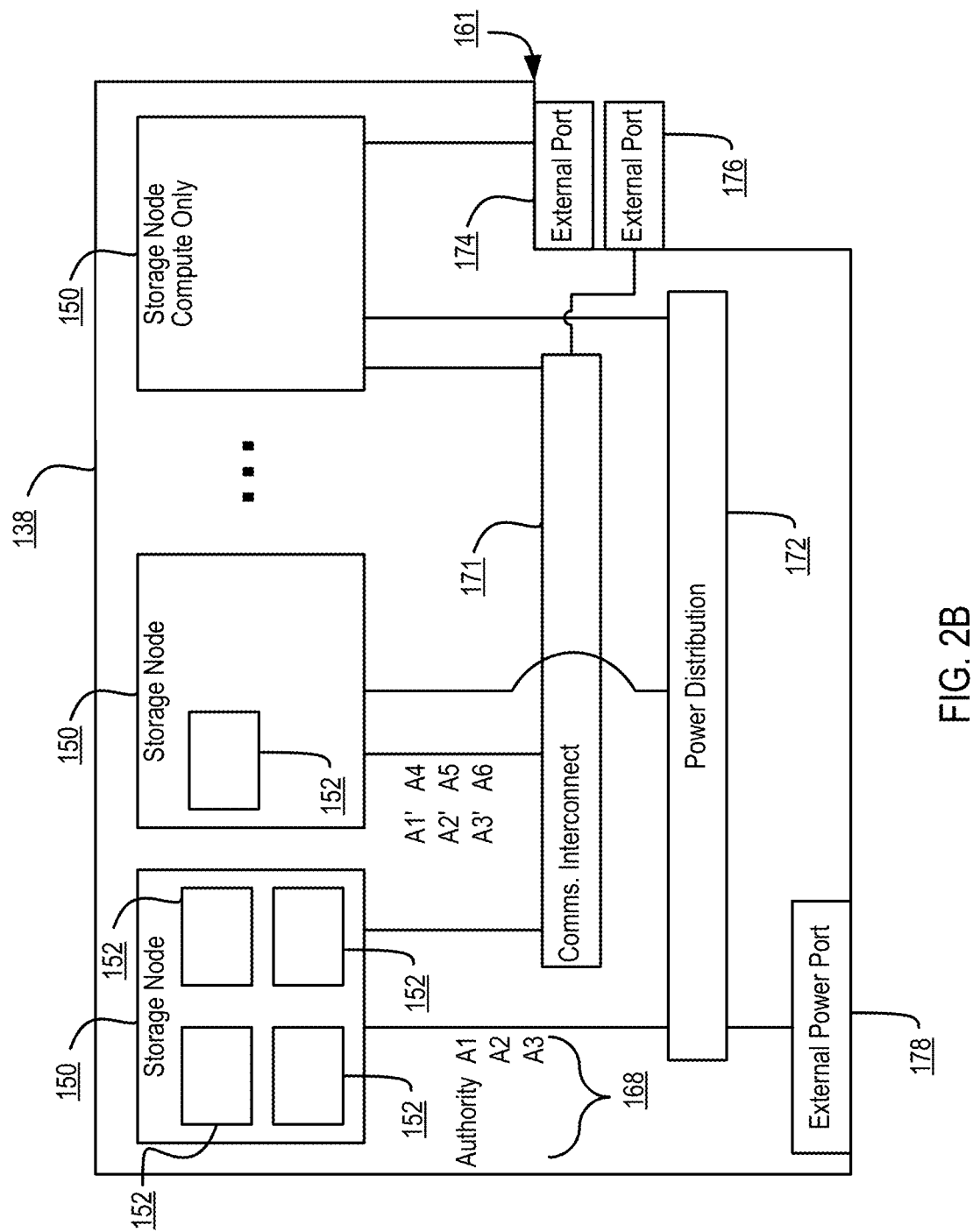
FIG. 2B is a block diagram showing an interconnect switch coupling multiple storage nodes in accordance with some embodiments.

FIG. 2B is a block diagram showing a communications interconnect 171 and power distribution bus 172 coupling multiple storage nodes 150. Referring back to FIG. 2A, the communications interconnect 171 can be included in or implemented with the switch fabric 146 in some embodiments. Where multiple storage clusters 161 occupy a rack, the communications interconnect 171 can be included in or implemented with a top of rack switch, in some embodiments. As illustrated in FIG. 2B, storage cluster 161 is enclosed within a single chassis 138. External port 176 is coupled to storage nodes 150 through communications interconnect 171, while external port 174 is coupled directly to a storage node. External power port 178 is coupled to power distribution bus 172. Storage nodes 150 may include varying amounts and differing capacities of non-volatile solid state storage 152 as described with reference to FIG. 2A. In addition, one or more storage nodes 150 may be a compute only storage node as illustrated in FIG. 2B. Authorities 168 are implemented on the non-volatile solid state storages 152, for example as lists or other data structures stored in memory. In some embodiments the authorities are stored within the non-volatile solid state storage 152 and supported by software executing on a controller or other processor of the non-volatile solid state storage 152. In a further embodiment, authorities 168 are implemented on the storage nodes 150, for example as lists or other data structures stored in the memory 154 and supported by software executing on the CPU 156 of the storage node 150. Authorities 168 control how and where data is stored in the non-volatile solid state storages 152 in some embodiments. This control assists in determining which type of erasure coding scheme is applied to the data, and which storage nodes 150 have which portions of the data. Each authority 168 may be assigned to a non-volatile solid state storage 152. Each authority may control a range of inode numbers, segment numbers, or other data identifiers which are assigned to data by a file system, by the storage nodes 150, or by the non-volatile solid state storage 152, in various embodiments.

Every piece of data, and every piece of metadata, has redundancy in the system in some embodiments. In addition, every piece of data and every piece of metadata has an owner, which may be referred to as an authority. If that authority is unreachable, for example through failure of a storage node, there is a plan of succession for how to find that data or that metadata. In various embodiments, there are redundant copies of authorities 168. Authorities 168 have a relationship to storage nodes 150 and non-volatile solid state storage 152 in some embodiments. Each authority 168, covering a range of data segment numbers or other identifiers of the data, may be assigned to a specific non-volatile solid state storage 152. In some embodiments the authorities 168 for all of such ranges are distributed over the non-volatile solid state storages 152 of a storage cluster. Each storage node 150 has a network port that provides access to the non-volatile solid state storage(s) 152 of that storage node 150. Data can be stored in a segment, which is associated with a segment number and that segment number is an indirection for a configuration of a RAID (redundant array of independent disks) stripe in some embodiments. The assignment and use of the authorities 168 thus establishes an indirection to data. Indirection may be referred to as the ability to reference data indirectly, in this case via an authority 168, in accordance with some embodiments. A segment identifies a set of non-volatile solid state storage 152 and a local identifier into the set of non-volatile solid state storage 152 that may contain data. In some embodiments, the local identifier is an offset into the device and may be reused sequentially by multiple segments. In other embodiments the local identifier is unique for a specific segment and never reused. The offsets in the non-volatile solid state storage 152 are applied to locating data for writing to or reading from the non-volatile solid state storage 152 (in the form of a RAID stripe). Data is striped across multiple units of non-volatile solid state storage 152, which may include or be different from the non-volatile solid state storage 152 having the authority 168 for a particular data segment.

If there is a change in where a particular segment of data is located, e.g., during a data move or a data reconstruction, the authority 168 for that data segment should be consulted, at that non-volatile solid state storage 152 or storage node 150 having that authority 168. In order to locate a particular piece of data, embodiments calculate a hash value for a data segment or apply an inode number or a data segment number. The output of this operation points to a non-volatile solid state storage 152 having the authority 168 for that particular piece of data. In some embodiments there are two stages to this operation. The first stage maps an entity identifier (ID), e.g., a segment number, inode number, or directory number to an authority identifier. This mapping may include a calculation such as a hash or a bit mask. The second stage is mapping the authority identifier to a particular non-volatile solid state storage 152, which may be done through an explicit mapping. The operation is repeatable, so that when the calculation is performed, the result of the calculation repeatably and reliably points to a particular non-volatile solid state storage 152 having that authority 168. The operation may include the set of reachable storage nodes as input. If the set of reachable non-volatile solid state storage units changes the optimal set changes. In some embodiments, the persisted value is the current assignment (which is always true) and the calculated value is the target assignment the cluster will attempt to reconfigure towards. This calculation may be used to determine the optimal non-volatile solid state storage 152 for an authority in the presence of a set of non-volatile solid state storage 152 that are reachable and constitute the same cluster. The calculation also determines an ordered set of peer non-volatile solid state storage 152 that will also record the authority to non-volatile solid state storage mapping so that the authority may be determined even if the assigned non-volatile solid state storage is unreachable. A duplicate or substitute authority 168 may be consulted if a specific authority 168 is unavailable in some embodiments.

With reference to FIGS. 2A and 2B, two of the many tasks of the CPU 156 on a storage node 150 are to break up write data, and reassemble read data. When the system has determined that data is to be written, the authority 168 for that data is located as above. When the segment ID for data is already determined the request to write is forwarded to the non-volatile solid state storage 152 currently determined to be the host of the authority 168 determined from the segment. The host CPU 156 of the storage node 150, on which the non-volatile solid state storage 152 and corresponding authority 168 reside, then breaks up or shards the data and transmits the data out to various non-volatile solid state storage 152. The transmitted data is written as a data stripe in accordance with an erasure coding scheme. In some embodiments, data is requested to be pulled, and in other embodiments, data is pushed. In reverse, when data is read, the authority 168 for the segment ID containing the data is located as described above. The host CPU 156 of the storage node 150 on which the non-volatile solid state storage 152 and corresponding authority 168 reside requests the data from the non-volatile solid state storage and corresponding storage nodes pointed to by the authority. In some embodiments the data is read from flash storage as a data stripe. The host CPU 156 of storage node 150 then reassembles the read data, correcting any errors (if present) according to the appropriate erasure coding scheme, and forwards the reassembled data to the network. In further embodiments, some or all of these tasks can be handled in the non-volatile solid state storage 152. In some embodiments, the segment host requests the data be sent to storage node 150 by requesting pages from storage and then sending the data to the storage node making the original request.

In some systems, for example in UNIX-style file systems, data is handled with an index node or inode, which specifies a data structure that represents an object in a file system. The object could be a file or a directory, for example. Metadata may accompany the object, as attributes such as permission data and a creation timestamp, among other attributes. A segment number could be assigned to all or a portion of such an object in a file system. In other systems, data segments are handled with a segment number assigned elsewhere. For purposes of discussion, the unit of distribution is an entity, and an entity can be a file, a directory or a segment. That is, entities are units of data or metadata stored by a storage system. Entities are grouped into sets called authorities. Each authority has an authority owner, which is a storage node that has the exclusive right to update the entities in the authority. In other words, a storage node contains the authority, and that the authority, in turn, contains entities.

A segment is a logical container of data in accordance with some embodiments. A segment is an address space between medium address space and physical flash locations, i.e., the data segment number, are in this address space. Segments may also contain meta-data, which enable data redundancy to be restored (rewritten to different flash locations or devices) without the involvement of higher level software. In one embodiment, an internal format of a segment contains client data and medium mappings to determine the position of that data. Each data segment is protected, e.g., from memory and other failures, by breaking the segment into a number of data and parity shards, where applicable. The data and parity shards are distributed, i.e., striped, across non-volatile solid state storage 152 coupled to the host CPUs 156 (See FIGS. 2E and 2G) in accordance with an erasure coding scheme. Usage of the term segments refers to the container and its place in the address space of segments in some embodiments. Usage of the term stripe refers to the same set of shards as a segment and includes how the shards are distributed along with redundancy or parity information in accordance with some embodiments.

A series of address-space transformations takes place across an entire storage system. At the top are the directory entries (file names) which link to an inode. Modes point into medium address space, where data is logically stored. Medium addresses may be mapped through a series of indirect mediums to spread the load of large files, or implement data services like deduplication or snapshots. Medium addresses may be mapped through a series of indirect mediums to spread the load of large files, or implement data services like deduplication or snapshots. Segment addresses are then translated into physical flash locations. Physical flash locations have an address range bounded by the amount of flash in the system in accordance with some embodiments. Medium addresses and segment addresses are logical containers, and in some embodiments use a 128 bit or larger identifier so as to be practically infinite, with a likelihood of reuse calculated as longer than the expected life of the system. Addresses from logical containers are allocated in a hierarchical fashion in some embodiments. Initially, each non-volatile solid state storage unit 152 may be assigned a range of address space. Within this assigned range, the non-volatile solid state storage 152 is able to allocate addresses without synchronization with other non-volatile solid state storage 152.

Data and metadata is stored by a set of underlying storage layouts that are optimized for varying workload patterns and storage devices. These layouts incorporate multiple redundancy schemes, compression formats and index algorithms. Some of these layouts store information about authorities and authority masters, while others store file metadata and file data. The redundancy schemes include error correction codes that tolerate corrupted bits within a single storage device (such as a NAND flash chip), erasure codes that tolerate the failure of multiple storage nodes, and replication schemes that tolerate data center or regional failures. In some embodiments, low density parity check (LDPC) code is used within a single storage unit. Reed-Solomon encoding is used within a storage cluster, and mirroring is used within a storage grid in some embodiments. Metadata may be stored using an ordered log structured index (such as a Log Structured Merge Tree), and large data may not be stored in a log structured layout.

In order to maintain consistency across multiple copies of an entity, the storage nodes agree implicitly on two things through calculations: (1) the authority that contains the entity, and (2) the storage node that contains the authority. The assignment of entities to authorities can be done by pseudo randomly assigning entities to authorities, by splitting entities into ranges based upon an externally produced key, or by placing a single entity into each authority. Examples of pseudorandom schemes are linear hashing and the Replication Under Scalable Hashing (RUSH) family of hashes, including Controlled Replication Under Scalable Hashing (CRUSH). In some embodiments, pseudo-random assignment is utilized only for assigning authorities to nodes because the set of nodes can change. The set of authorities cannot change so any subjective function may be applied in these embodiments. Some placement schemes automatically place authorities on storage nodes, while other placement schemes rely on an explicit mapping of authorities to storage nodes. In some embodiments, a pseudorandom scheme is utilized to map from each authority to a set of candidate authority owners. A pseudorandom data distribution function related to CRUSH may assign authorities to storage nodes and create a list of where the authorities are assigned. Each storage node has a copy of the pseudorandom data distribution function, and can arrive at the same calculation for distributing, and later finding or locating an authority. Each of the pseudorandom schemes requires the reachable set of storage nodes as input in some embodiments in order to conclude the same target nodes. Once an entity has been placed in an authority, the entity may be stored on physical devices so that no expected failure will lead to unexpected data loss. In some embodiments, rebalancing algorithms attempt to store the copies of all entities within an authority in the same layout and on the same set of machines.

Examples of expected failures include device failures, stolen machines, datacenter fires, and regional disasters, such as nuclear or geological events. Different failures lead to different levels of acceptable data loss. In some embodiments, a stolen storage node impacts neither the security nor the reliability of the system, while depending on system configuration, a regional event could lead to no loss of data, a few seconds or minutes of lost updates, or even complete data loss.

In the embodiments, the placement of data for storage redundancy is independent of the placement of authorities for data consistency. In some embodiments, storage nodes that contain authorities do not contain any persistent storage. Instead, the storage nodes are connected to non-volatile solid state storage units that do not contain authorities. The communications interconnect between storage nodes and non-volatile solid state storage units consists of multiple communication technologies and has non-uniform performance and fault tolerance characteristics. In some embodiments, as mentioned above, non-volatile solid state storage units are connected to storage nodes via PCI express, storage nodes are connected together within a single chassis using Ethernet backplane, and chassis are connected together to form a storage cluster. Storage clusters are connected to clients using Ethernet or fiber channel in some embodiments. If multiple storage clusters are configured into a storage grid, the multiple storage clusters are connected using the Internet or other long-distance networking links, such as a "metro scale" link or private link that does not traverse the internet.

Authority owners have the exclusive right to modify entities, to migrate entities from one non-volatile solid state storage unit to another non-volatile solid state storage unit, and to add and remove copies of entities. This allows for maintaining the redundancy of the underlying data. When an authority owner fails, is going to be decommissioned, or is overloaded, the authority is transferred to a new storage node. Transient failures make it non-trivial to ensure that all non-faulty machines agree upon the new authority location. The ambiguity that arises due to transient failures can be achieved automatically by a consensus protocol such as Paxos, hot-warm failover schemes, via manual intervention by a remote system administrator, or by a local hardware administrator (such as by physically removing the failed machine from the cluster, or pressing a button on the failed machine). In some embodiments, a consensus protocol is used, and failover is automatic. If too many failures or replication events occur in too short a time period, the system goes into a self-preservation mode and halts replication and data movement activities until an administrator intervenes in accordance with some embodiments.

As authorities are transferred between storage nodes and authority owners update entities in their authorities, the system transfers messages between the storage nodes and non-volatile solid state storage units. With regard to persistent messages, messages that have different purposes are of different types. Depending on the type of the message, the system maintains different ordering and durability guarantees. As the persistent messages are being processed, the messages are temporarily stored in multiple durable and non-durable storage hardware technologies. In some embodiments, messages are stored in RAM, NVRAM and on NAND flash devices, and a variety of protocols are used in order to make efficient use of each storage medium. Latency-sensitive client requests may be persisted in replicated NVRAM, and then later NAND, while background rebalancing operations are persisted directly to NAND.

Persistent messages are persistently stored prior to being transmitted. This allows the system to continue to serve client requests despite failures and component replacement. Although many hardware components contain unique identifiers that are visible to system administrators, manufacturer, hardware supply chain and ongoing monitoring quality control infrastructure, applications running on top of the infrastructure address virtualize addresses. These virtualized addresses do not change over the lifetime of the storage system, regardless of component failures and replacements. This allows each component of the storage system to be replaced over time without reconfiguration or disruptions of client request processing, i.e., the system supports non-disruptive upgrades.

In some embodiments, the virtualized addresses are stored with sufficient redundancy. A continuous monitoring system correlates hardware and software status and the hardware identifiers. This allows detection and prediction of failures due to faulty components and manufacturing details. The monitoring system also enables the proactive transfer of authorities and entities away from impacted devices before failure occurs by removing the component from the critical path in some embodiments.

Figure 2C:
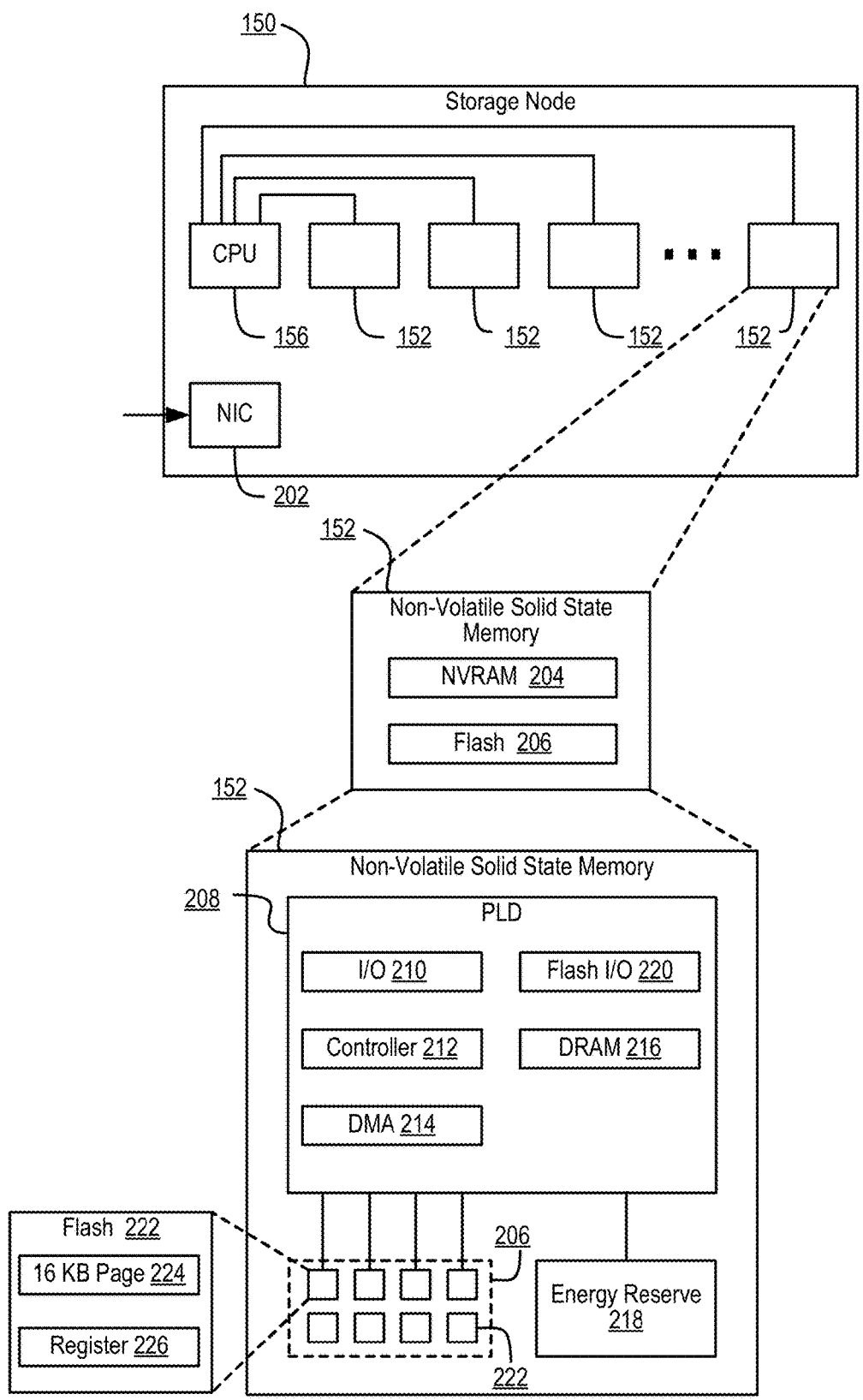
FIG. 2C is a multiple level block diagram, showing contents of a storage node and contents of one of the non-volatile solid state storage units in accordance with some embodiments.

FIG. 2C is a multiple level block diagram, showing contents of a storage node 150 and contents of a non-volatile solid state storage 152 of the storage node 150. Data is communicated to and from the storage node 150 by a network interface controller (NIC) 202 in some embodiments. Each storage node 150 has a CPU 156, and one or more non-volatile solid state storage 152, as discussed above. Moving down one level in FIG. 2C, each non-volatile solid state storage 152 has a relatively fast non-volatile solid state memory, such as nonvolatile random access memory (NVRAM) 204, and flash memory 206. In some embodiments, NVRAM 204 may be a component that does not require program/erase cycles (DRAM, MRAM, PCM), and can be a memory that can support being written vastly more often than the memory is read from. Moving down another level in FIG. 2C, the NVRAM 204 is implemented in one embodiment as high speed volatile memory, such as dynamic random access memory (DRAM) 216, backed up by energy reserve 218. Energy reserve 218 provides sufficient electrical power to keep the DRAM 216 powered long enough for contents to be transferred to the flash memory 206 in the event of power failure. In some embodiments, energy reserve 218 is a capacitor, super-capacitor, battery, or other device, that supplies a suitable supply of energy sufficient to enable the transfer of the contents of DRAM 216 to a stable storage medium in the case of power loss. The flash memory 206 is implemented as multiple flash dies 222, which may be referred to as packages of flash dies 222 or an array of flash dies 222. It should be appreciated that the flash dies 222 could be packaged in any number of ways, with a single die per package, multiple dies per package (i.e. multichip packages), in hybrid packages, as bare dies on a printed circuit board or other substrate, as encapsulated dies, etc. In the embodiment shown, the non-volatile solid state storage 152 has a controller 212 or other processor, and an input output (I/O) port 210 coupled to the controller 212. I/O port 210 is coupled to the CPU 156 and/or the network interface controller 202 of the flash storage node 150. Flash input output (I/O) port 220 is coupled to the flash dies 222, and a direct memory access unit (DMA) 214 is coupled to the controller 212, the DRAM 216 and the flash dies 222. In the embodiment shown, the I/O port 210, controller 212, DMA unit 214 and flash I/O port 220 are implemented on a programmable logic device (PLD) 208, e.g., a field programmable gate array (FPGA). In this embodiment, each flash die 222 has pages, organized as sixteen kB (kilobyte) pages 224, and a register 226 through which data can be written to or read from the flash die 222. In further embodiments, other types of solid-state memory are used in place of, or in addition to flash memory illustrated within flash die 222.

Storage clusters 161, in various embodiments as disclosed herein, can be contrasted with storage arrays in general. The storage nodes 150 are part of a collection that creates the storage cluster 161. Each storage node 150 owns a slice of data and computing required to provide the data. Multiple storage nodes 150 cooperate to store and retrieve the data. Storage memory or storage devices, as used in storage arrays in general, are less involved with processing and manipulating the data. Storage memory or storage devices in a storage array receive commands to read, write, or erase data. The storage memory or storage devices in a storage array are not aware of a larger system in which they are embedded, or what the data means. Storage memory or storage devices in storage arrays can include various types of storage memory, such as RAM, solid state drives, hard disk drives, etc. The storage units 152 described herein have multiple interfaces active simultaneously and serving multiple purposes. In some embodiments, some of the functionality of a storage node 150 is shifted into a storage unit 152, transforming the storage unit 152 into a combination of storage unit 152 and storage node 150. Placing computing (relative to storage data) into the storage unit 152 places this computing closer to the data itself. The various system embodiments have a hierarchy of storage node layers with different capabilities. By contrast, in a storage array, a controller owns and knows everything about all of the data that the controller manages in a shelf or storage devices. In a storage cluster 161, as described herein, multiple controllers in multiple storage units 152 and/or storage nodes 150 cooperate in various ways (e.g., for erasure coding, data sharding, metadata communication and redundancy, storage capacity expansion or contraction, data recovery, and so on).

Figure 2D:
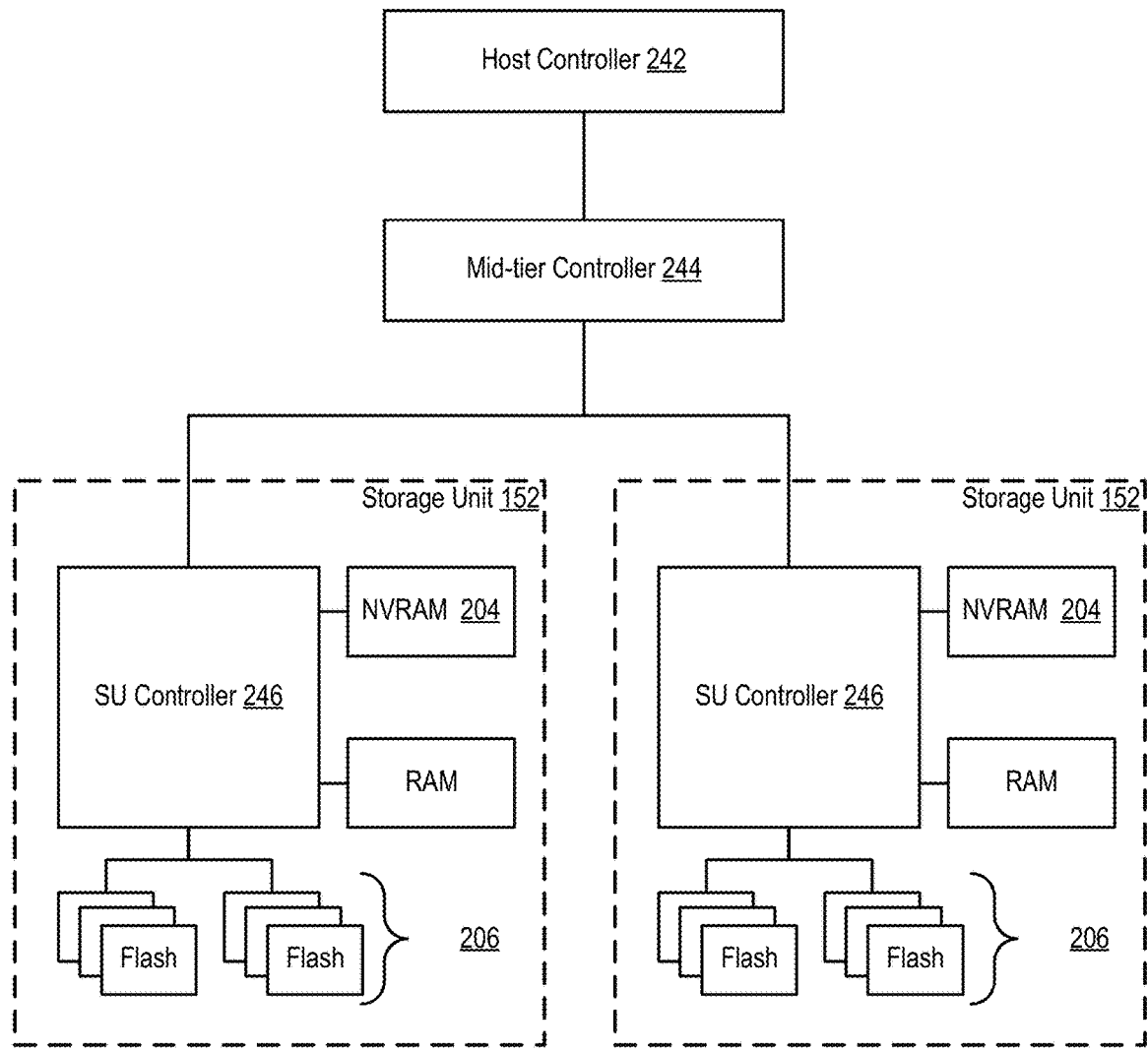
FIG. 2D shows a storage server environment, which uses embodiments of the storage nodes and storage units of FIGS. 1-3 in accordance with some embodiments.

FIG. 2D shows a storage server environment, which uses embodiments of the storage nodes 150 and storage units 152 of FIGS. 2A-C. In this version, each storage unit 152 has a processor such as controller 212 (see FIG. 2C), an FPGA (field programmable gate array), flash memory 206, and NVRAM 204 (which is super-capacitor backed DRAM 216, see FIGS. 2B and 2C) on a PCIe (peripheral component interconnect express) board in a chassis 138 (see FIG. 2A). The storage unit 152 may be implemented as a single board containing storage, and may be the largest tolerable failure domain inside the chassis. In some embodiments, up to two storage units 152 may fail and the device will continue with no data loss.

The physical storage is divided into named regions based on application usage in some embodiments. The NVRAM 204 is a contiguous block of reserved memory in the storage unit 152 DRAM 216, and is backed by NAND flash. NVRAM 204 is logically divided into multiple memory regions written for two as spool (e.g., spool_region). Space within the NVRAM 204 spools is managed by each authority 168 independently. Each device provides an amount of storage space to each authority 168. That authority 168 further manages lifetimes and allocations within that space.

Examples of a spool include distributed transactions or notions. When the primary power to a storage unit 152 fails, onboard super-capacitors provide a short duration of power hold up. During this holdup interval, the contents of the NVRAM 204 are flushed to flash memory 206. On the next power-on, the contents of the NVRAM 204 are recovered from the flash memory 206.

As for the storage unit controller, the responsibility of the logical "controller" is distributed across each of the blades containing authorities 168. This distribution of logical control is shown in FIG. 2D as a host controller 242, mid-tier controller 244 and storage unit controller(s) 246. Management of the control plane and the storage plane are treated independently, although parts may be physically co-located on the same blade. Each authority 168 effectively serves as an independent controller. Each authority 168 provides its own data and metadata structures, its own background workers, and maintains its own lifecycle.

Figure 2E:
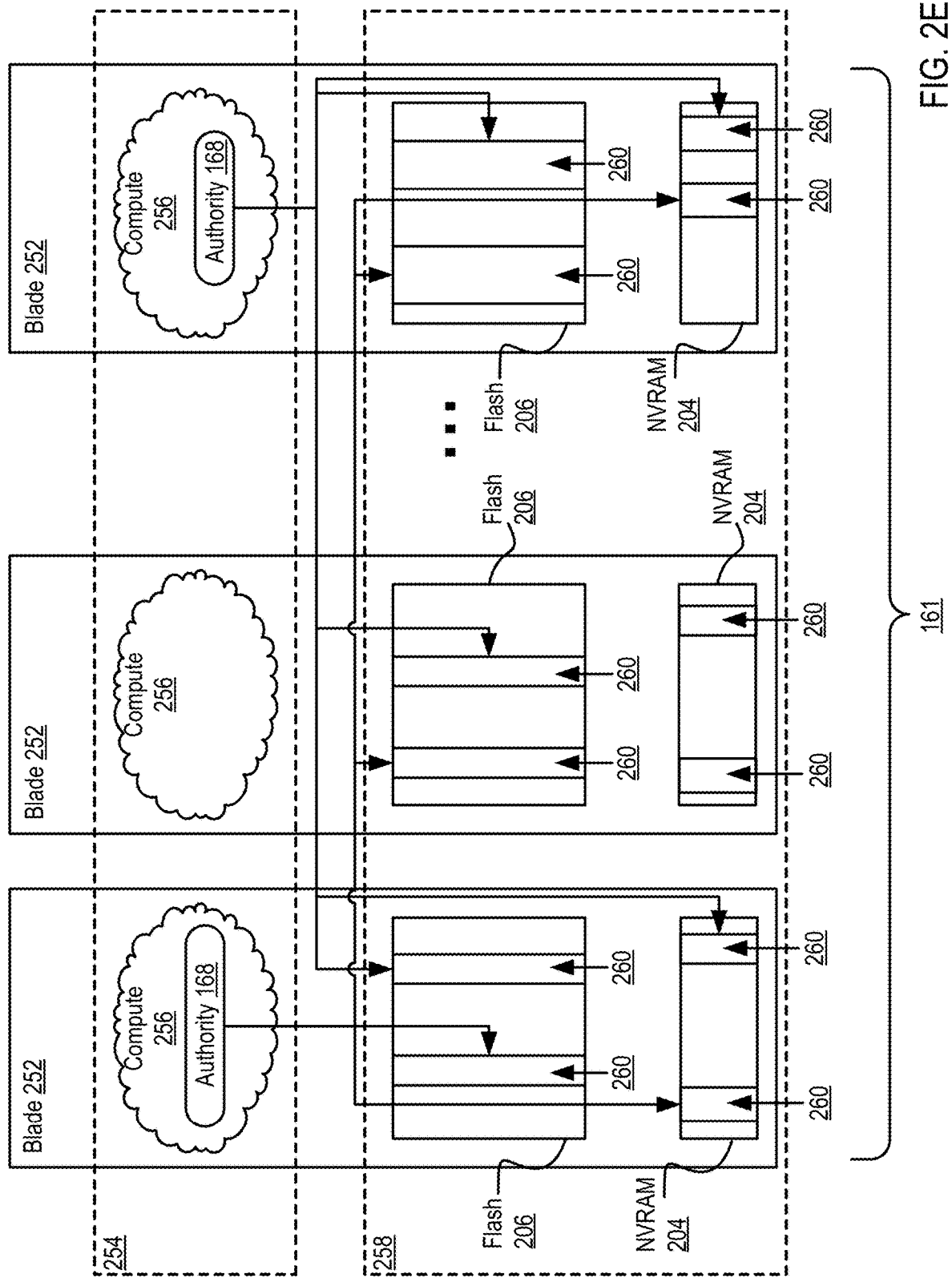
FIG. 2E is a blade hardware block diagram, showing a control plane, compute and storage planes, and authorities interacting with underlying physical resources, in accordance with some embodiments.

FIG. 2E is a blade 252 hardware block diagram, showing a control plane 254, compute and storage planes 256, 258, and authorities 168 interacting with underlying physical resources, using embodiments of the storage nodes 150 and storage units 152 of FIGS. 2A-C in the storage server environment of FIG. 2D. The control plane 254 is partitioned into a number of authorities 168 which can use the compute resources in the compute plane 256 to run on any of the blades 252. The storage plane 258 is partitioned into a set of devices, each of which provides access to flash 206 and NVRAM 204 resources.

In the compute and storage planes 256, 258 of FIG. 2E, the authorities 168 interact with the underlying physical resources (i.e., devices). From the point of view of an authority 168, its resources are striped over all of the physical devices. From the point of view of a device, it provides resources to all authorities 168, irrespective of where the authorities happen to run. Each authority 168 has allocated or has been allocated one or more partitions 260 of storage memory in the storage units 152, e.g. partitions 260 in flash memory 206 and NVRAM 204. Each authority 168 uses those allocated partitions 260 that belong to it, for writing or reading user data. Authorities can be associated with differing amounts of physical storage of the system. For example, one authority 168 could have a larger number of partitions 260 or larger sized partitions 260 in one or more storage units 152 than one or more other authorities 168.

Figure 2F:
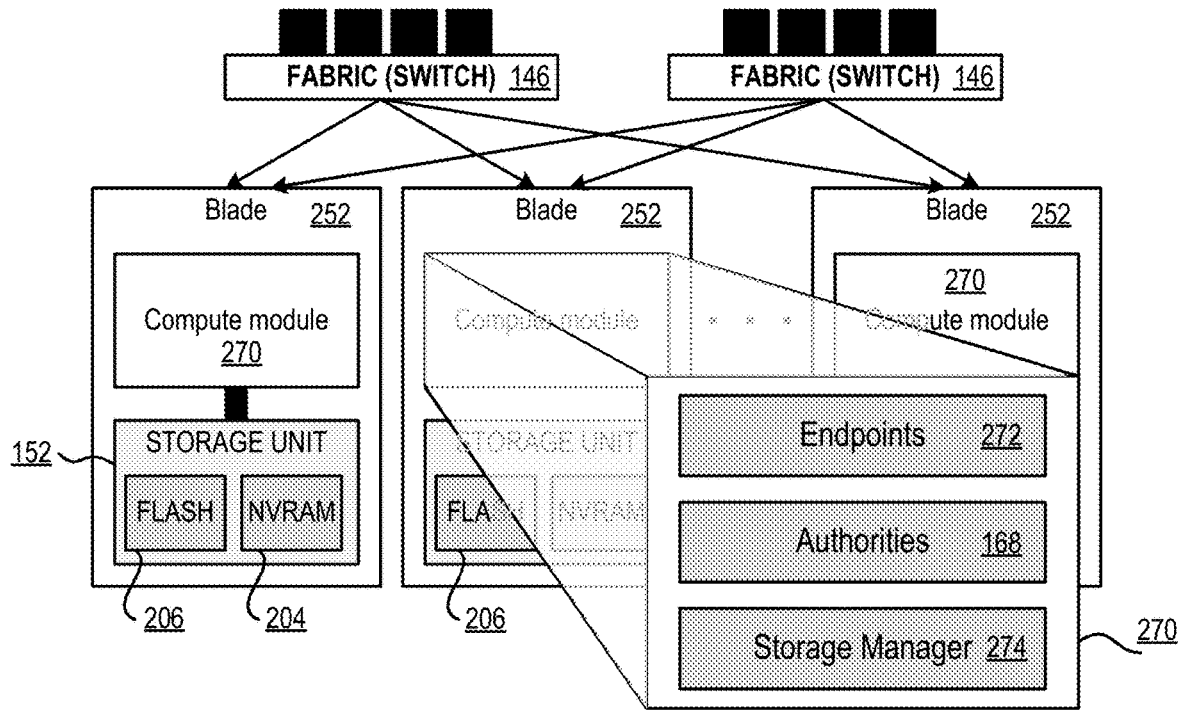
FIG. 2F depicts elasticity software layers in blades of a storage cluster, in accordance with some embodiments.

FIG. 2F depicts elasticity software layers in blades 252 of a storage cluster 161, in accordance with some embodiments. In the elasticity structure, elasticity software is symmetric, i.e., each blade's compute module 270 runs the three identical layers of processes depicted in FIG. 2F. Storage managers 274 execute read and write requests from other blades 252 for data and metadata stored in local storage unit 152 NVRAM 204 and flash 206. Authorities 168 fulfill client requests by issuing the necessary reads and writes to the blades 252 on whose storage units 152 the corresponding data or metadata resides. Endpoints 272 parse client connection requests received from switch fabric 146 supervisory software, relay the client connection requests to the authorities 168 responsible for fulfillment, and relay the authorities' 168 responses to clients. The symmetric three-layer structure enables the storage system's high degree of concurrency. Elasticity scales out efficiently and reliably in these embodiments. In addition, elasticity implements a unique scale-out technique that balances work evenly across all resources regardless of client access pattern, and maximizes concurrency by eliminating much of the need for inter-blade coordination that typically occurs with conventional distributed locking.

Still referring to FIG. 2F, authorities 168 running in the compute modules 270 of a blade 252 perform the internal operations required to fulfill client requests. One feature of elasticity is that authorities 168 are stateless, i.e., they cache active data and metadata in their own blades' 168 DRAMs for fast access, but the authorities store every update in their NVRAM 204 partitions on three separate blades 252 until the update has been written to flash 206. All the storage system writes to NVRAM 204 are in triplicate to partitions on three separate blades 252 in some embodiments. With triple-mirrored NVRAM 204 and persistent storage protected by parity and Reed-Solomon RAID checksums, the storage system can survive concurrent failure of two blades 252 with no loss of data, metadata, or access to either.

Because authorities 168 are stateless, they can migrate between blades 252. Each authority 168 has a unique identifier. NVRAM 204 and flash 206 partitions are associated with authorities' 168 identifiers, not with the blades 252 on which they are running in some. Thus, when an authority 168 migrates, the authority 168 continues to manage the same storage partitions from its new location. When a new blade 252 is installed in an embodiment of the storage cluster 161, the system automatically rebalances load by:

Partitioning the new blade's 252 storage for use by the system's authorities 168, Migrating selected authorities 168 to the new blade 252, Starting endpoints 272 on the new blade 252 and including them in the switch fabric's 146 client connection distribution algorithm.

From their new locations, migrated authorities 168 persist the contents of their NVRAM 204 partitions on flash 206, process read and write requests from other authorities 168, and fulfill the client requests that endpoints 272 direct to them. Similarly, if a blade 252 fails or is removed, the system redistributes its authorities 168 among the system's remaining blades 252. The redistributed authorities 168 continue to perform their original functions from their new locations.

Figure 2G:
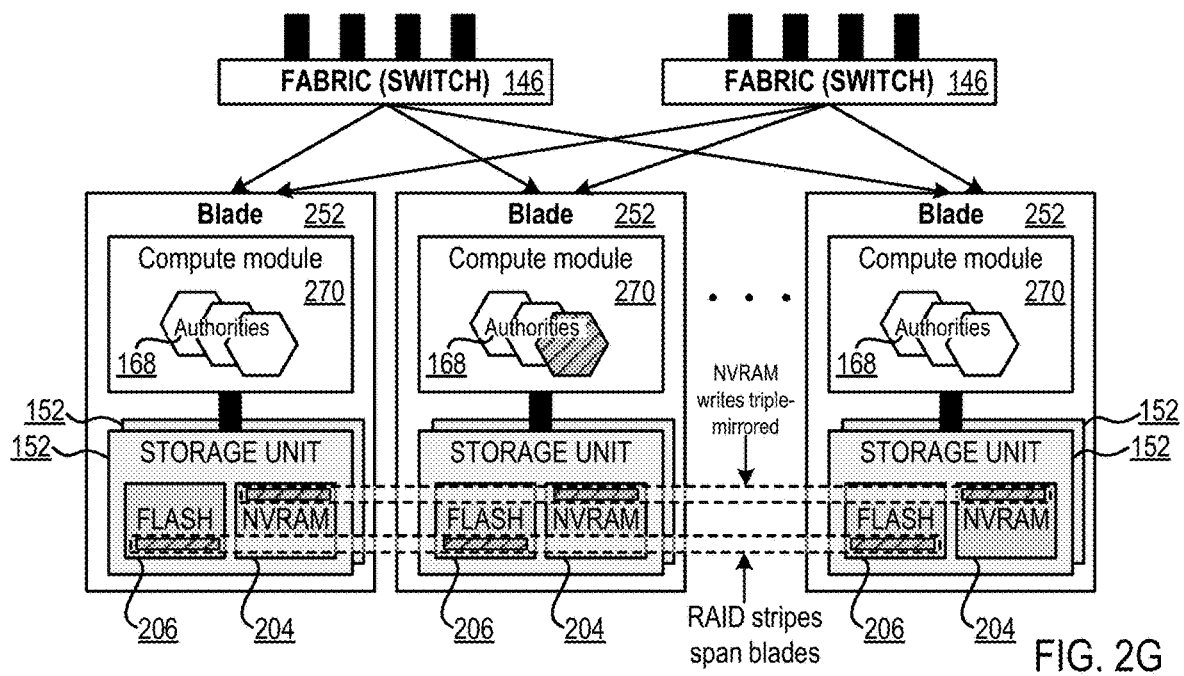
FIG. 2G depicts authorities and storage resources in blades of a storage cluster, in accordance with some embodiments.

FIG. 2G depicts authorities 168 and storage resources in blades 252 of a storage cluster, in accordance with some embodiments. Each authority 168 is exclusively responsible for a partition of the flash 206 and NVRAM 204 on each blade 252. The authority 168 manages the content and integrity of its partitions independently of other authorities 168. Authorities 168 compress incoming data and preserve it temporarily in their NVRAM 204 partitions, and then consolidate, RAID-protect, and persist the data in segments of the storage in their flash 206 partitions. As the authorities 168 write data to flash 206, storage managers 274 perform the necessary flash translation to optimize write performance and maximize media longevity. In the background, authorities 168 "garbage collect," or reclaim space occupied by data that clients have made obsolete by overwriting the data. It should be appreciated that since authorities' 168 partitions are disjoint, there is no need for distributed locking to execute client and writes or to perform background functions.

The embodiments described herein may utilize various software, communication and/or networking protocols. In addition, the configuration of the hardware and/or software may be adjusted to accommodate various protocols. For example, the embodiments may utilize Active Directory, which is a database based system that provides authentication, directory, policy, and other services in a WINDOWS™ environment. In these embodiments, LDAP (Lightweight Directory Access Protocol) is one example application protocol for querying and modifying items in directory service providers such as Active Directory. In some embodiments, a network lock manager (NLM) is utilized as a facility that works in cooperation with the Network File System (NFS) to provide a System V style of advisory file and record locking over a network. The Server Message Block (SMB) protocol, one version of which is also known as Common Internet File System (CIFS), may be integrated with the storage systems discussed herein. SMP operates as an application-layer network protocol typically used for providing shared access to files, printers, and serial ports and miscellaneous communications between nodes on a network. SMB also provides an authenticated inter-process communication mechanism. AMAZON™ S3 (Simple Storage Service) is a web service offered by Amazon Web Services, and the systems described herein may interface with Amazon S3 through web services interfaces (REST (representational state transfer), SOAP (simple object access protocol), and BitTorrent). A RESTful API (application programming interface) breaks down a transaction to create a series of small modules. Each module addresses a particular underlying part of the transaction. The control or permissions provided with these embodiments, especially for object data, may include utilization of an access control list (ACL). The ACL is a list of permissions attached to an object and the ACL specifies which users or system processes are granted access to objects, as well as what operations are allowed on given objects. The systems may utilize Internet Protocol version 6 (IPv6), as well as IPv4, for the communications protocol that provides an identification and location system for computers on networks and routes traffic across the Internet. The routing of packets between networked systems may include Equal-cost multi-path routing (ECMP), which is a routing strategy where next-hop packet forwarding to a single destination can occur over multiple "best paths" which tie for top place in routing metric calculations. Multi-path routing can be used in conjunction with most routing protocols, because it is a per-hop decision limited to a single router. The software may support Multi-tenancy, which is an architecture in which a single instance of a software application serves multiple customers. Each customer may be referred to as a tenant. Tenants may be given the ability to customize some parts of the application, but may not customize the application's code, in some embodiments. The embodiments may maintain audit logs. An audit log is a document that records an event in a computing system. In addition to documenting what resources were accessed, audit log entries typically include destination and source addresses, a timestamp, and user login information for compliance with various regulations. The embodiments may support various key management policies, such as encryption key rotation. In addition, the system may support dynamic root passwords or some variation dynamically changing passwords.

Figure 3A:
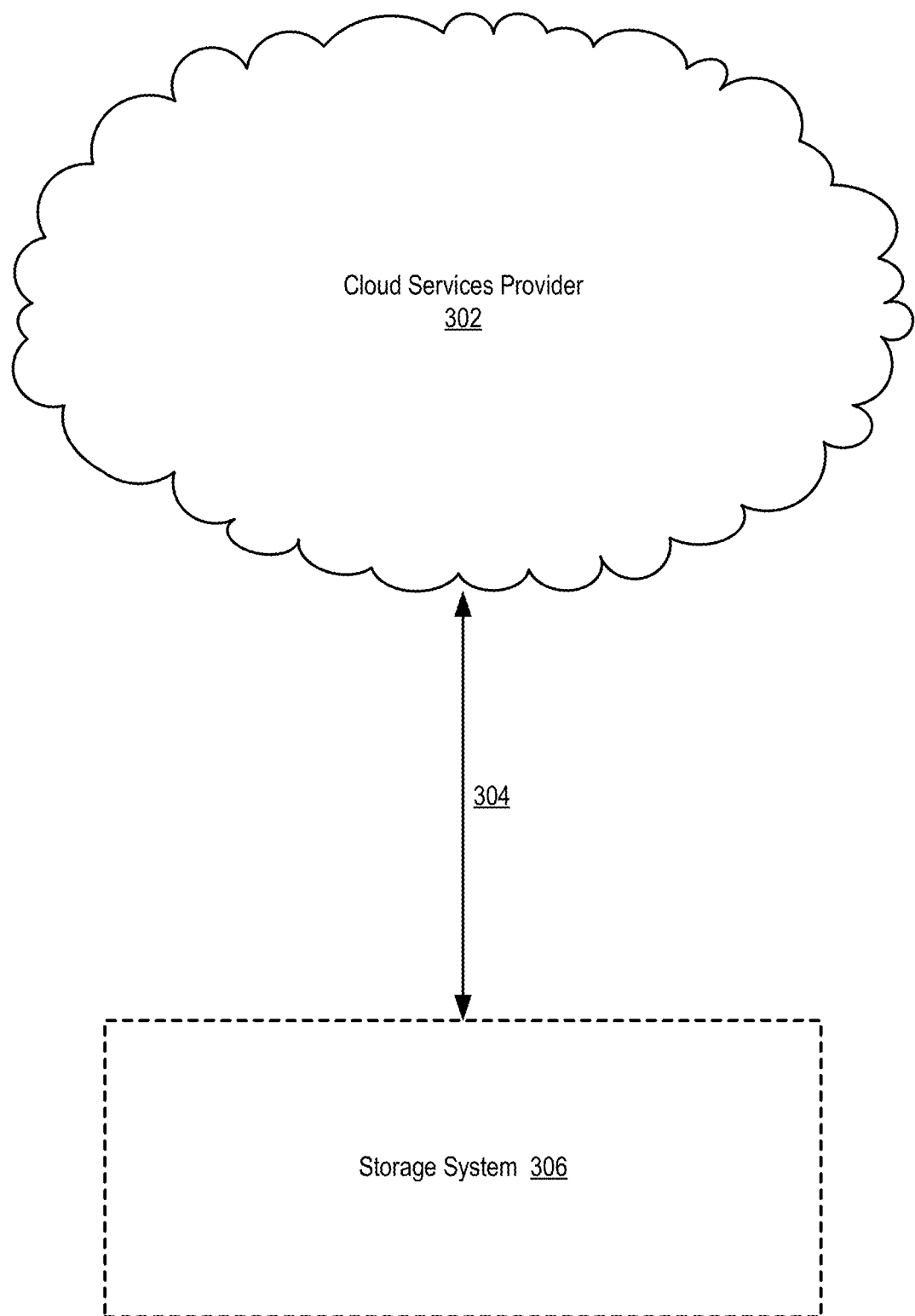
FIG. 3A sets forth a diagram of a storage system that is coupled for data communications with a cloud services provider in accordance with some embodiments of the present disclosure.

FIG. 3A sets forth a diagram of a storage system 306 that is coupled for data communications with a cloud services provider 302 in accordance with some embodiments of the present disclosure. Although depicted in less detail, the storage system 306 depicted in FIG. 3A may be similar to the storage systems described above with reference to FIGS. 1A-1D and FIGS. 2A-2G. In some embodiments, the storage system 306 depicted in FIG. 3A may be embodied as a storage system that includes imbalanced active/active controllers, as a storage system that includes balanced active/active controllers, as a storage system that includes active/ active controllers where less than all of each controller's resources are utilized such that each controller has reserve resources that may be used to support failover, as a storage system that includes fully active/active controllers, as a storage system that includes dataset-segregated controllers, as a storage system that includes dual-layer architectures with front-end controllers and back-end integrated storage controllers, as a storage system that includes scale-out clusters of dual-controller arrays, as well as combinations of such embodiments.

In the example depicted in FIG. 3A, the storage system 306 is coupled to the cloud services provider 302 via a data communications link 304. The data communications link 304 may be embodied as a dedicated data communications link, as a data communications pathway that is provided through the use of one or data communications networks such as a wide area network (WAN') or local area network ('LAN'), or as some other mechanism capable of transporting digital information between the storage system 306 and the cloud services provider 302. Such a data communications link 304 may be fully wired, fully wireless, or some aggregation of wired and wireless data communications pathways. In such an example, digital information may be exchanged between the storage system 306 and the cloud services provider 302 via the data communications link 304 using one or more data communications protocols. For example, digital information may be exchanged between the storage system 306 and the cloud services provider 302 via the data communications link 304 using the handheld device transfer protocol ('HDTP'), hypertext transfer protocol ('HTTP'), internet protocol ('IP'), real-time transfer protocol ('RTP'), transmission control protocol ('TCP'), user datagram protocol ('UDP'), wireless application protocol ('WAP'), or other protocol.

The cloud services provider 302 depicted in FIG. 3A may be embodied, for example, as a system and computing environment that provides services to users of the cloud services provider 302 through the sharing of computing resources via the data communications link 304. The cloud services provider 302 may provide on-demand access to a shared pool of configurable computing resources such as computer networks, servers, storage, applications and services, and so on. The shared pool of configurable resources may be rapidly provisioned and released to a user of the cloud services provider 302 with minimal management effort. Generally, the user of the cloud services provider 302 is unaware of the exact computing resources utilized by the cloud services provider 302 to provide the services. Although in many cases such a cloud services provider 302 may be accessible via the Internet, readers of skill in the art will recognize that any system that abstracts the use of shared resources to provide services to a user through any data communications link may be considered a cloud services provider 302.

In the example depicted in FIG. 3A, the cloud services provider 302 may be configured to provide a variety of services to the storage system 306 and users of the storage system 306 through the implementation of various service models. For example, the cloud services provider 302 may be configured to provide services to the storage system 306 and users of the storage system 306 through the implementation of an infrastructure as a service ('IaaS') service model where the cloud services provider 302 offers computing infrastructure such as virtual machines and other resources as a service to subscribers. In addition, the cloud services provider 302 may be configured to provide services to the storage system 306 and users of the storage system 306 through the implementation of a platform as a service ('PaaS') service model where the cloud services provider 302 offers a development environment to application developers. Such a development environment may include, for example, an operating system, programming-language execution environment, database, web server, or other components that may be utilized by application developers to develop and run software solutions on a cloud platform. Furthermore, the cloud services provider 302 may be configured to provide services to the storage system 306 and users of the storage system 306 through the implementation of a software as a service ('SaaS') service model where the cloud services provider 302 offers application software, databases, as well as the platforms that are used to run the applications to the storage system 306 and users of the storage system 306, providing the storage system 306 and users of the storage system 306 with on-demand software and eliminating the need to install and run the application on local computers, which may simplify maintenance and support of the application. The cloud services provider 302 may be further configured to provide services to the storage system 306 and users of the storage system 306 through the implementation of an authentication as a service ('AaaS') service model where the cloud services provider 302 offers authentication services that can be used to secure access to applications, data sources, or other resources. The cloud services provider 302 may also be configured to provide services to the storage system 306 and users of the storage system 306 through the implementation of a storage as a service service model where the cloud services provider 302 offers access to its storage infrastructure for use by the storage system 306 and users of the storage system 306. Readers will appreciate that the cloud services provider 302 may be configured to provide additional services to the storage system 306 and users of the storage system 306 through the implementation of additional service models, as the service models described above are included only for explanatory purposes and in no way represent a limitation of the services that may be offered by the cloud services provider 302 or a limitation as to the service models that may be implemented by the cloud services provider 302.

In the example depicted in FIG. 3A, the cloud services provider 302 may be embodied, for example, as a private cloud, as a public cloud, or as a combination of a private cloud and public cloud. In an embodiment in which the cloud services provider 302 is embodied as a private cloud, the cloud services provider 302 may be dedicated to providing services to a single organization rather than providing services to multiple organizations. In an embodiment where the cloud services provider 302 is embodied as a public cloud, the cloud services provider 302 may provide services to multiple organizations. Public cloud and private cloud deployment models may differ and may come with various advantages and disadvantages. For example, because a public cloud deployment involves the sharing of a computing infrastructure across different organization, such a deployment may not be ideal for organizations with security concerns, mission-critical workloads, uptime requirements demands, and so on. While a private cloud deployment can address some of these issues, a private cloud deployment may require on-premises staff to manage the private cloud. In still alternative embodiments, the cloud services provider 302 may be embodied as a mix of a private and public cloud services with a hybrid cloud deployment.

Although not explicitly depicted in FIG. 3A, readers will appreciate that additional hardware components and additional software components may be necessary to facilitate the delivery of cloud services to the storage system 306 and users of the storage system 306. For example, the storage system 306 may be coupled to (or even include) a cloud storage gateway. Such a cloud storage gateway may be embodied, for example, as hardware-based or software-based appliance that is located on premise with the storage system 306. Such a cloud storage gateway may operate as a bridge between local applications that are executing on the storage array 306 and remote, cloud-based storage that is utilized by the storage array 306. Through the use of a cloud storage gateway, organizations may move primary iSCSI or NAS to the cloud services provider 302, thereby enabling the organization to save space on their on-premises storage systems. Such a cloud storage gateway may be configured to emulate a disk array, a block-based device, a file server, or other storage system that can translate the SCSI commands, file server commands, or other appropriate command into REST-space protocols that facilitate communications with the cloud services provider 302.

In order to enable the storage system 306 and users of the storage system 306 to make use of the services provided by the cloud services provider 302, a cloud migration process may take place during which data, applications, or other elements from an organization's local systems (or even from another cloud environment) are moved to the cloud services provider 302. In order to successfully migrate data, applications, or other elements to the cloud services provider's 302 environment, middleware such as a cloud migration tool may be utilized to bridge gaps between the cloud services provider's 302 environment and an organization's environment. Such cloud migration tools may also be configured to address potentially high network costs and long transfer times associated with migrating large volumes of data to the cloud services provider 302, as well as addressing security concerns associated with sensitive data to the cloud services provider 302 over data communications networks. In order to further enable the storage system 306 and users of the storage system 306 to make use of the services provided by the cloud services provider 302, a cloud orchestrator may also be used to arrange and coordinate automated tasks in pursuit of creating a consolidated process or workflow. Such a cloud orchestrator may perform tasks such as configuring various components, whether those components are cloud components or on-premises components, as well as managing the interconnections between such components. The cloud orchestrator can simplify the inter-component communication and connections to ensure that links are correctly configured and maintained.

In the example depicted in FIG. 3A, and as described briefly above, the cloud services provider 302 may be configured to provide services to the storage system 306 and users of the storage system 306 through the usage of a SaaS service model where the cloud services provider 302 offers application software, databases, as well as the platforms that are used to run the applications to the storage system 306 and users of the storage system 306, providing the storage system 306 and users of the storage system 306 with on-demand software and eliminating the need to install and run the application on local computers, which may simplify maintenance and support of the application. Such applications may take many forms in accordance with various embodiments of the present disclosure. For example, the cloud services provider 302 may be configured to provide access to data analytics applications to the storage system 306 and users of the storage system 306. Such data analytics applications may be configured, for example, to receive telemetry data phoned home by the storage system 306. Such telemetry data may describe various operating characteristics of the storage system 306 and may be analyzed, for example, to determine the health of the storage system 306, to identify workloads that are executing on the storage system 306, to predict when the storage system 306 will run out of various resources, to recommend configuration changes, hardware or software upgrades, workflow migrations, or other actions that may improve the operation of the storage system 306.

The cloud services provider 302 may also be configured to provide access to virtualized computing environments to the storage system 306 and users of the storage system 306. Such virtualized computing environments may be embodied, for example, as a virtual machine or other virtualized computer hardware platforms, virtual storage devices, virtualized computer network resources, and so on. Examples of such virtualized environments can include virtual machines that are created to emulate an actual computer, virtualized desktop environments that separate a logical desktop from a physical machine, virtualized file systems that allow uniform access to different types of concrete file systems, and many others.

Figure 3B:
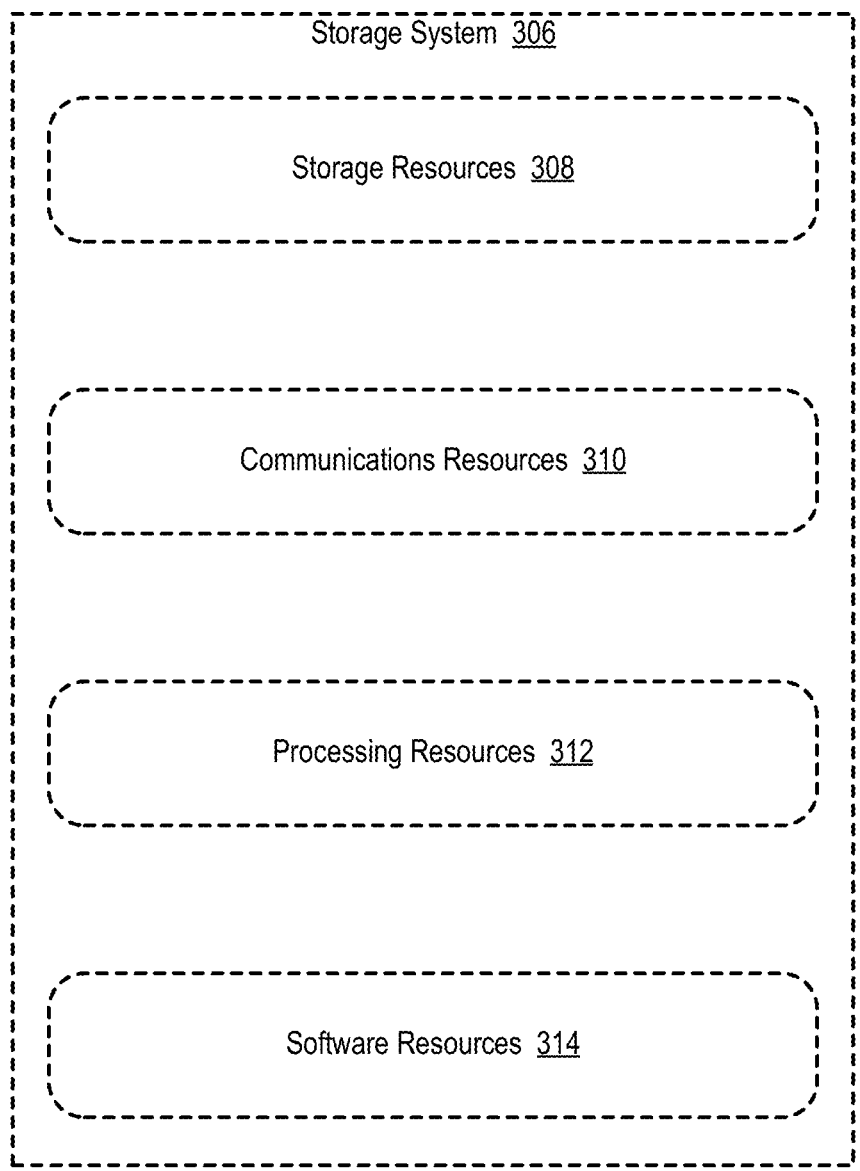
FIG. 3B sets forth a diagram of a storage system in accordance with some embodiments of the present disclosure.

For further explanation, FIG. 3B sets forth a diagram of a storage system 306 in accordance with some embodiments of the present disclosure. Although depicted in less detail, the storage system 306 depicted in FIG. 3B may be similar to the storage systems described above with reference to FIGS. 1A-1D and FIGS. 2A-2G as the storage system may include many of the components described above.

The storage system 306 depicted in FIG. 3B may include storage resources 308, which may be embodied in many forms. For example, in some embodiments the storage resources 308 can include nano-RAM or another form of nonvolatile random access memory that utilizes carbon nanotubes deposited on a substrate. In some embodiments, the storage resources 308 may include 3D crosspoint non-volatile memory in which bit storage is based on a change of bulk resistance, in conjunction with a stackable cross-gridded data access array. In some embodiments, the storage resources 308 may include flash memory, including single-level cell ('SLC') NAND flash, multi-level cell ('MLC') NAND flash, triple-level cell (TLC') NAND flash, quad-level cell ('QLC') NAND flash, and others. In some embodiments, the storage resources 308 may include non-volatile magnetoresistive random-access memory ('MRAM'), including spin transfer torque ('STV') MRAM, in which data is stored through the use of magnetic storage elements. In some embodiments, the example storage resources 308 may include non-volatile phase-change memory ('PCM') that may have the ability to hold multiple bits in a single cell as cells can achieve a number of distinct intermediary states. In some embodiments, the storage resources 308 may include quantum memory that allows for the storage and retrieval of photonic quantum information. In some embodiments, the example storage resources 308 may include resistive random-access memory ('ReRAM') in which data is stored by changing the resistance across a dielectric solid-state material. In some embodiments, the storage resources 308 may include storage class memory ('SCM') in which solid-state nonvolatile memory may be manufactured at a high density using some combination of sub-lithographic patterning techniques, multiple bits per cell, multiple layers of devices, and so on. Readers will appreciate that other forms of computer memories and storage devices may be utilized by the storage systems described above, including DRAM, SRAM, EEPROM, universal memory, and many others. The storage resources 308 depicted in FIG.

3A may be embodied in a variety of form factors, including but not limited to, dual in-line memory modules ('DIMMs'), non-volatile dual in-line memory modules ('NVDIMMs'), M.2, U.2, and others.

The example storage system 306 depicted in FIG. 3B may implement a variety of storage architectures. For example, storage systems in accordance with some embodiments of the present disclosure may utilize block storage where data is stored in blocks, and each block essentially acts as an individual hard drive. Storage systems in accordance with some embodiments of the present disclosure may utilize object storage, where data is managed as objects. Each object may include the data itself, a variable amount of metadata, and a globally unique identifier, where object storage can be implemented at multiple levels (e.g., device level, system level, interface level). Storage systems in accordance with some embodiments of the present disclosure utilize file storage in which data is stored in a hierarchical structure. Such data may be saved in files and folders, and presented to both the system storing it and the system retrieving it in the same format.

The example storage system 306 depicted in FIG. 3B may be embodied as a storage system in which additional storage resources can be added through the use of a scale-up model, additional storage resources can be added through the use of a scale-out model, or through some combination thereof. In a scale-up model, additional storage may be added by adding additional storage devices. In a scale-out model, however, additional storage nodes may be added to a cluster of storage nodes, where such storage nodes can include additional processing resources, additional networking resources, and so on.

The storage system 306 depicted in FIG. 3B also includes communications resources 310 that may be useful in facilitating data communications between components within the storage system 306, as well as data communications between the storage system 306 and computing devices that are outside of the storage system 306. The communications resources 310 may be configured to utilize a variety of different protocols and data communication fabrics to facilitate data communications between components within the storage systems as well as computing devices that are outside of the storage system. For example, the communications resources 310 can include fibre channel ('FC') technologies such as FC fabrics and FC protocols that can transport SCSI commands over FC networks. The communications resources 310 can also include FC over ethernet ('FCoE') technologies through which FC frames are encapsulated and transmitted over Ethernet networks. The communications resources 310 can also include InfiniBand ('IB') technologies in which a switched fabric topology is utilized to facilitate transmissions between channel adapters. The communications resources 310 can also include NVM Express ('NVMe') technologies and NVMe over fabrics ('NVMeoF') technologies through which non-volatile storage media attached via a PCI express ('PCIe') bus may be accessed. The communications resources 310 can also include mechanisms for accessing storage resources 308 within the storage system 306 utilizing serial attached SCSI ('SAS'), serial ATA ('SATA') bus interfaces for connecting storage resources 308 within the storage system 306 to host bus adapters within the storage system 306, internet small computer systems interface ('iSCSI') technologies to provide block-level access to storage resources 308 within the storage system 306, and other communications resources that that may be useful in facilitating data communications between components within the storage system 306, as well as data communications between the storage system 306 and computing devices that are outside of the storage system 306.

The storage system 306 depicted in FIG. 3B also includes processing resources 312 that may be useful in useful in executing computer program instructions and performing other computational tasks within the storage system 306. The processing resources 312 may include one or more application-specific integrated circuits ('ASICs') that are customized for some particular purpose as well as one or more central processing units ('CPUs'). The processing resources 312 may also include one or more digital signal processors ('DSPs'), one or more field-programmable gate arrays ('FPGAs'), one or more systems on a chip ('SoCs'), or other form of processing resources 312. The storage system 306 may utilize the storage resources 312 to perform a variety of tasks including, but not limited to, supporting the execution of software resources 314 that will be described in greater detail below.

The storage system 306 depicted in FIG. 3B also includes software resources 314 that, when executed by processing resources 312 within the storage system 306, may perform various tasks. The software resources 314 may include, for example, one or more modules of computer program instructions that when executed by processing resources 312 within the storage system 306 are useful in carrying out various data protection techniques to preserve the integrity of data that is stored within the storage systems. Readers will appreciate that such data protection techniques may be carried out, for example, by system software executing on computer hardware within the storage system, by a cloud services provider, or in other ways. Such data protection techniques can include, for example, data archiving techniques that cause data that is no longer actively used to be moved to a separate storage device or separate storage system for long-term retention, data backup techniques through which data stored in the storage system may be copied and stored in a distinct location to avoid data loss in the event of equipment failure or some other form of catastrophe with the storage system, data replication techniques through which data stored in the storage system is replicated to another storage system such that the data may be accessible via multiple storage systems, data snapshotting techniques through which the state of data within the storage system is captured at various points in time, data and database cloning techniques through which duplicate copies of data and databases may be created, and other data protection techniques. Through the use of such data protection techniques, business continuity and disaster recovery objectives may be met as a failure of the storage system may not result in the loss of data stored in the storage system.

The software resources 314 may also include software that is useful in implementing software-defined storage ('SDS'). In such an example, the software resources 314 may include one or more modules of computer program instructions that, when executed, are useful in policy-based provisioning and management of data storage that is independent of the underlying hardware. Such software resources 314 may be useful in implementing storage virtualization to separate the storage hardware from the software that manages the storage hardware.

The software resources 314 may also include software that is useful in facilitating and optimizing I/O operations that are directed to the storage resources 308 in the storage system 306. For example, the software resources 314 may include software modules that perform carry out various data reduction techniques such as, for example, data compression, data deduplication, and others. The software resources 314 may include software modules that intelligently group together I/O operations to facilitate better usage of the underlying storage resource 308, software modules that perform data migration operations to migrate from within a storage system, as well as software modules that perform other functions. Such software resources 314 may be embodied as one or more software containers or in many other ways.

Readers will appreciate that the various components depicted in FIG. 3B may be grouped into one or more optimized computing packages as converged infrastructures. Such converged infrastructures may include pools of computers, storage and networking resources that can be shared by multiple applications and managed in a collective manner using policy-driven processes. Such converged infrastructures may minimize compatibility issues between various components within the storage system 306 while also reducing various costs associated with the establishment and operation of the storage system 306. Such converged infrastructures may be implemented with a converged infrastructure reference architecture, with standalone appliances, with a software driven hyper-converged approach, or in other ways.

Readers will appreciate that the storage system 306 depicted in FIG. 3B may be useful for supporting various types of software applications. For example, the storage system 306 may be useful in supporting artificial intelligence applications, database applications, DevOps projects, electronic design automation tools, event-driven software applications, high performance computing applications, simulation applications, high-speed data capture and analysis applications, machine learning applications, media production applications, media serving applications, picture archiving and communication systems (PACS') applications, software development applications, and many other types of applications by providing storage resources to such applications.

The storage systems described above may operate to support a wide variety of applications. In view of the fact that the storage systems include compute resources, storage resources, and a wide variety of other resources, the storage systems may be well suited to support applications that are resource intensive such as, for example, artificial intelligence applications. Such artificial intelligence applications may enable devices to perceive their environment and take actions that maximize their chance of success at some goal. The storage systems described above may also be well suited to support other types of applications that are resource intensive such as, for example, machine learning applications. Machine learning applications may perform various types of data analysis to automate analytical model building. Using algorithms that iteratively learn from data, machine learning applications can enable computers to learn without being explicitly programmed.

In addition to the resources already described, the storage systems described above may also include graphics processing units ('GPUs'), occasionally referred to as visual processing unit ('VPUs'). Such GPUs may be embodied as specialized electronic circuits that rapidly manipulate and alter memory to accelerate the creation of images in a frame buffer intended for output to a display device. Such GPUs may be included within any of the computing devices that are part of the storage systems described above.

Figure 4:
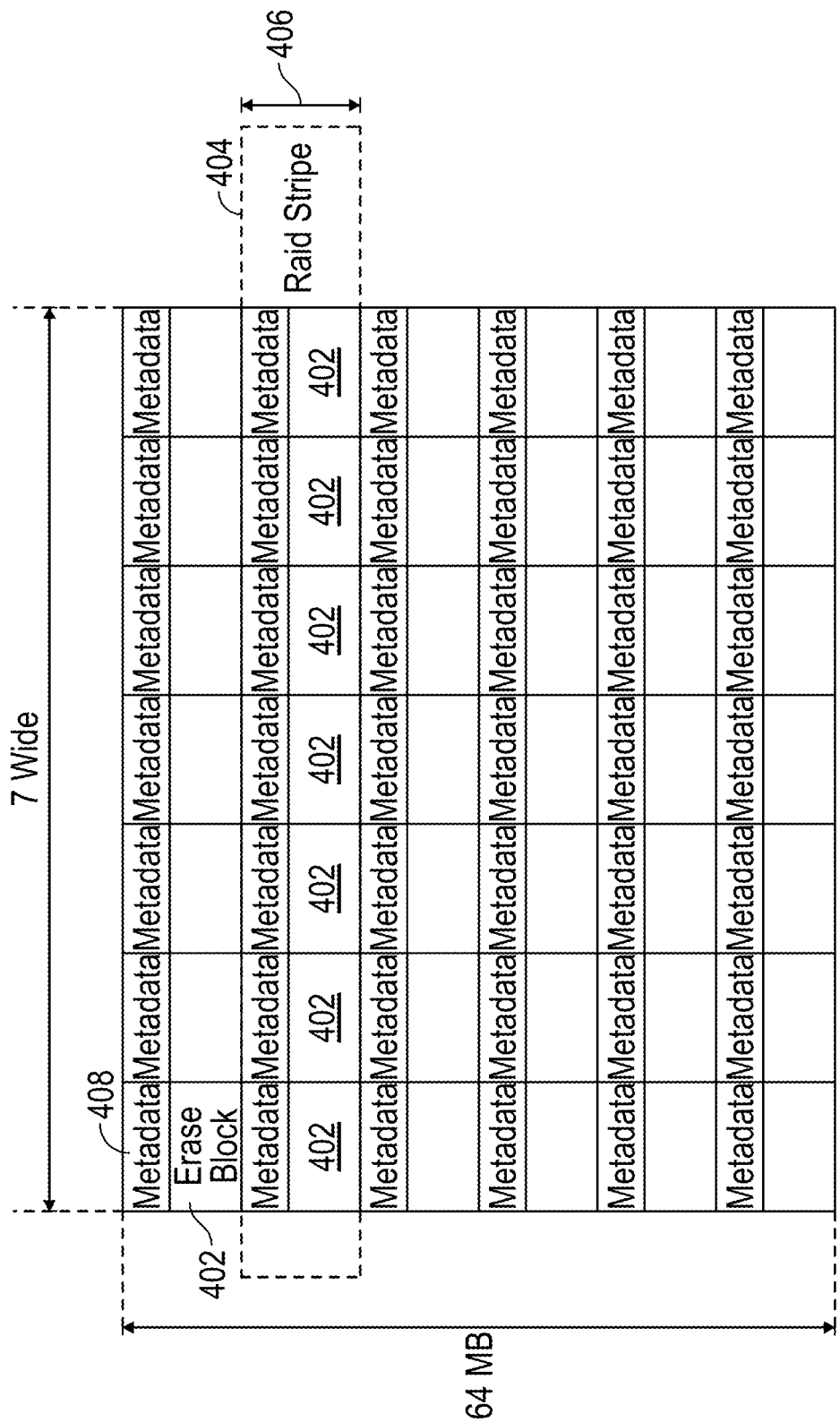
FIG. 4 depicts homogeneous erase block sizes in a storage memory, and a RAID stripe written across the storage memory to a height of one erase block in accordance with some embodiments.

FIG. 4 depicts homogeneous erase block sizes in a storage memory, and a RAID stripe 404 written across the storage memory to a height 406 of one erase block 402. When all erase block sizes are the same, and the RAID stripe 404 height 406 is the same as the homogeneous erase block size, flash memory utilization in the storage memory is efficient, e.g., 100%, and no amount of flash memory need be unutilized. Metadata 408 is written starting at the beginning of each erase block, for the embodiment shown, and is straightforward to find for any erase block 402. The RAID stripe 404 is written to until full. This ease-of-use, predictability and efficiency are not necessarily the case for heterogeneous erase block sizes, posing multiple problems, the solutions to which are described below for various embodiments of heterogeneous erase block size usage in storage memory.

Figure 5:
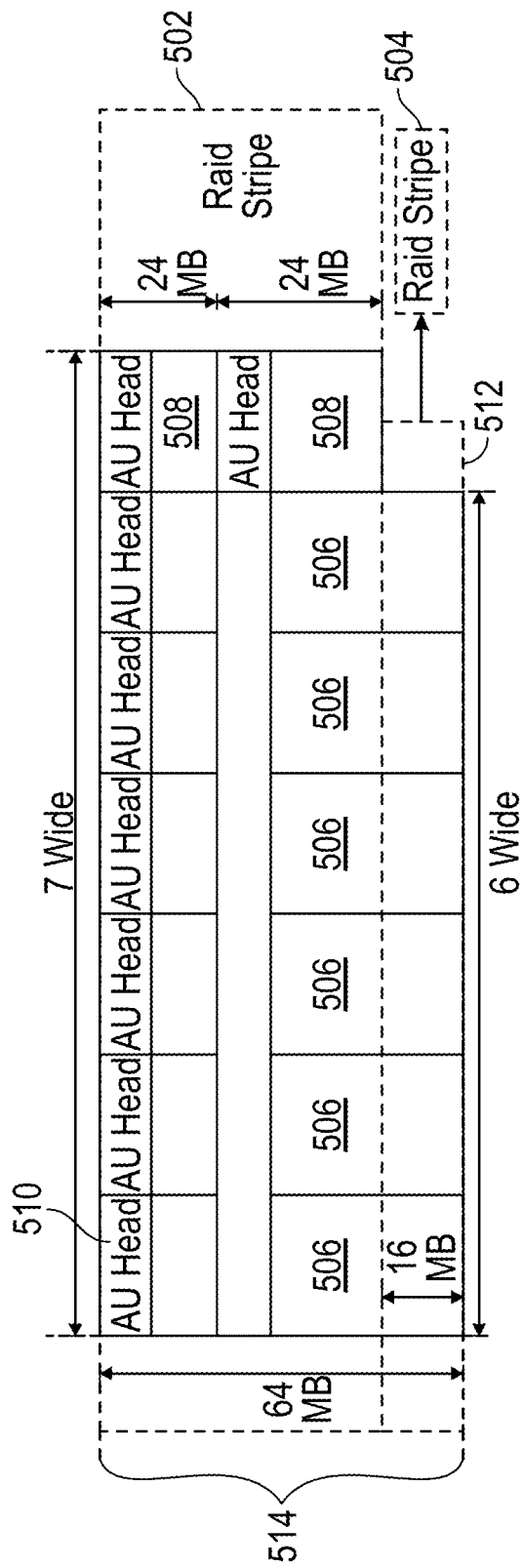
FIG. 5 depicts erase blocks with heterogeneous erase block sizes allocated to a RAID stripe in a tile pattern in a storage memory, a RAID stripe written across the storage memory, and remaining unused portions of erase blocks allocated to another RAID stripe in accordance with some embodiments.

FIG. 5 depicts erase blocks 506, 508 with heterogeneous erase block sizes allocated to a RAID stripe 502 in a tile pattern 514 in a storage memory, a RAID stripe 502 written across the storage memory, and remaining unused portions 512 of erase blocks 506 allocated to another RAID stripe 504. This tile pattern 514, representing an arrangement and allocation of erase blocks 506, 508, and RAID stripe 502, makes efficient use of flash memory space. The RAID stripe 502 is of uniform height across of the storage devices in the storage system. In various embodiments of a storage system, storage devices could be solid-state drives, storage drives in a storage array, storage units in a storage cluster, storage nodes in a storage cluster, blades in a storage cluster, etc. Unused portions 512 of erase blocks 506 could form the entirety of the other RAID stripe 504, or a portion of the other RAID stripe 504. The RAID stripe 502 is written to until full, or some other threshold is reached, at which point the writing to the RAID stripe 502 ceases. But, this does not have to completely fill the tile pattern 514 for a given RAID stripe 502, since the RAID stripe 502 is not the entirety of the tile pattern 514 of erase blocks 506, 508. A great deal of flexibility is obtained by freeing up from the requirement that RAID stripes conform to erase block boundaries. The use of varying RAID stripe sizes (e.g., variable height relative to erase block size, and variable width relative to number of erase blocks included in the RAID stripe) and varying tile patterns 514 of erase blocks in a storage system can avoid wasting additional space in larger blocks and/or smaller blocks. Minimizing such waste increases effective capacity of the storage system.

In the specific embodiment depicted in FIG. 5, each erase block 506, 508 begins with metadata 510, which in this example includes an allocation unit header (AU Head) that has information about an allocation unit. Some erase blocks 506 may have more than one metadata section. The RAID stripe 502 has a height of 48 MB, which is twice the 24 MB height of the smaller erase blocks 508 and is less than the 64 MB height of the larger erase blocks 506 that make up the tile pattern 514. With a constant height of 48 MB across all of the erase blocks 506, 508 in the tile pattern 514, the RAID stripe 504 consumes all of the flash memory in the stacked up, smaller, 24 MB erase blocks 508, and the majority of the available flash memory space in the larger, 64 MB erase blocks 506 in the tile pattern 514. From each of the larger, 64 MB erase blocks 506, 16 MB of flash memory space is not used in the RAID stripe 502, and is allocated as the remaining unused portions 512 of the erase blocks 506 to another RAID stripe 504. The new RAID stripe 504 could be made up of just those unused portions 512 of the erase blocks 506, or could be composed of those unused portions 512 of the erase block 506 and further erase blocks or portions of further erase blocks. Although depicted with specific erase block sizes and RAID stripe height and width, this example generalizes to other erase block sizes and arrangements of erase blocks, and other RAID stripe sizes, some of which are further detailed below in further examples. Tile patterns 514 can be L-shaped, as shown in FIGS. 5-7, rectangular, as shown in FIG. 4, or irregularly shaped, as shown in FIG. 8A, in various embodiments.

Figure 6:
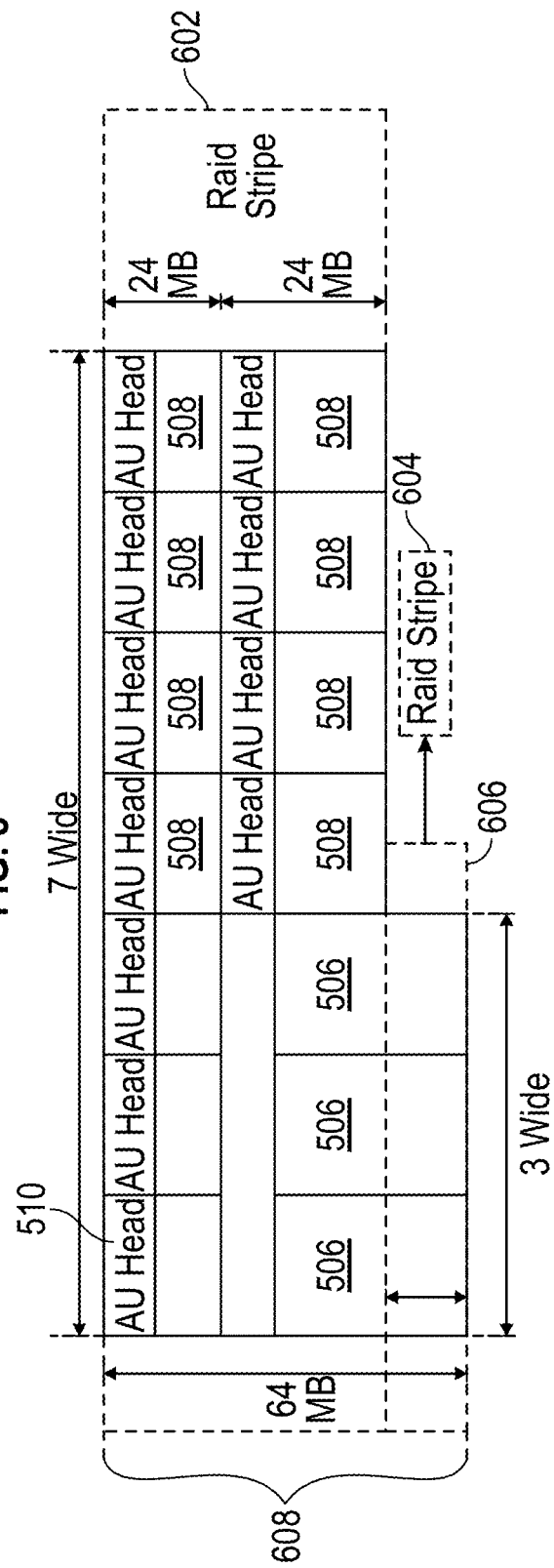
FIG. 6 depicts a further arrangement of erase blocks with heterogeneous erase block sizes allocated to a RAID stripe in a tile pattern in a storage memory, a RAID stripe written across the storage memory, and remaining unused portions of erase blocks allocated to another RAID stripe in accordance with some embodiments.

FIG. 6 depicts a further arrangement of erase blocks 506, 508 with heterogeneous erase block sizes allocated to a RAID stripe 602 in a tile pattern 608 in a storage memory, a RAID stripe 602 written across the storage memory, and remaining unused portions 606 of erase blocks 506 allocated to another RAID stripe 604. The RAID stripe 602 has a height of 48 MB, from stacking up and making full, efficient usage of two of the smaller, 24 MB erase blocks 508. Since the 48 MB height of the RAID stripe 602 uses 48 MB of each of the three, larger, 64 MB erase blocks 506, 16 MB remains unused from each of those 64 MB erase blocks 506, in the RAID stripe 602. Those 16 MB, remaining unused portions 606 of the erase blocks 506 can form an entire RAID stripe 604, or a portion of the RAID stripe 604, which could include further erase blocks or portions of erase blocks.

Figure 7:
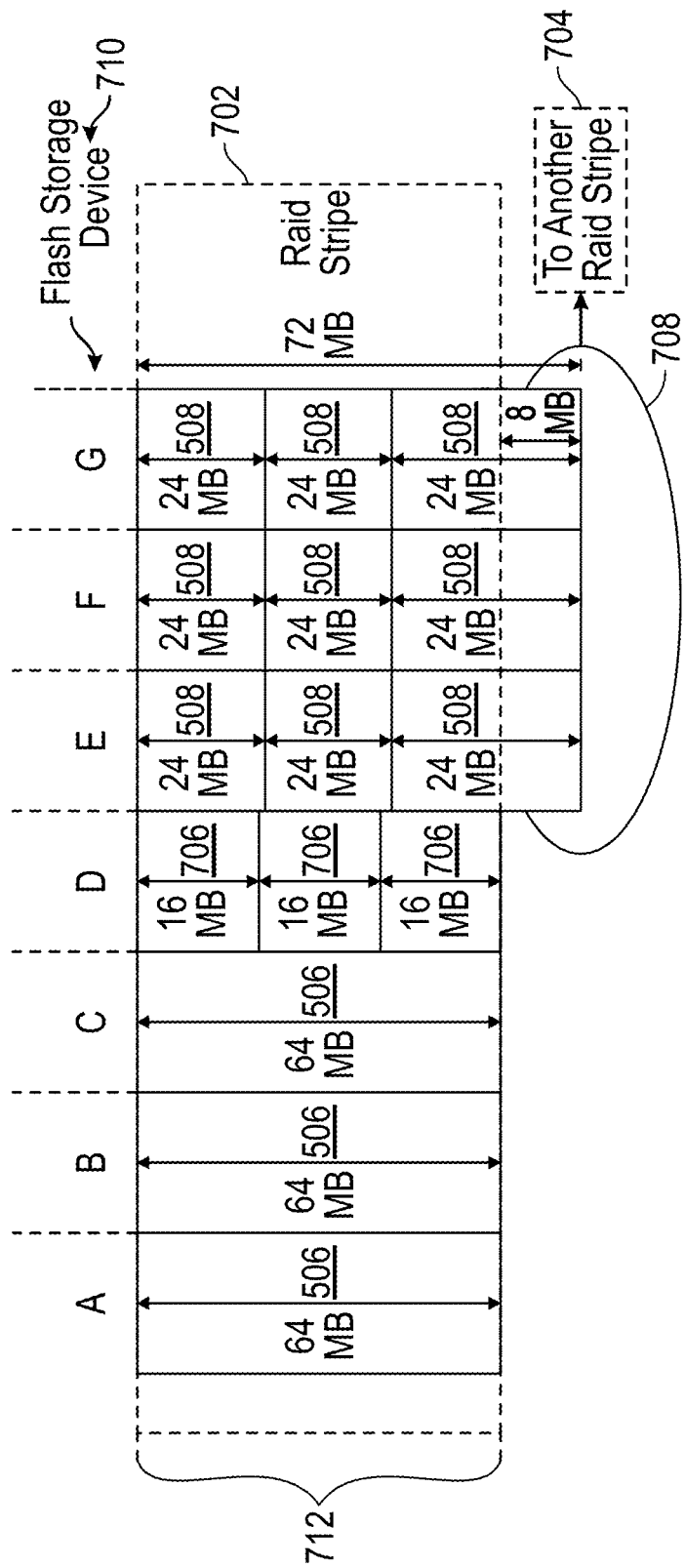
FIG. 7 depicts a further arrangement of erase blocks with heterogeneous erase block sizes allocated to a RAID stripe in a tile pattern, smaller erase block sizes combined to form block units, and remaining unused portions of erase blocks allocated to another RAID stripe in accordance with some embodiments.
Figure 8A:
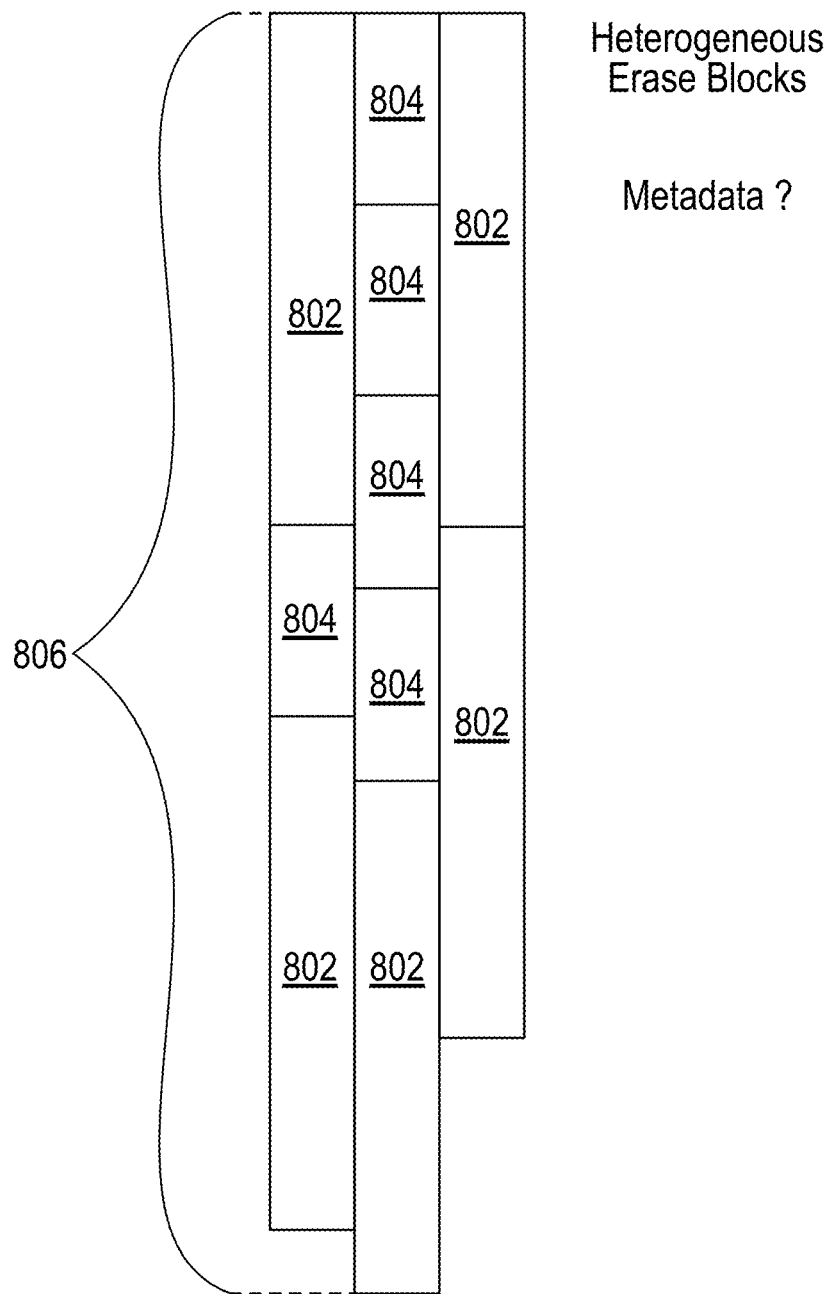
FIG. 8A depicts heterogeneous erase blocks in a tile pattern in a storage memory, to illustrate a problem with where to locate metadata in accordance with some embodiments.

FIG. 7 depicts a further arrangement of erase blocks 506, 508, 706 with heterogeneous erase block sizes allocated to a RAID stripe 702 in a tile pattern 712, smaller erase block sizes combined to form block units, and remaining unused portions 708 of erase blocks 508 allocated to another RAID stripe 704. In this example, the flash storage devices 710 across which the RAID stripe 702 is written are identified, with alphabet letters for identifiers, although other schemes for flash storage device ID are readily devised. Flash storage devices 710 A, B and C each contribute one, larger, 64 MB erase block 506 to the tile pattern 712 and RAID stripe 702. Flash storage device 710 D has four of the smaller, 16 MB erase blocks 706 in the tile pattern 702 and RAID stripe 702. These four, 16 MB erase blocks 706 are combined to form a block unit that is equal in memory size to a 64 MB erase block 506. Flash storage devices E, F and G each have three of the medium-sized, 24 MB erase blocks 508 in a column in the tile pattern 702, although for one of the 24 MB erase blocks 508 from each of the flash storage devices 710 E, F and G only 16 MB is used in the RAID stripe 702. In each of those three columns of the RAID stripe 702, three of the 24 MB erase blocks 508 are combined to form a block unit that has a combined block size greater than a 64 MB erase block 506. The remaining 8 MB from each of those 24 MB erase blocks 508, not used in the RAID stripe 702, is allocated to the RAID stripe 704, which could be made entirely from those unused portions 708 of erase blocks 508, or could include further erase blocks or portions of erase blocks.

In some embodiments, it is preferred to allocate erase blocks from the same flash storage device 710 to a column, or to each column, in the RAID stripe 702. Relatedly, it may be desired that erase blocks from differing flash storage devices are in differing columns in the RAID stripe 702. Such an allocation may be advantageous to reliability of the storage system in the case of failure of a storage device, since failure of one storage device can, at most, result in loss of data in one column of the RAID stripe 702. It may be disadvantageous to have a flash storage device 710 contribute to three columns, or more, in the RAID stripe, and possibly bring about complete failure of data in a RAID stripe designed for survivability of loss of data in two columns. Examples of flash storage devices 710, for various embodiments of storage systems, include solid-state drives, storage units, storage nodes, blades, etc. in storage arrays and storage clusters, where design for high reliability dictates RAID striping and analysis of failure zones. A design goal of a storage system that is reliable and can recover data even with failure of two solid-state drives, storage units, storage nodes or blades can be satisfied by adhering to the above allocation preference in some embodiments.

FIG. 8A depicts heterogeneous erase blocks 802, 804 in a tile pattern in a storage memory, to illustrate a problem with the location of metadata. If, for example, metadata is placed at the beginning of each erase block 802, 804, and only there, the metadata is scattered at irregular intervals throughout physical memory space as a result of the heterogeneous erase block sizes, which burdens the memory mapping with tracking these irregular intervals. If metadata is placed at regular intervals throughout physical memory space, these regular intervals might not line up with erase block boundaries, which burdens memory mapping and metadata tracking with finding the metadata in a given erase block 802, 804.

Figure 8B:
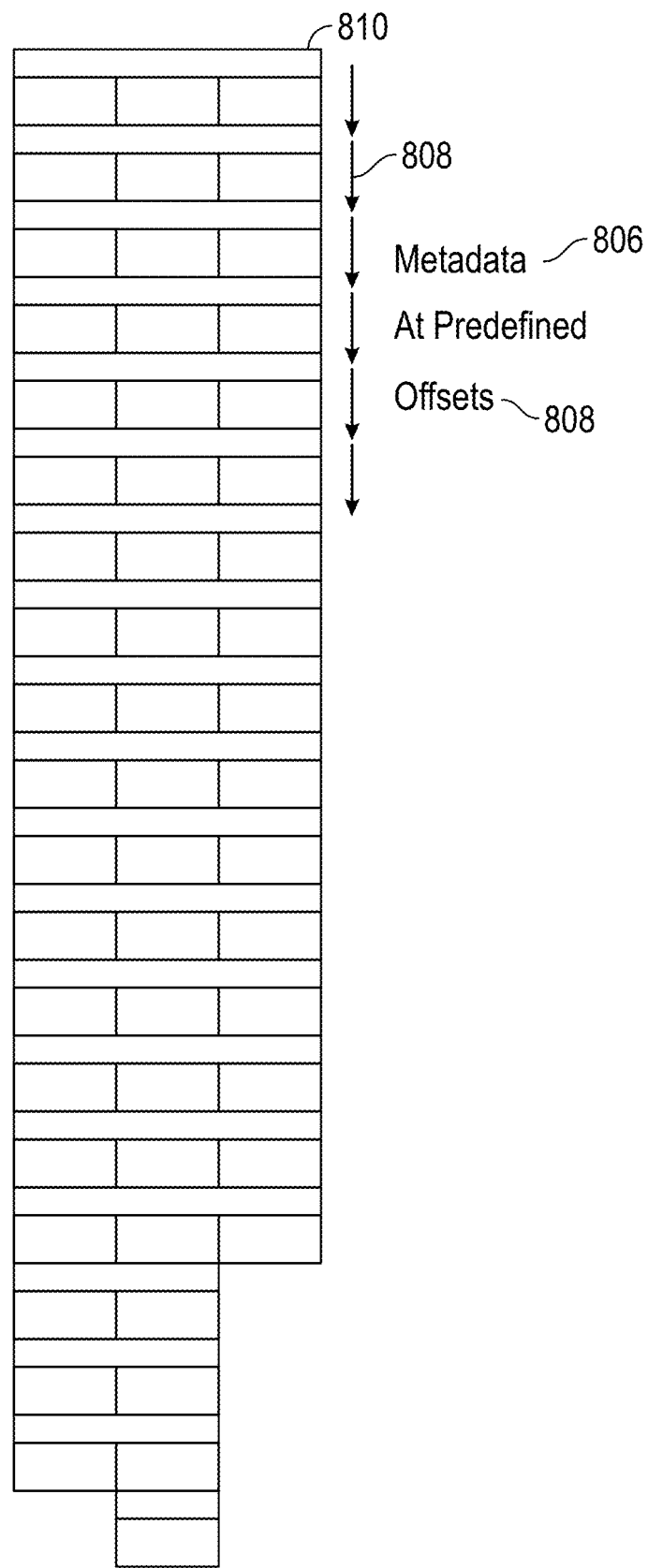
FIG. 8B depicts metadata written at predefined offsets in the heterogeneous erase blocks of FIG. 8A, arranged so that each erase block begins with a metadata section in accordance with some embodiments.

FIG. 8B depicts metadata 806 written at predefined offsets 808 in the heterogeneous erase blocks of FIG. 8A, arranged so that each erase block 802, 804 begins with a metadata section. The predefined offsets 808 could be determined as the lowest common divisor for erase block sizes. For example if erase block sizes are 8 MB, 16 MB, 24 MB and 64 MB, the lowest common divisor of erase block sizes is 8 MB. Writing metadata at 8 MB offsets results in there being metadata at the beginning of each erase block with those erase block sizes, and possible future erase block sizes of, for example, 128 MB, 256 MB, 512 MB, 1 GB, etc. Other candidates for predefined offsets 808 include 4 MB, 2 MB, and 1 MB. In some embodiments, a single predefined erase block size is used throughout the storage memory. In further embodiments, a combination of sizes could be used as predefined offsets, for example writing metadata at 4 MB, 4 MB and then an 8 MB interval, and repeating these intervals, would still result in a metadata section starting at the beginning of each 8 MB, 16 MB, 24 MB and 64 MB erase block in every possible arrangement of such blocks for a tile pattern.

Figure 9:
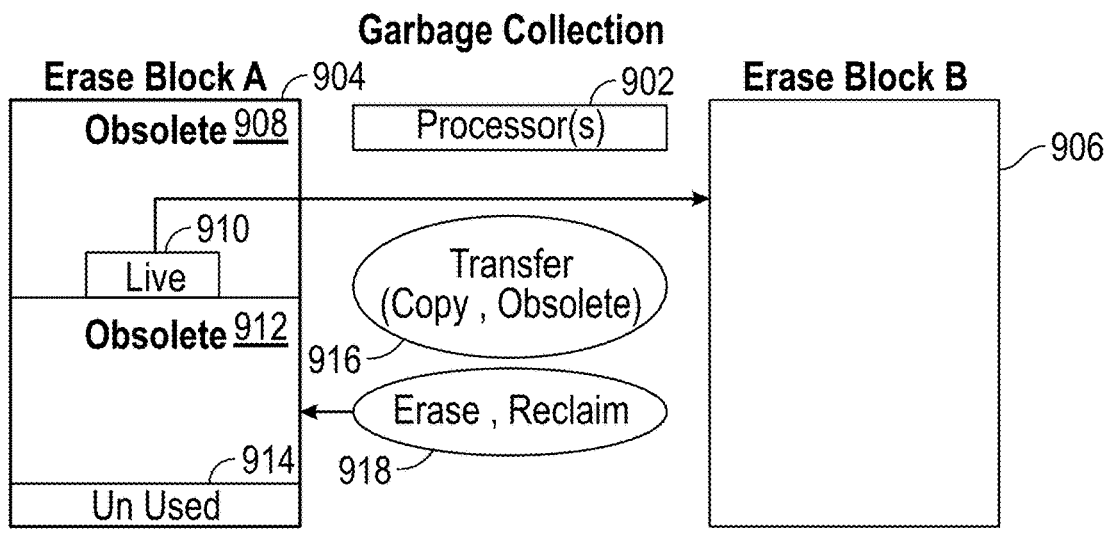
FIG. 9 depicts garbage collection in a storage system in accordance with some embodiments.

FIG. 9 depicts garbage collection in a storage system. In storage systems that make use of the tiling, for tile patterns 514, 608, 712, 806 described above and variations thereof, garbage collection should be coordinated with erase block allocation for RAID stripes, or mapping of erase blocks, etc. This coordination is especially important in embodiments that constrain membership of each flash storage device to a single, corresponding column of a RAID stripe and/or membership of differing flash storage devices to differing columns in RAID stripes. For garbage collection, one or more processors 902 detect erase blocks 904 that are devoid of live data 910 or have below a defined threshold amount of live data 910. Alternatively, the processor(s) 902 could look for erase blocks 904 that have large amounts, i.e., over a threshold, of obsolete data 908, 912. Any live data 910 is transferred 916 to another erase block 906. The transfer operation includes copying the live data 910 from the erase block 904, writing the live data 910 to another erase block 906, and obsoleting the now formerly live data 910 in the original erase block 904. Status of data, as live or obsolete is recorded in metadata 408, 510, 810, for example in the allocation unit header, or elsewhere, in various embodiments. Once an erase block 904 has only obsolete data 908, 912, and no live data 910, the erase block 904 is erased, and reclaimed 918. An erased, reclaimed erase block 904 is then available for allocating to a RAID stripe, in a tile pattern.

In some embodiments, a RAID stripe is treated as a single element for garbage collection. For example, in FIG. 9, RAID stripes could be monitored for relative amounts of live data 910 and obsolete data 908, 912. When the amount of live data 910 and/or obsolete data 908, 912 in a RAID stripe reaches a threshold, or a ratio of live to obsolete data or inverse reaches a threshold, this triggers garbage collection of the erase blocks allocated to the RAID stripe to commence. In some embodiments, garbage collection in flash storage devices collects portions of erase blocks, for transfer 916, erase and reclaim 918 operations. The portions of erase blocks are in accordance with the allocations of erase blocks, and portions of erase blocks, to RAID stripes and the arrangements in tile patterns.

Figure 10:
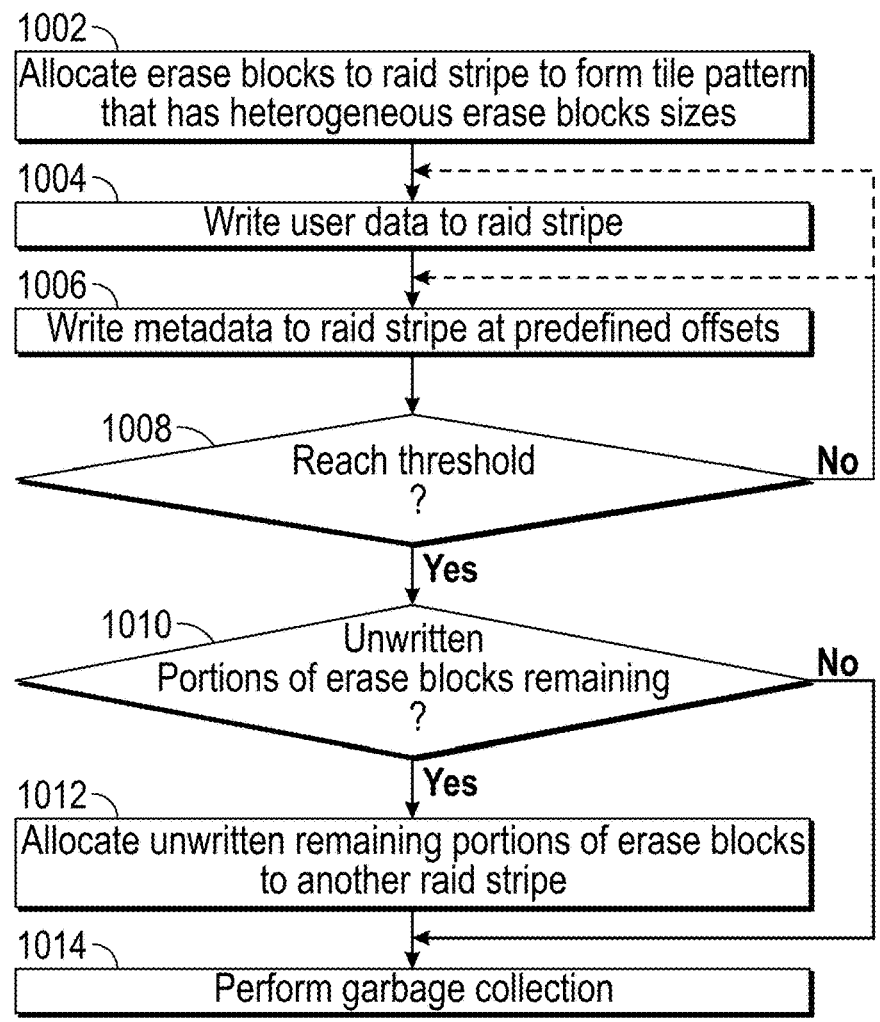
FIG. 10 is a flow diagram of a method of using flash storage devices with different sized erase blocks, which can be practiced by storage arrays, storage clusters and other storage systems in accordance with some embodiments.

FIG. 10 is a flow diagram of a method of using flash storage devices with different sized erase blocks, which can be practiced by storage arrays, storage clusters and other storage systems. One or more processors in storage systems, such as array processors or processors in storage nodes and storage units of a storage cluster, can practice this method. In an action 1002, erase blocks are allocated to a RAID stripe to form a tile pattern that has heterogeneous erase block sizes. Examples of tile patterns and the relationship of a tile pattern to a RAID stripe are shown in FIGS. 5-8B. In an action 1004 of FIG. 10, user data is written to the RAID stripe. In an action 1006, metadata is written to the RAID stripe, at predefined offsets 1006. An example of metadata written at a predefined offset throughout a tile pattern is shown in FIG. 8B.

In a determination/decision action 1008 of FIG. 10, it is determined whether the data written to the RAID stripe has reached a threshold. If the answer is no, the amount of data has not yet reached a threshold, flow branches back to the action 1004, to continue writing data to the RAID stripe, or to the action 1006 to continue writing metadata to the RAID stripe, after which the determination is again performed. If the answer is yes, the amount of data has reached a threshold, flow proceeds to the determination action 1010. In the determination/decision action 1010, is determined whether there are unwritten portions of erase blocks remaining. If there are no remaining unwritten portions of erase blocks, flow proceeds to the action 1014, to perform garbage collection. If there are remaining unwritten portions of erase blocks, flow proceeds to the action 1012.

In the action 1012 of FIG. 10, remaining portions of erase blocks are allocated to another RAID stripe. In variations, the allocation of remaining portions of erase blocks to another RAID stripe could occur before, during, or after the action 1002 in which the erase blocks are allocated to the RAID stripe to form the tile pattern. In some embodiments, the space could be left unused, thus action 1012 is optional. Flow proceeds to the action 1014, to perform garbage collection. In the action 1014, where garbage collection is performed, garbage collection may be performed independently of allocation of erase blocks to RAID stripes and tile patterns, and/or independent of writing user data and metadata to RAID stripes. For example, garbage collection may be performed as a background task in a multithreaded and/or multiprocessor storage system.

Figure 11:
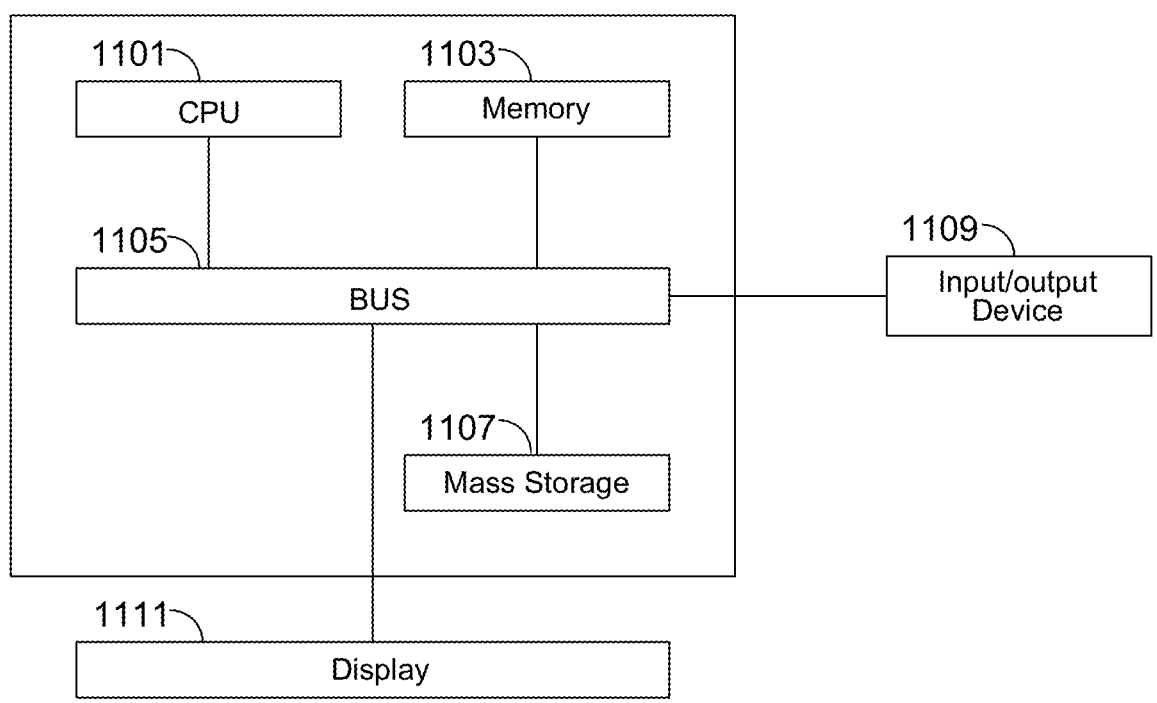
FIG. 11 is an illustration showing an exemplary computing device which may implement the embodiments described herein.

It should be appreciated that the methods described herein may be performed with a digital processing system, such as a conventional, general-purpose computer system. Special purpose computers, which are designed or programmed to perform only one function may be used in the alternative. FIG. 11 is an illustration showing an exemplary computing device which may implement the embodiments described herein. The computing device of FIG. 11 may be used to perform embodiments of the functionality for using flash storage devices with different sized erase blocks in accordance with some embodiments. The computing device includes a central processing unit (CPU) 1101, which is coupled through a bus 1105 to a memory 1103, and mass storage device 1107. Mass storage device 1107 represents a persistent data storage device such as a floppy disc drive or a fixed disc drive, which may be local or remote in some embodiments. Memory 1103 may include read only memory, random access memory, etc. Applications resident on the computing device may be stored on or accessed via a computer readable medium such as memory 1103 or mass storage device 1107 in some embodiments. Applications may also be in the form of modulated electronic signals modulated accessed via a network modem or other network interface of the computing device. It should be appreciated that CPU 1101 may be embodied in a general-purpose processor, a special purpose processor, or a specially programmed logic device in some embodiments.

Display 1111 is in communication with CPU 1101, memory 1103, and mass storage device 1107, through bus 1105. Display 1111 is configured to display any visualization tools or reports associated with the system described herein. Input/output device 1109 is coupled to bus 1105 in order to communicate information in command selections to CPU 1101. It should be appreciated that data to and from external devices may be communicated through the input/output device 1109. CPU 1101 can be defined to execute the functionality described herein to enable the functionality described with reference to FIGS. 1A-10. The code embodying this functionality may be stored within memory 1103 or mass storage device 1107 for execution by a processor such as CPU 1101 in some embodiments. The operating system on the computing device may be MS DOS™, MS-WINDOWS™, OS/2™, UNIX™, LINUX™, or other known operating systems. It should be appreciated that the embodiments described herein may also be integrated with a virtualized computing system that is implemented with physical computing resources.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a tangible non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

In various embodiments, one or more portions of the methods and mechanisms described herein may form part of a cloud-computing environment. In such embodiments, resources may be provided over the Internet as services according to one or more various models. Such models may include Infrastructure as a Service (IaaS), Platform as a Service (PaaS), and Software as a Service (SaaS). In IaaS, computer infrastructure is delivered as a service. In such a case, the computing equipment is generally owned and operated by the service provider. In the PaaS model, software tools and underlying equipment used by developers to develop software solutions may be provided as a service and hosted by the service provider. SaaS typically includes a service provider licensing software as a service on demand. The service provider may host the software, or may deploy the software to a customer for a given period of time. Numerous combinations of the above models are possible and are contemplated.

Various units, circuits, or other components may be described or claimed as "configured to" or "configurable to" perform a task or tasks. In such contexts, the phrase "configured to" or "configurable to" is used to connote structure by indicating that the units/circuits/components include structure (e.g., circuitry) that performs the task or tasks during operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory storing program instructions executable to implement the operation, etc. Reciting that a unit/circuit/component is "configured to" perform one or more tasks, or is "configurable to" perform one or more tasks, is expressly intended not to invoke 35 U.S.C. 112, sixth paragraph, for that unit/circuit/component. Additionally, "configured to" or "configurable to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks. "Configurable to" is expressly intended not to apply to blank media, an unprogrammed processor or unprogrammed generic computer, or an unprogrammed programmable logic device, programmable gate array, or other unprogrammed device, unless accompanied by programmed media that confers the ability to the unprogrammed device to be configured to perform the disclosed function(s).

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A method, comprising:
   allocating a plurality of erase blocks of differing erase block sizes to a RAID stripe, to form a pattern;
   writing the RAID stripe across the flash storage devices in accordance with the allocating; and executing a garbage collection process in the flash storage devices wherein portions of the differing erase block sizes are collected for transfer, wherein the allocating comprises allocating the plurality of erase blocks from the flash storage devices such that each column in the RAID stripe has erase blocks from a same flash storage device.

2. The method of claim 1, further comprising:
re-allocating one or more remaining unwritten portions of the plurality of erase blocks to a further RAID stripe.

3. The method of claim 1, further comprising:
writing metadata in the RAID stripe at predefined offsets so that each of the plurality of erase blocks begins with a metadata section.

4. The method of claim 1, further comprising:
performing the garbage collection in the flash storage devices, with the RAID stripe as a single element for the garbage collection.

5. The method of claim 1, further comprising:
erasing at least one of the plurality of erase blocks, responsive to determining all data in the at least one of the plurality of erase blocks is obsoleted.

6. The method of claim 1, wherein the allocating comprises:
combining a plurality of erase blocks of smaller erase block sizes to form one or more block units each having a combined block size greater than or equal to another of the plurality of erase blocks.

7. A tangible, non-transitory, computer-readable media having instructions thereupon which, when executed by a processor, cause the processor to perform a method comprising:
allocating a plurality of erase blocks of differing erase block sizes to a RAID stripe, to form a pattern;
writing the RAID stripe across the flash storage devices in accordance with the allocating; and
executing a garbage collection process in the flash storage devices wherein portions of the differing erase block sizes are collected for transfer, wherein the writing the RAID stripe comprises assigning erase blocks from each of the differing flash storage devices to a same column in the RAID stripe.

8. The computer-readable media of claim 7, wherein the method further comprises:
assigning unused portions of the plurality of erase blocks to a further RAID stripe.

9. The computer-readable media of claim 7, wherein the method further comprises:
writing metadata in the RAID stripe at intervals of an offset, the offset a common divisor of the heterogeneous erase block sizes, to begin each of the plurality of erase blocks with a metadata section.

10. The computer-readable media of claim 7, wherein the method further comprises:
defining the RAID stripe as a single element for garbage collection.

11. The computer-readable media of claim 7, wherein the method further comprises:
forming a combined block from two or more of the plurality of erase blocks, of smaller erase block sizes, to have a combined block size greater than or equal to a further one of the plurality of erase blocks.

12. A storage system, comprising:
a plurality of flash storage devices having heterogeneous erase block sizes; and
at least one processor, configurable to:
allocate a plurality of erase blocks of differing erase block sizes to a RAID stripe, to form a pattern, wherein the pattern comprises differing columns having erase blocks from differing ones of the plurality of flash storage devices;
write the RAID stripe across the flash storage devices in accordance with the allocating; and
execute a garbage collection process in the flash storage devices wherein portions of the differing erase block sizes are collected for transfer.

13. The storage system of claim 12, wherein the at least one processor is further configurable to:
assign unused portions of the erase blocks of the RAID stripe to a further RAID stripe.

14. The storage system of claim 12, wherein the at least one processor is further configurable to:
write, at predefined offsets, metadata to the RAID stripe having the heterogeneous erase block sizes, to begin each of the erase blocks in the RAID stripe with a metadata section.

15. The storage system of claim 12, wherein the at least one processor is further configurable to:
perform the garbage collection in the plurality of flash storage devices, using the RAID stripe having the heterogeneous erase block sizes as a single element.

16. The storage system of claim 12, wherein the at least one processor is further configurable to:
perform the garbage collection in the plurality of flash storage devices, to collect portions of erase blocks and to erase and reclaim one or more of the plurality of erase blocks having obsoleted data.

17. The storage system of claim 12, wherein the at least one processor is further configurable to:
form a block unit having a combined block size greater than or equal to erase block size of one of the plurality of erase blocks, from two or more erase blocks of smaller erase block sizes.

* * * * *